(12) United States Patent
Toda

(10) Patent No.: US 8,665,363 B2
(45) Date of Patent: Mar. 4, 2014

(54) SOLID-STATE IMAGE DEVICE, METHOD FOR PRODUCING THE SAME, AND IMAGE PICKUP APPARATUS

(75) Inventor: Atsushi Toda, Kanagawa (JP)

(73) Assignee: Sony Corporation, Tokyo (JP)

( * ) Notice: Subject to any disclaimer, the term of this patent is extended or adjusted under 35 U.S.C. 154(b) by 296 days.

(21) Appl. No.: 12/691,021

(22) Filed: Jan. 21, 2010

(65) Prior Publication Data

US 2010/0182471 A1 Jul. 22, 2010

(30) Foreign Application Priority Data

Jan. 21, 2009 (JP) ................................. 2009-010787

(51) Int. Cl.
*H04N 5/225* (2006.01)
(52) U.S. Cl.
USPC .................... 348/374; 250/208.1; 257/440
(58) Field of Classification Search
USPC ................. 348/374; 250/208.1; 257/440.1
See application file for complete search history.

(56) References Cited

U.S. PATENT DOCUMENTS

| 5,965,875 | A | 10/1999 | Merrill | |
| 6,023,020 | A * | 2/2000 | Nishitani et al. | 136/255 |
| 6,504,091 | B2 * | 1/2003 | Hisamatsu et al. | 136/262 |
| 2005/0224819 | A1 * | 10/2005 | Araki | 257/79 |
| 2006/0154034 | A1 * | 7/2006 | Araki | 428/209 |
| 2006/0261242 | A1 * | 11/2006 | Kim | 250/200 |
| 2008/0157254 | A1 * | 7/2008 | Kang | 257/440 |
| 2010/0078072 | A1 * | 4/2010 | Nishida et al. | 136/261 |
| 2011/0048521 | A1 * | 3/2011 | Lu | 136/256 |
| 2011/0233701 | A1 * | 9/2011 | Mitsui et al. | 257/431 |

FOREIGN PATENT DOCUMENTS

| JP | 01-151262 | 6/1989 |
| JP | 03-289523 | 12/1991 |
| JP | 06-209107 | 7/1994 |
| JP | 2006-245088 | 9/2006 |
| JP | 2007-123720 | 5/2007 |

OTHER PUBLICATIONS

Yoshiro Takiguchi et al.; A CMOS Imager Hybridized to an Avalanche Multiplied Film; IEEE Transactions on Electron Devices; vol. 44, No. 10; Oct. 1997.

Christiano Niclass et al.; Design and Characterization of a CMOS 3_D Image Sensor Based on Single Photo Valance Diodes; IEEE Journal of Solid-State Circuits; vol. 40, No. 9; Sep. 2005.

K. Miyzazki et al.; High sensitivity and wide bandwidth Image Sensor using Culn1aGaSe2 thin films; 29p-ZC-12; The Japan Society of Applied Physics, Spring Meeting, 2008, Conference Proceedings.

* cited by examiner

*Primary Examiner* — Anthony J Daniels
(74) *Attorney, Agent, or Firm* — Dentons US LLP

(57) ABSTRACT

A solid-state image device includes a silicon substrate, and a photoelectric conversion layer arranged on the silicon substrate and lattice-matched to the silicon substrate, the photoelectric conversion layer being composed of a chalcopyrite-based compound semiconductor of a copper-aluminum-gallium-indium-sulfur-selenium-based mixed crystal or a copper-aluminum-gallium-indium-zinc-sulfur-selenium-based mixed crystal.

18 Claims, 30 Drawing Sheets

LIGHT INCIDENCE

- 14
- p-CuAl$_{0.36}$Ga$_{0.64}$S$_{1.28}$Se$_{0.72}$ — 23
- i-CuAl$_{0.24}$Ga$_{0.23}$In$_{0.53}$S$_2$ — 22
- i-CuGa$_{0.52}$In$_{0.48}$S$_2$ — 21
- 13
- n-Si — 12
- p-Si — 11

○ : Se  ◉ : In  ○ : Cu

MATTHEWS-BLEKSLEE EXPRESSION $$hc = \frac{\alpha_e}{\sqrt{2}\pi f} \frac{1 - \frac{v}{4}}{1+v} \left( \ln \frac{hc\sqrt{2}}{\alpha_e} + 1 \right)$$

SOLID-STATE IMAGE DEVICE, METHOD FOR PRODUCING THE SAME, AND IMAGE PICKUP APPARATUS

BACKGROUND OF THE INVENTION

1. Field of the Invention

The present invention relates to a solid-state image device, a method for producing the solid-state image device, and an image pickup apparatus.

2. Description of the Related Art

There have been advances in the development of a reduction in pixel size as the number of pixels is increased. Meanwhile, there have also been advances in the development of improvement in motion-picture performance by high-speed imaging. In this way, high-speed imaging and the reduction in pixel size reduce the number of photons incident on one pixel, reducing sensitivity.

For surveillance cameras, there is a demand for cameras capable of capturing images in a dark place. That is, there is a demand for high-sensitivity sensors.

In an image sensor having the typical Bayer pattern, pixels are separated for each color. Thus, demosaicing, which is arithmetic processing to interpolate the color of a pixel from pixels surrounding the pixel, is performed, thereby disadvantageously leading to color artifacts.

In such a situation, it is reported that a $CuInGaSe_2$ layer serving as a photoelectric conversion layer with a high optical-absorption coefficient is applied to an image sensor, achieving higher sensitivity (for example, see Japanese Unexamined Patent Application Publication No. 2007-123720 and The Japan Society of Applied Physics, Spring Meeting, 2008, Conference Proceedings, 29p-ZC-12 (2008)).

However, the photoelectric conversion layer is basically grown on an electrode and is polycrystalline, thus leading to a significant occurrence of dark current due to crystal defects. Furthermore, in this state, light is not separated.

Meanwhile, a method for separating light using the wavelength-dependent absorption coefficient of silicon is reported. This method does not include demosaicing, thus eliminating color artifacts (for example, see U.S. Pat. No. 5,965,875).

This method provides a high degree of color mixing and poor color reproducibility. That is, with respect to the mechanism using the wavelength-dependent absorption coefficient described in U.S. Pat. No. 5,965,875, the amount of light detected is not reduced in theory. However, when red light and green light pass through a layer sensitive to a blue component, certain amounts of a red component and a green component are absorbed in the layer, so that these components are detected as a blue component. Thus, even in the case where a blue signal is not present, the passage of green and red signals leads to the misdetection of a blue signal, causing aliasing and difficulty in providing sufficient color reproducibility.

To prevent the occurrence of aliasing, signal processing is performed by calculation using all three primary colors for correction. Thus, a circuit for the calculation is arranged, increasing the complexity and scale of the circuit structure by the circuit and leading to an increase in cost. Furthermore, if one of the three primary colors is saturated, the true value of the signal of the saturated color is not determined, thereby leading to miscalculation. As a result, the signal is processed as a different color. In addition, a signal is read with a plug; hence, a plug region is provided. This causes a reduction in photodiode area. That is, the method is not suitable for a reduction in pixel size.

Meanwhile, referring to FIG. 46, most of semiconductors have absorption sensitivity to infrared light. Thus, in a solid-state image device (image sensor) using, for example, a silicon (Si) semiconductor material, an infrared cut filter as an example of a subtractive color filter is usually arranged on the incident light side of the sensor. A sensor is reported as a sensor that overcomes the disadvantages of the mechanism using the wavelength-dependent absorption coefficient. The sensor utilizes a band gap without using the subtractive color filter. The sensor has good photoelectric conversion efficiency and color separation. All three primary colors are detected at one pixel location (for example, see Japanese Unexamined Patent Application Publication Nos. 1-151262, 3-289523, and 6-209107). Each of the image sensors disclosed in the documents has a structure in which the band gap is changed in the depth direction.

In the Japanese Unexamined Patent Application Publication No. 1-151262, layers composed of materials having different band gaps Eg are sequentially stacked on a glass substrate in the depth direction for color separation. However, for example, in order to separate blue (B), green (G), and red (R), the document only describes that the layers are stacked, provided that $Eg(B)>Eg(G)>Eg(R)$. No mention is made of a specific material.

In contrast, Japanese Unexamined Patent Application Publication No. 3-289523 discloses color separation with a SiC material. Japanese Unexamined Patent Application Publication No. 6-209107 discloses AlGaInAs and AlGaAs materials.

However, in Japanese Unexamined Patent Application Publication Nos. 3-289523 and 6-209107, no mention is made of crystallinity at the heterojunction of different materials.

In the case where materials having different crystal structures are bonded to each other, a difference in lattice constant causes misfit dislocation, reducing crystallinity. As a result, electrons trapped at a defect level formed in the band gap are ejected, causing the occurrence of dark current.

As a method for solving the foregoing problems, it is reported that light is separated by controlling a band gap on a silicon (Si) substrate (for example, see Japanese Unexamined Patent Application Publication No. 2006-245088). Lattice-mismatched SiCGe-based mixed crystals and a Si/SiC superstructure are formed on the Si substrate without lattice matching. To separate light, a thick film is desirably formed because of a low absorption coefficient of silicon (Si). Disadvantageously, crystal defects are readily generated, and dark current occurs readily. A device using a gallium-arsenic (GaAs) substrate is also reported. However, the GaAs substrate is expensive and has a low affinity for a common sensor compared with that of the silicon (Si) substrate.

An example of an attempt to increase the sensitivity is signal amplification by avalanche multiplication. For example, an attempt is made to perform multiplication of photoelectrons by the application of a high voltage (for example, see IEEE Transactions Electron Devices Vol. 44, No. 10, October 1997). Here, the application of a voltage as high as 40 V for multiplication of photoelectrons causes difficulty in reducing the pixel size because of problems such as crosstalk. This sensor has a pixel size of 11.5 μm×13.5 μm.

With respect to another avalanche multiplication image sensor (for example, see IEEE J. Solid-State Circuits, 40, 1847 (2005)), a voltage of 25.5 V is applied for multiplication. To avoid crosstalk, for example, a wide guard-ring layer is arranged. Furthermore, the pixel size is as large as 58 μm×58 μm.

SUMMARY OF THE INVENTION

It is desirable to reduce the pixel size as the number of pixels is increased, achieve high-speed capture, and capture images in a dark place, and prevent a reduction in sensitivity due to a reduction in the number of photons incident on one pixel.

According to an embodiment of the present invention, there is provided a high-sensitivity solid-state image device including a photoelectric conversion layer having good crystallinity and a high optical absorption coefficient while the occurrence of dark current is suppressed.

A solid-state image device according to an embodiment of the present invention includes a silicon substrate and a photoelectric conversion layer arranged on the silicon substrate and lattice-matched to the silicon substrate, the photoelectric conversion layer being composed of a chalcopyrite-based compound semiconductor of a copper-aluminum-gallium-indium-sulfur-selenium (CuAlGaInSSe)-based mixed crystal or a copper-aluminum-gallium-indium-zinc-sulfur-selenium (CuAlGaInZnSSe)-based mixed crystal.

The solid-state image device according to an embodiment of the present invention includes the silicon substrate and the photoelectric conversion layer arranged on the silicon substrate and lattice-matched to the silicon substrate, the photoelectric conversion layer being composed of the chalcopyrite-based compound semiconductor of the CuAlGaInSSe-based mixed crystal or the CuAlGaInZnSSe-based mixed crystal. Thus, the occurrence of dark current is suppressed, and the sensitivity is increased. Hence, an image with excellent image quality and high sensitivity is advantageously obtained.

A method for producing a solid-state image device according to an embodiment of the present invention includes the step of forming a photoelectric conversion layer on a silicon substrate while maintaining lattice matching to the silicon substrate, the photoelectric conversion layer being composed of a chalcopyrite-based compound semiconductor of a copper-aluminum-gallium-indium-sulfur-selenium (CuAlGaInSSe)-based mixed crystal or a copper-aluminum-gallium-indium-zinc-sulfur-selenium (CuAlGaInZnSSe)-based mixed crystal.

In the method for producing a solid-state image device according to an embodiment of the present invention, the photoelectric conversion layer is formed on the silicon substrate while maintaining lattice matching to the silicon substrate, the photoelectric conversion layer being composed of the chalcopyrite-based compound semiconductor of the CuAlGaInSSe-based mixed crystal or the CuAlGaInZnSSe-based mixed crystal. Thus, the occurrence of dark current is suppressed, and the sensitivity is increased. Hence, an image with excellent image quality and high sensitivity is advantageously obtained.

An image pickup apparatus according to an embodiment of the present invention includes a light-condensing optical system configured to condense incident light, a solid-state image device configured to receive light condensed by the light-condensing optical system and perform photoelectric conversion, and a signal processing unit configured to process a signal obtained by photoelectric conversion, in which the solid-state image device includes a photoelectric conversion layer arranged on a silicon substrate and lattice-matched to the silicon substrate, the photoelectric conversion layer being composed of a chalcopyrite-based compound semiconductor of a copper-aluminum-gallium-indium-sulfur-selenium (CuAlGaInSSe)-based mixed crystal or a copper-aluminum-gallium-indium-zinc-sulfur-selenium (CuAlGaInZnSSe)-based mixed crystal.

In the image pickup apparatus according to an embodiment of the present invention, the solid-state image device includes the photoelectric conversion layer arranged on the silicon substrate and lattice-matched to the silicon substrate, the photoelectric conversion layer being composed of the chalcopyrite-based compound semiconductor of the CuAlGaInSSe-based mixed crystal or the CuAlGaInZnSSe-based mixed crystal. Thus, the occurrence of dark current is suppressed, suppressing a reduction in image quality due to bright defects. Furthermore, the solid-state image device has high sensitivity and captures an image with high sensitivity. Hence, capturing an image with high sensitivity and suppressing the reduction in image quality advantageously make it possible to capture an image with high quality even in a dark environment, e.g., in the nighttime.

DESCRIPTION OF THE PREFERRED EMBODIMENTS

1. First Embodiment

First Example of Structure of Solid-State Image Device

A first example of a solid-state image device according to a first embodiment of the present invention will be described with reference to a schematic cross-sectional view of FIG. 1.

Figure 1:
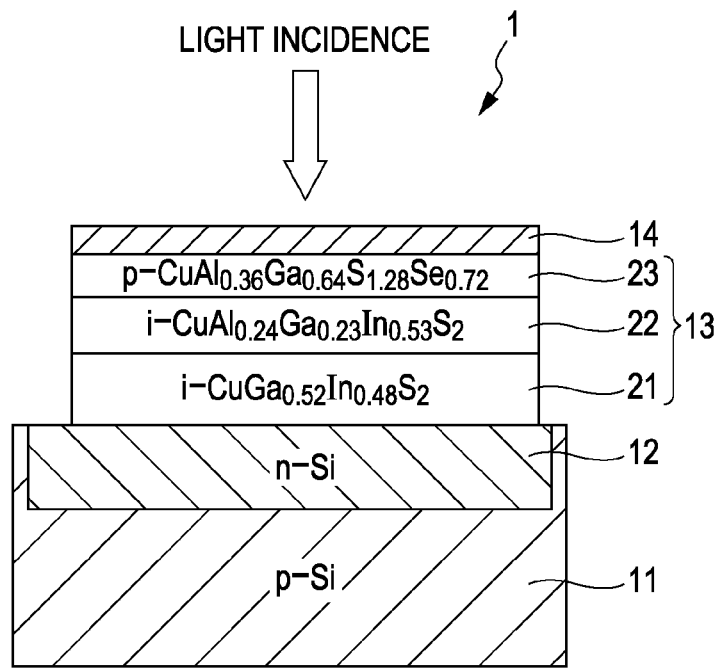
FIG. 1 is a schematic cross-sectional view of a first example of a solid-state image device according to a first embodiment of the present invention.

As shown in FIG. 1, a first electrode layer 12 is formed in a silicon substrate 11. The first electrode layer 12 is made of, for example, an n-type silicon region formed in the silicon substrate 11. A photoelectric conversion layer 13 composed of chalcopyrite-based compound semiconductors of lattice-matched copper-aluminum-gallium-indium-sulfur-selenium (hereinafter, referred to as "CuAlGaInSSe")-based mixed crystals is arranged on the first electrode layer 12. Copper-aluminum-gallium-indium-zinc-sulfur-selenium (hereinafter, referred to as "CuAlGaInZnSSe")-based mixed crystals may also be used as the chalcopyrite-based compound semiconductors described above. An optically transparent second electrode layer 14 is arranged on the photoelectric conversion layer 13. The second electrode layer 14 is composed of a transparent electrode material, for example, indium-tin oxide (ITO), zinc oxide, or indium-zinc oxide. A solid-state image device 1 (image sensor) has the basic structure described above.

The photoelectric conversion layer 13 composed of the chalcopyrite-based compound semiconductors is configured to separate light into red, green, and blue (RGB) components in the depth direction and is formed so as to be lattice-matched to the silicon substrate 11.

The chalcopyrite-based mixed crystals each having a high optical-absorption coefficient are epitaxially grown on a Si(100) substrate while maintaining lattice matching to the substrate, thus achieving satisfactory crystallinity and leading to the highly sensitive solid-state image device 1 with a low dark current.

Figure 2:
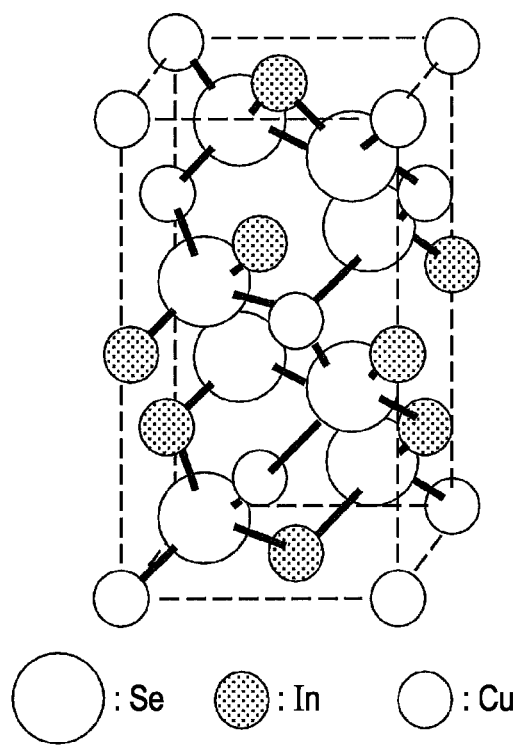
FIG. 2 shows a schematic structure of a chalcopyrite-based mixed crystal.

A chalcopyrite structure is shown in FIG. 2. FIG. 2 shows the structure of $CuInSe_2$ as an example of a chalcopyrite material.

As shown in FIG. 2, $CuInSe_2$ basically has a diamond structure the same as that of silicon (Si). Silicon atoms are partially substituted by, for example, copper (Cu), indium (In), gallium (Ga), and so forth to form the chalcopyrite structure. Hence, epitaxial growth on the silicon substrate can be basically performed. Examples of an epitaxial-growth method include molecular beam epitaxy (MBE), metal organic chemical vapor deposition (MOCVD), and liquid phase epitaxy (LPE). That is, any deposition method may be basically employed as long as epitaxial growth is performed.

Figure 3:
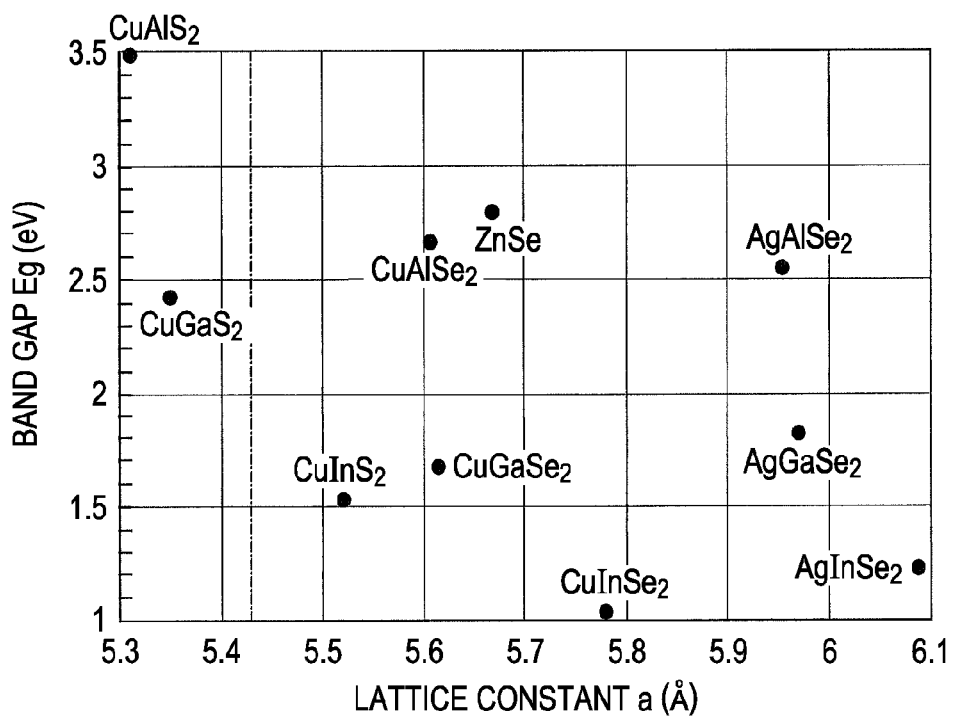
FIG. 3 shows the relationship between the band gap and the lattice constant of chalcopyrite-based materials.

FIG. 3 shows band gaps and lattice constants of chalcopyrite-based materials.

As shown in FIG. 3, the lattice constant a of silicon (Si) is 5.431 Å (indicated by a dashed line in the figure). An example of a mixed crystal that can be formed so as to be lattice-matched to this lattice constant is a CuAlGaInSSe-based mixed crystal. The CuAlGaInSSe-based mixed crystal can be epitaxially grown on the silicon (100) substrate.

Figure 4:
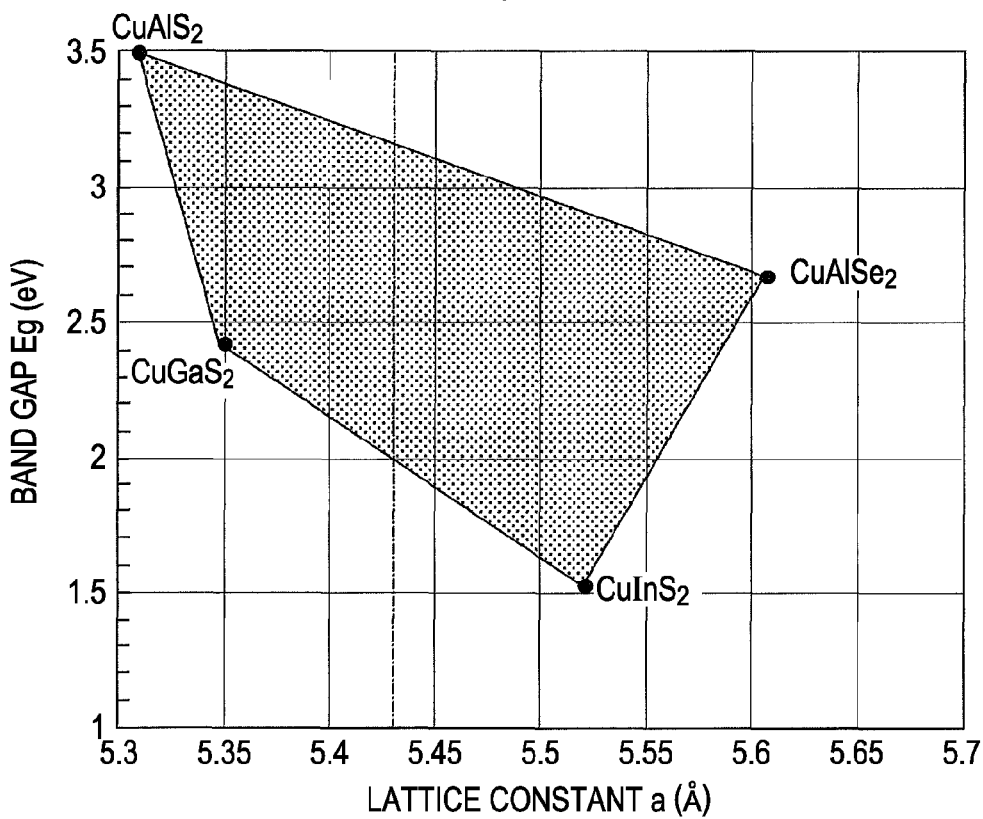
FIG. 4 shows the relationship between the band gap and the lattice constant of chalcopyrite-based materials.
Figure 5:
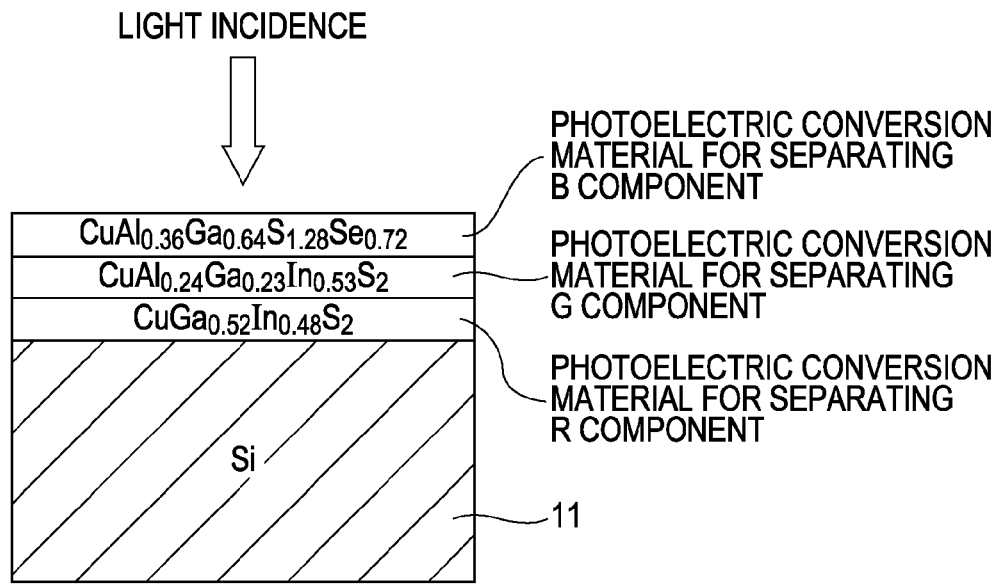
FIG. 5 is a schematic cross-sectional view of an example of a photoelectric conversion layer composed of chalcopyrite-based materials.

As shown in FIG. 4, the band gap can be controlled by changing the composition at a lattice constant a of 5.431 Å (indicated by a dashed line in the figure). It is thus possible to grow layers configured to split light into red, green, and blue components. Hereinafter, R represents a red color, G represents a green color, and B represents a blue color. For example, $CuGa_{0.52}In_{0.48}S_2$ is used as a photoelectric conversion material for separating an R component. $CuAl_{0.24}Ga_{0.23}In_{0.53}S_2$ is used as a photoelectric conversion material for separating a G component. $CuAl_{0.36}Ga_{0.64}S_{1.28}Se_{0.72}$ is used as a photoelectric conversion material for separating a B component. In this case, their band gaps are 2.00 eV, 2.20 eV, and 2.51 eV, respectively. In this case, as shown in FIG. 5, the photoelectric conversion material for the R component, the photoelectric conversion material for the G component, and the photoelectric conversion material for the B component are stacked, in that order, on the silicon substrate 11, so that light can be split into these components in the depth direction.

In consideration of the photon energy of red, green, and blue (RGB) components, band-gap regions that can separate light in the depth direction are described below. That is, the photoelectric conversion layer 13 shown in FIG. 1 is formed of a first photoelectric conversion layer 21 configured to separate a red component from light, a second photoelectric conversion layer 22 configured to separate a green component from light, and a third photoelectric conversion layer 23 configured to separate a blue component from light. The first photoelectric conversion layer 21 may have a band gap of 2.00 eV±0.1 eV (wavelength: 590 nm to 650 nm). The second photoelectric conversion layer 22 may have a band gap of 2.20 eV±0.15 eV (wavelength: 530 nm to 605 nm). The third photoelectric conversion layer 23 may have a band gap of 2.51 eV±0.2 eV (wavelength: 460 nm to 535 nm).

In this case, the composition of the first photoelectric conversion layer 21 is $CuAl_xGa_yIn_zS_2$, wherein $0 \leq x \leq 0.12$, $0.38 \leq y \leq 0.52$, $0.48 \leq z \leq 0.50$, and $x+y+z=1$. The composition of the second photoelectric conversion layer 22 is $CuAl_xGa_yIn_zS_2$, wherein $0.06 \leq x \leq 0.41$, $0.01 \leq y \leq 0.45$, $0.49 \leq z \leq 0.58$, and $x+y+z=1$. The composition of the third photoelectric conversion layer 23 is $CuAl_xGa_yS_uSe_v$, wherein $0.31 \leq x \leq 0.52$, $0.48 \leq y \leq 0.69$, $1.33 \leq u \leq 1.38$, $0.62 \leq v \leq 0.67$, and $x+y+u+v=3$ (alternatively, $x+y=1$ and $u+v=2$). FIG. 1 shows exemplary compositions of these layers.

Modification of Solid-State Image Device (Application of Superlattice)

Meanwhile, some or all of the chalcopyrite-based photoelectric conversion layers configured to separate RGB components fail to grow in the form of a solid solution, in some cases, depending on limitations of an epitaxial growth apparatus and epitaxial growth conditions.

Figure 6:
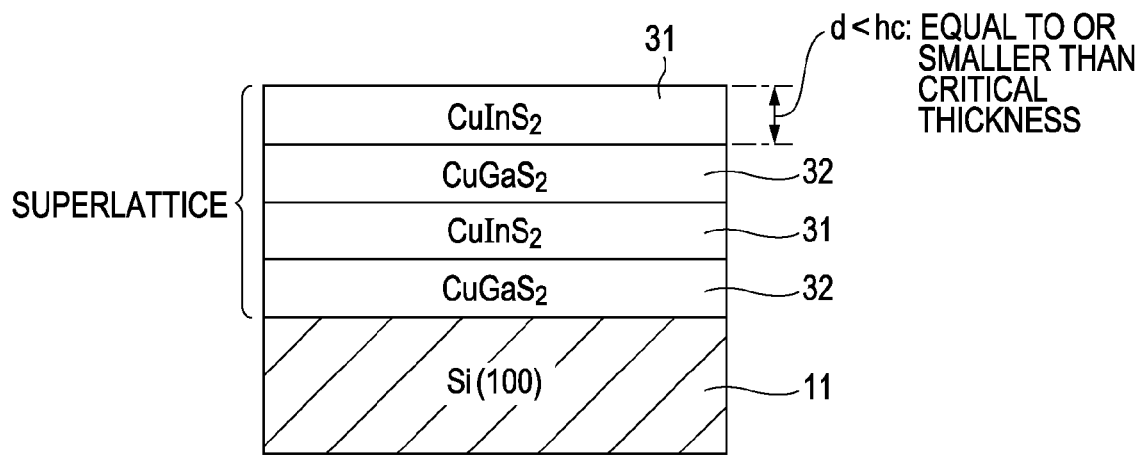
FIG. 6 is a schematic cross-sectional view of an example of a photoelectric conversion layer composed of chalcopyrite-based materials using a superlattice.

In such a case, as shown in FIG. 6, each layer may be grown using a superlattice with layers each having a thickness equal to or smaller than a critical thickness. For example, in the case of growing $CuGa_xIn_{1-x}S_2$, $CuGaS_2$ layers 32 and $CuInS_2$ layers 31 that can be grown on the silicon substrate 11 are alternately grown so as to each have a thickness equal to or smaller than the critical thickness.

In this case, a design such that the overall composition of the layers is the same as a target composition is made by controlling the thickness of each layer, thereby resulting in a pseudo-mixed crystal. The reason the thickness of each layer in the superlattice is set so as to be equal to or smaller than the critical thickness hc is that a thickness more than the critical thickness hc causes misfit dislocation defects, thereby reducing the crystallinity. The critical thickness is defined by the Matthews-Blakeslee expression shown in the figure.

The use of a wide-band-gap material as a photoelectric conversion layer suppresses the generation of carriers by heat, thereby reducing thermal noise and resulting in a satisfactory image.

With respect to a method of growing a crystal, portions where transistors, readout circuitry, wiring, and so forth are located are covered with a material, e.g., silicon oxide ($SiO_2$) or silicon nitride (SiN), in advance. The photoelectric conversion layer 13 may be selectively grown on a portion where the silicon substrate is partially exposed. Then the photoelectric conversion layer 13 may be laterally grown on a surface of the material, e.g., silicon oxide or silicon nitride, so as to cover substantially the entire surface.

Figure 7:
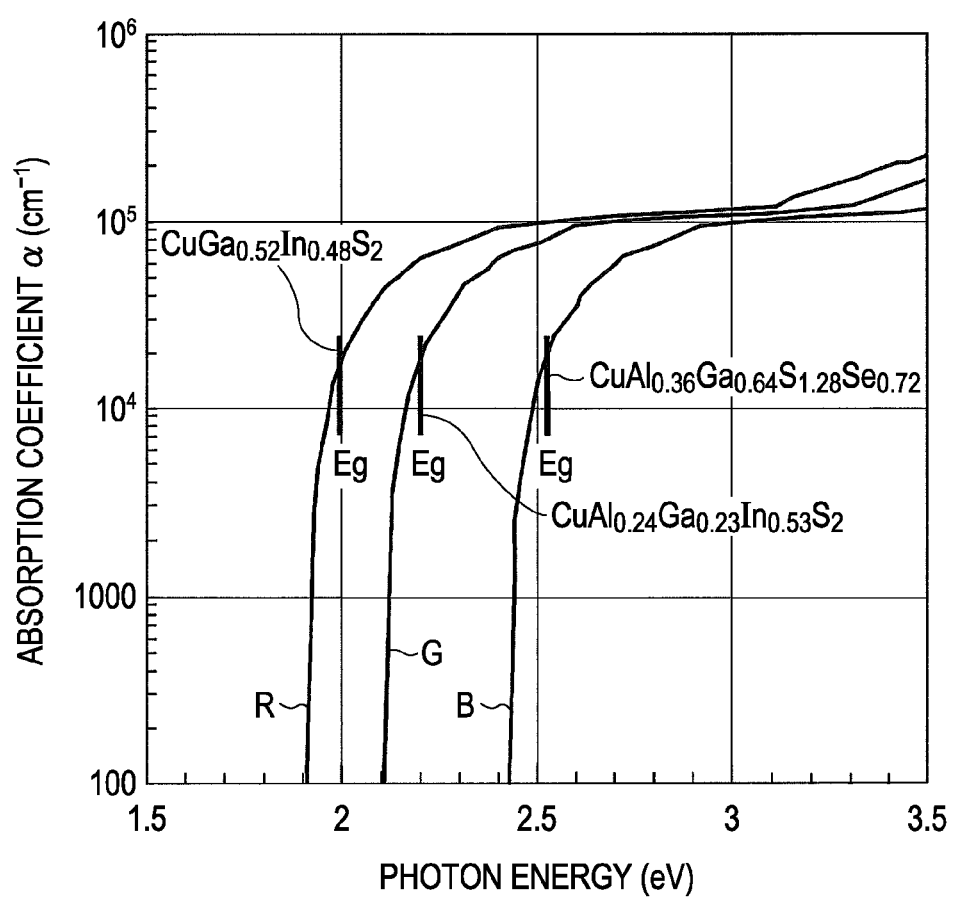
FIG. 7 is a graph showing the relationship between the absorption coefficient $\alpha$ and the wavelength predicted by the band gap.

In this case, RGB components are satisfactorily separated, and the degree of color mixing is low. FIG. 7 shows the dependence of the absorption coefficient α predicted from the band-gap energy of each of the materials on wavelength.

FIG. 7 demonstrates that each absorption coefficient is sharply reduced at photon energies lower than the corresponding band-gap energy.

Comparison of Characteristics

Figure 8:
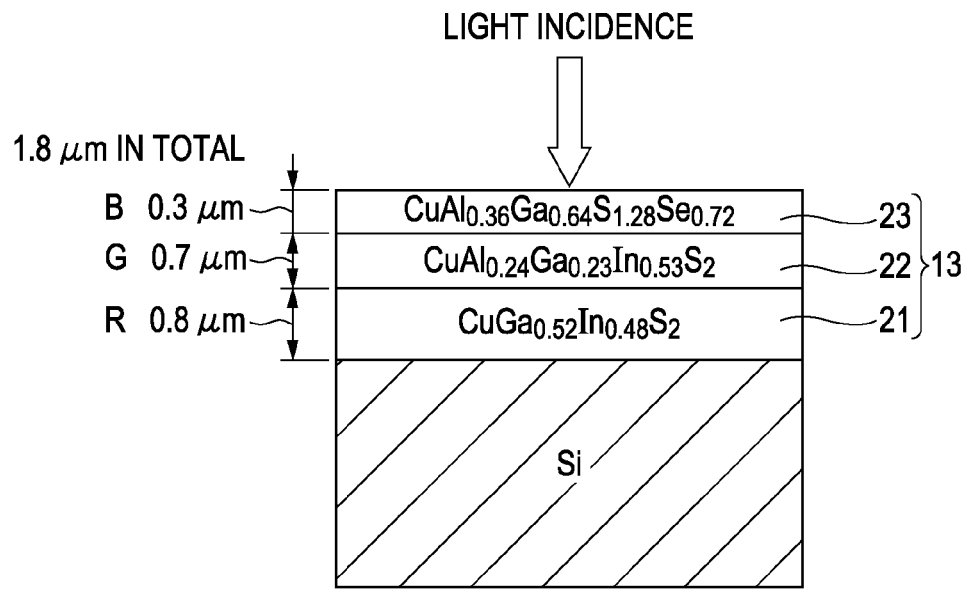
FIG. 8 is a schematic cross-sectional view of an example of a solid-state image device in which spectral sensitivity characteristics are measured according to an embodiment of the present invention.

Spectral sensitivity characteristics of an exemplary solid-state image device according to an embodiment of the present invention are shown. The solid-state image device has a structure in which light is separated in the depth direction as shown in FIG. 8. That is, a 0.8-μm-thick $CuGa_{0.52}In_{0.48}S_2$ layer is used as the first photoelectric conversion layer 21 of the photoelectric conversion layer 13. A 0.7-μm-thick $CuAl_{0.24}Ga_{0.23}In_{0.53}S_2$ layer is used as the second photoelectric conversion layer 22. A 0.3-μm-thick $CuAl_{0.36}Ga_{0.64}S_{1.28}Se_{0.72}$ layer is used as the third photoelectric conversion layer 23.

Figure 9:
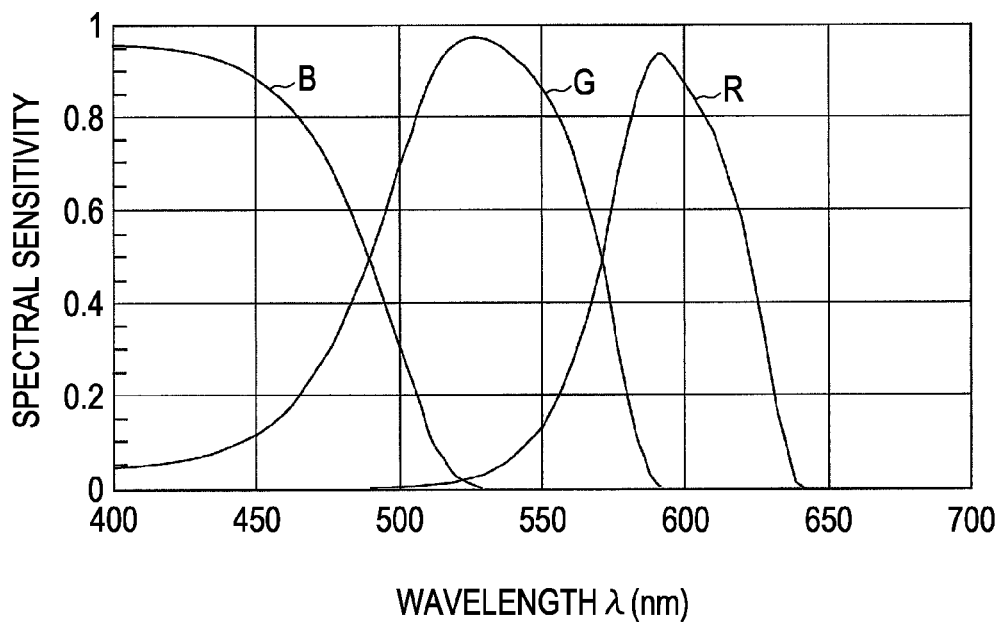
FIG. 9 is a graph showing spectral sensitivity characteristics of a solid-state image device according to an embodiment of the present invention.

FIG. 9 demonstrates that with respect to the spectral sensitivity characteristics of the photoelectric conversion layer 13, colors of red, green, and blue are satisfactorily separated and that a low degree of color mixing is achieved.

Figure 10:
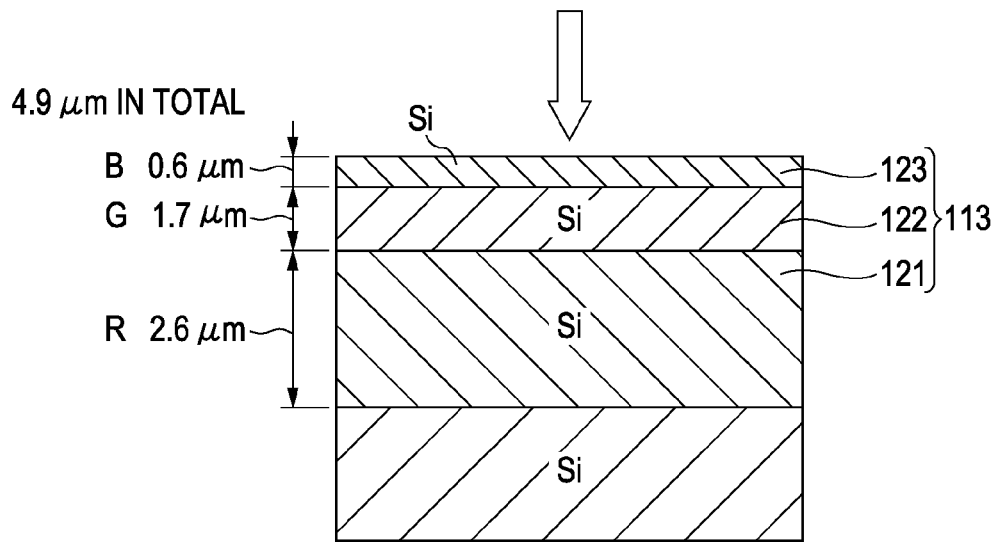
FIG. 10 is a schematic cross-sectional view of an example of a solid-state image device in which spectral sensitivity characteristics are measured in the related art.

In contrast, in the structure described in U.S. Pat. No. 5,965,875 in which light is separated in the depth direction, for example, as shown in FIG. 10, a photoelectric conversion layer 121 configured to separate a red component is formed of a 2.6-μm-thick Si layer. A photoelectric conversion layer 122 configured to separate a green component is formed of a 1.7-μm-thick Si layer. A photoelectric conversion layer 123 configured to separate a blue component is formed of a 0.6-μm-thick Si layer. That is, a photoelectric conversion layer 113 has a thickness of 4.9 μm.

Figure 11:
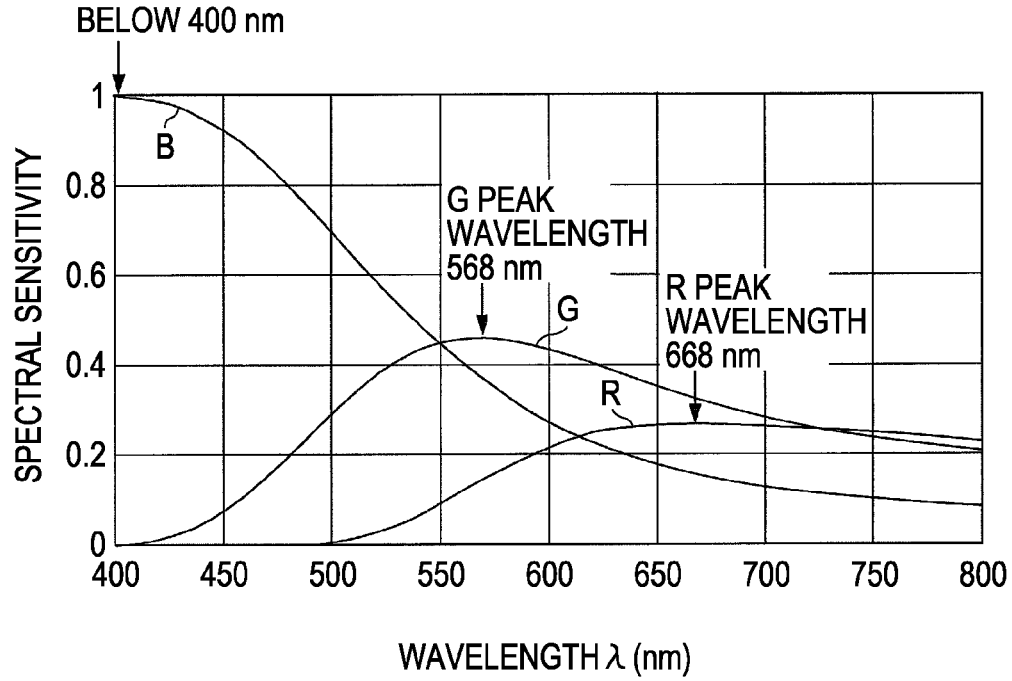
FIG. 11 is a graph showing exemplary spectral sensitivity characteristics of a solid-state image device in the related art.

FIG. 11 demonstrates that with respect to the spectral sensitivity characteristics of the photoelectric conversion layer 113, the separation of colors of red, green, and blue is poor and that the degree of color mixing is high.

The solid-state image device 1 separates light into components with satisfactory color separation without using an on-chip color filter (OCCF) and has high light-use efficiency and high sensitivity because, unlike the on-chip color filter (OCCF), light is not cut off.

The information set of three colors of red, green, and blue at every pixel location is obtained, so that demosaicing may not be performed. Hence, color artifacts do not occur in principle, resulting in high resolution.

Furthermore, a low-pass filter may not be used, advantageously resulting in a reduction in cost.

Moreover, the photoelectric conversion layer is lattice-matched to the silicon (Si) substrate, so that even if a photoelectric conversion layer is grown so as to have a larger thickness, the layer is free from crystal defects, thus resulting in a low dark current.

Japanese Unexamined Patent Application Publication No. 2006-245088 discloses the production of a SiCGe-based mixed crystal and a superlattice of Si/SiC on a silicon (Si) substrate. To separate light, in this structure, a thick film is desirably formed because of a low absorption coefficient of silicon (Si), so that crystal defects are readily generated. Mention is also made of crystal growth on a GaAs substrate. However, the cost of the GaAs substrate is high because of a small amount of a Ga element as a resource. Furthermore, the substrate adversely affects the environment because of its toxicity.

2. Second Embodiment

Second Example of Structure of Solid-State Image Device

A second example of a solid-state image device according to a second embodiment of the present invention will be described with reference to a schematic cross-sectional view of FIG. 12, a schematic circuit diagram of FIG. 13, the circuit being configured to read a signal, and FIG. 14 which is a band diagram at zero bias. A structure in which signal readout and avalanche multiplication are allowed to occur simultaneously will be described below.

Figure 12:
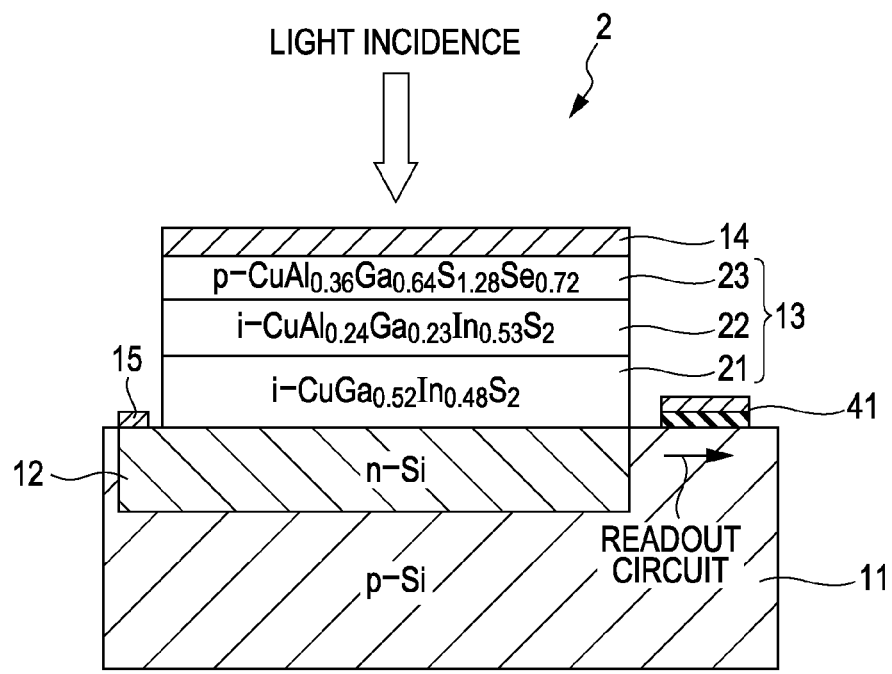
FIG. 12 is a schematic cross-sectional view of a second example of a solid-state image device according to a second embodiment of the present invention.
Figure 13:
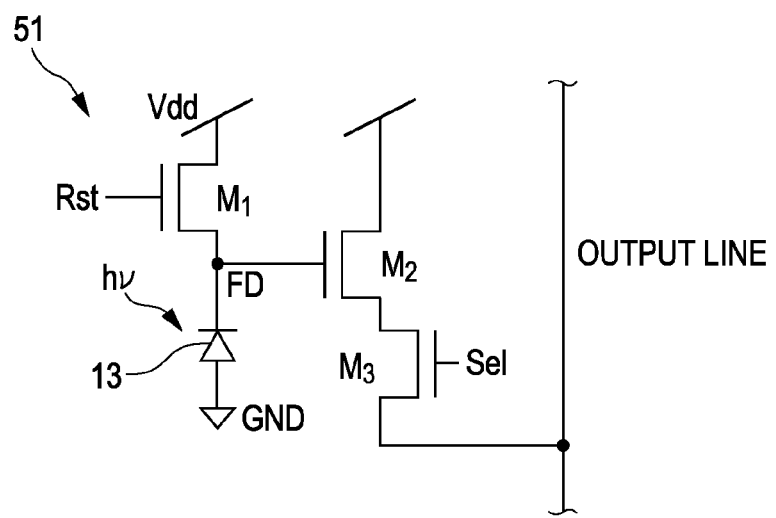
FIG. 13 is a schematic circuit diagram showing an example of a readout circuit.

As shown in FIGS. 12 and 13, the silicon substrate 11 is a p-type silicon substrate. The first electrode layer 12 is formed in the silicon substrate 11. The first electrode layer 12 is made of, for example, an n-type silicon layer formed in the silicon substrate 11. The photoelectric conversion layer 13 composed of lattice-matched CuAlGaInSSe-based mixed crystals is arranged on the first electrode layer 12. The photoelectric conversion layer 13 includes the first photoelectric conversion layer 21 composed of i-$CuGa_{0.52}In_{0.48}S_2$, the second photoelectric conversion layer 22 composed of i-$CuAl_{0.24}Ga_{0.23}In_{0.53}S_2$, and the third photoelectric conversion layer 23 composed of p-$CuAl_{0.36}Ga_{0.64}S_{1.28}Se_{0.72}$ stacked, in that order, on the first electrode layer 12. The optically transparent second electrode layer 14 is arranged on the photoelectric conversion layer 13. The second electrode layer 14 is composed of an optically transparent electrode material, for example, indium-tin oxide (ITO), zinc oxide, or indium-zinc oxide.

The photoelectric conversion layer 13 has a p-i-n structure as a whole.

A readout electrode 15 is arranged on the first electrode layer 12. A readout circuit 51 that reads a signal in the direction shown by an arrow with a gate MOS transistor 41 is arranged on the silicon substrate 11. The gate MOS transistor 41 has a structure in which a gate electrode is arranged on a gate insulating film. A gate MOS transistor described below has the same structure.

In the readout circuit 51, a diffusion layer of a reset transistor M1 and the gate electrode of an amplifying transistor M2 are connected to a floating diffusion node FD that is connected to the photoelectric conversion layer 13. The amplifying transistor M2 is connected to a select transistor M3, the diffusion layer of the amplifying transistor M2 being shared between the amplifying transistor M2 and the select transistor M3. A diffusion layer of the select transistor M3 is connected to an output line.

A solid-state image device 2 (image sensor) has the foregoing structure.

Figure 14:
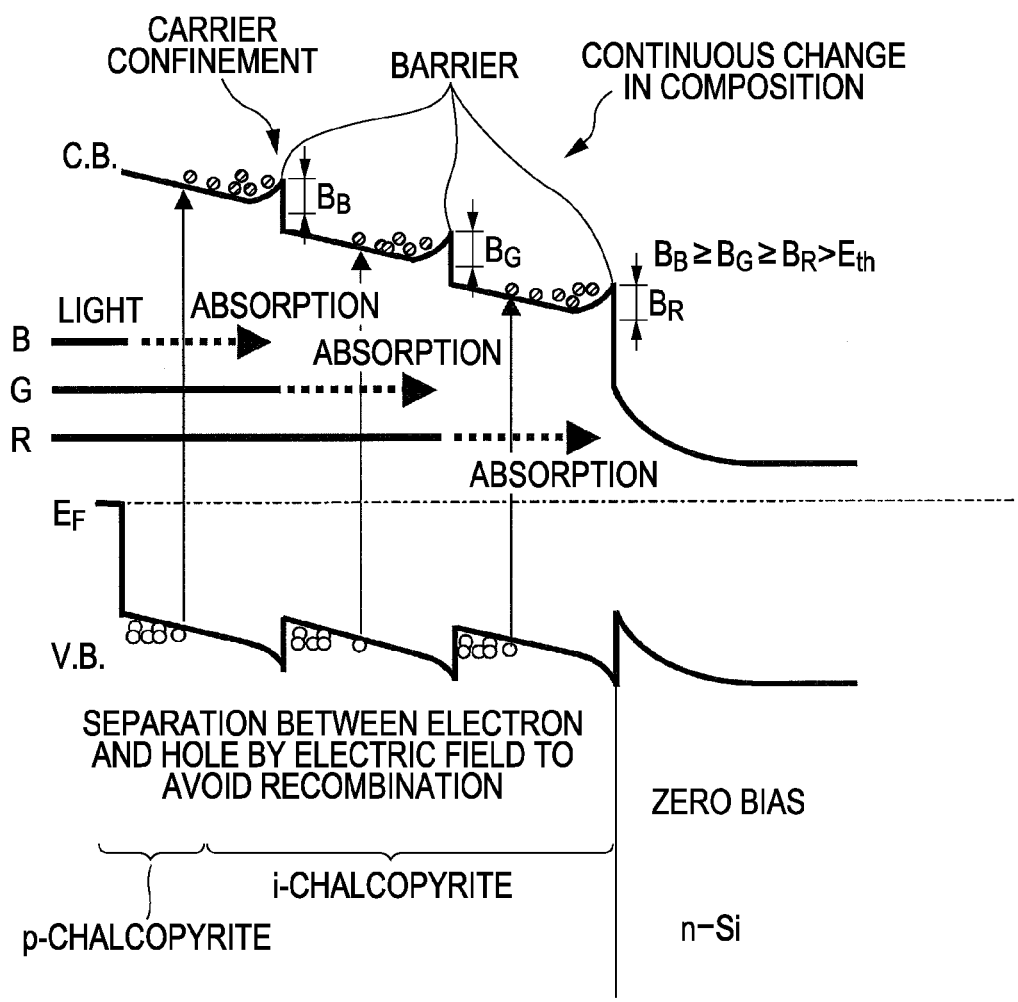
FIG. 14 is a band diagram of the solid-state image device according to the second embodiment.

As shown in the band diagram of FIG. 14, the band is inclined by an internal electric field because of the p-i-n structure of the photoelectric conversion layer 13. Electron-hole pairs generated by light irradiation are spatially separated by the inclination into electrons and holes.

Furthermore, spike barriers are formed on the wide-gap side of portions near interfaces among the three layers by continuous composition control, provided that $B_B \geq B_G \geq B_R > kT$ (=26 meV), so that photoelectrons can be confined and accumulated for each of RGB (accumulation of photoelectrons), wherein k represents the Boltzmann constant, and kT corresponds to the thermal energy at room temperature.

If the barriers are absent, carriers are naturally transferred from a high-band-gap layer to a low-band-gap layer. Thus, photoelectrons are not accumulated for each of RGB.

Figure 15:
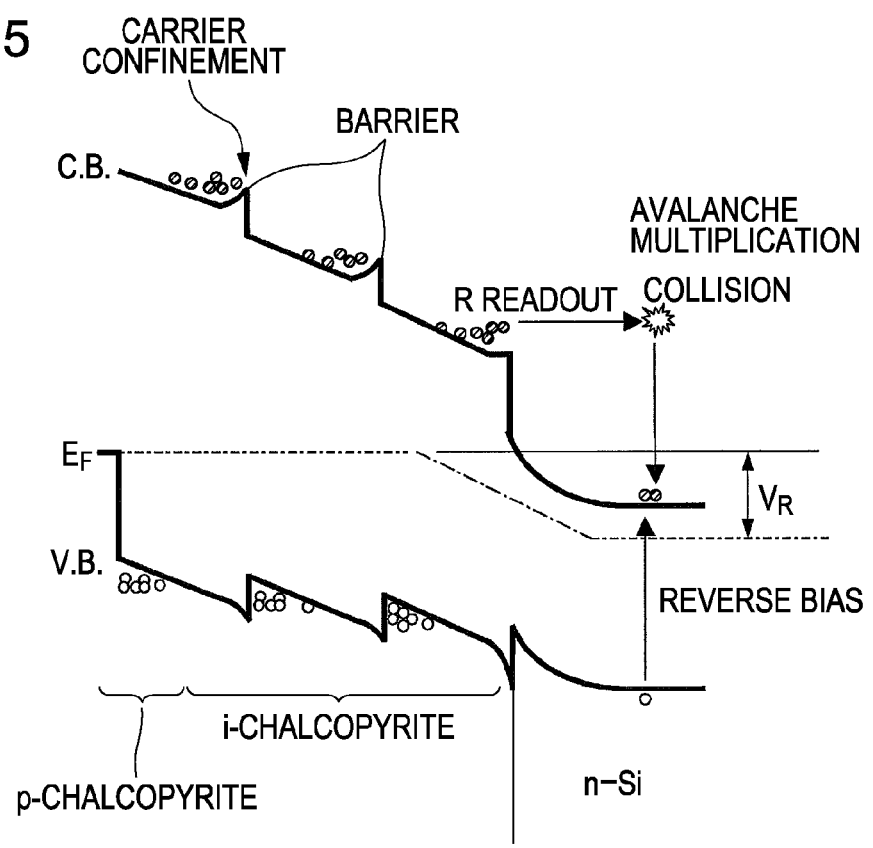
FIG. 15 is a band diagram when an R signal is read.

As shown in FIG. 15, in the solid-state image device 2, an R signal can first be read by applying a reverse bias of $V_R$. A G signal and a B signal are confined by the spike barriers.

In this case, there is an inherent discontinuity in the conduction band between the n-type silicon layer serving as the first electrode layer 12 and the i-$CuGa_{0.52}In_{0.48}S_2$ layer serving as the first photoelectric conversion layer 21. Thus, even the application of a low voltage causes collision, supplying a high kinetic energy to the lattice. This results in ionization to generate new electron-hole pairs, leading to avalanche multiplication.

Figure 16:
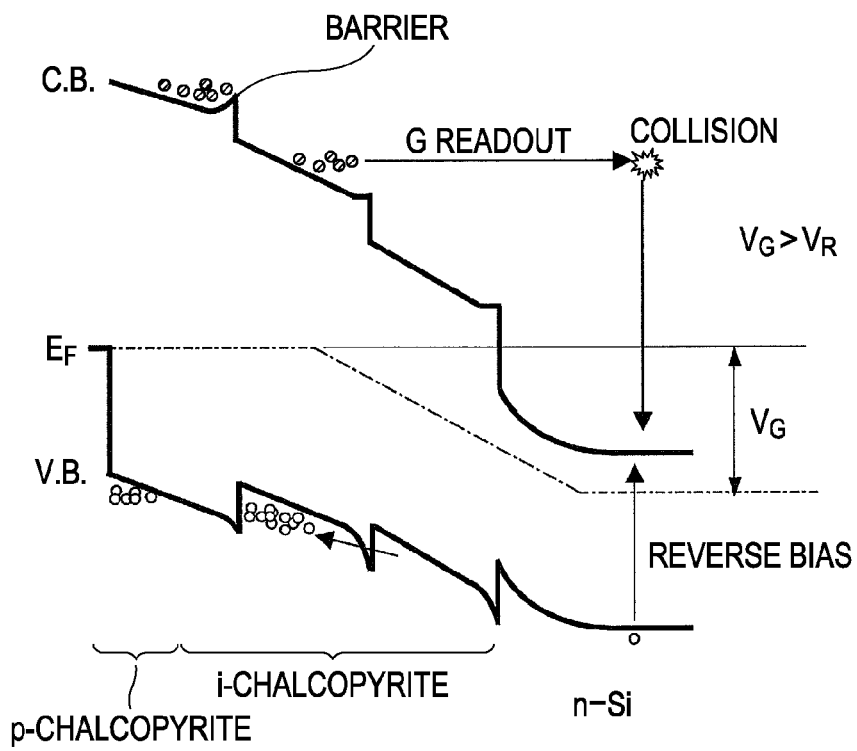
FIG. 16 is a band diagram when a G signal is read.
Figure 17:
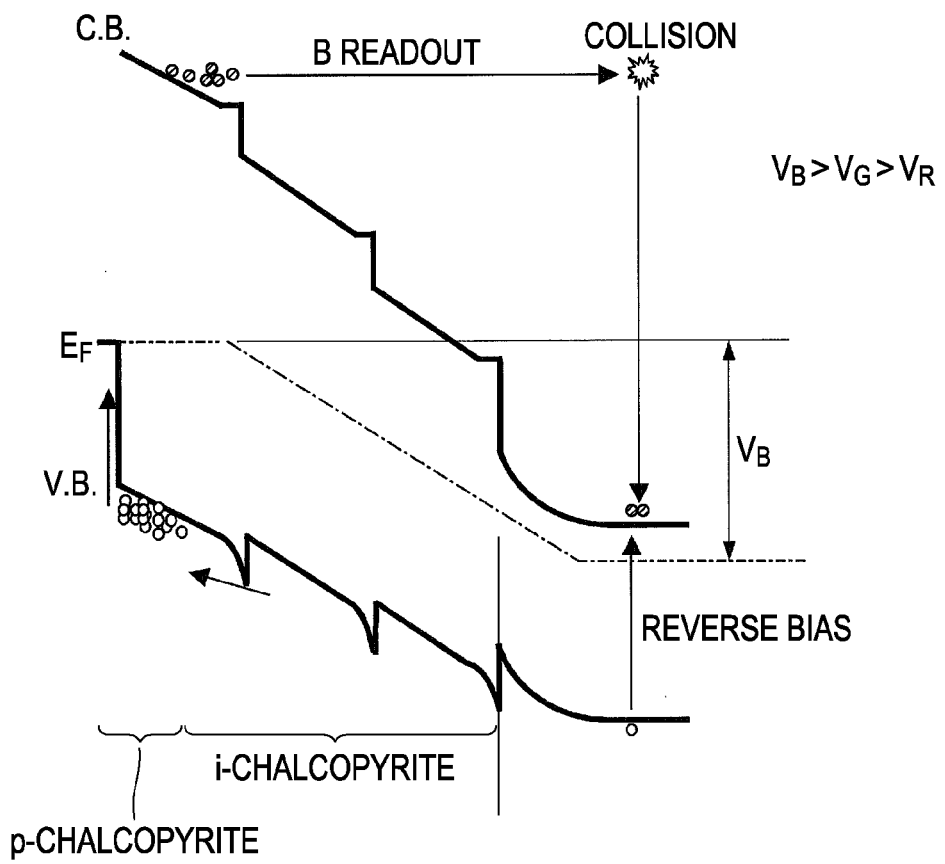
FIG. 17 is a band diagram when a B signal is read.

To read a signal, charges are temporarily accumulated in the n-type silicon layer serving as the first electrode layer 12. Then the readout circuit 51 reads the signal with the gate MOS transistor 41. As shown in FIGS. 16 and 17, voltages of $V_G$ and $V_B$ are applied in that order to read a G signal and a B signal (wherein $V_B > V_G > V_R$). Also in this case, avalanche multiplication is caused by the effects of the discontinuity in the conduction band between the n-type silicon layer serving as the first electrode layer 12 and the i-$CuGa_{0.52}In_{0.48}S_2$ layer serving as the first photoelectric conversion layer 21 and discontinuities in the conduction band among the chalcopyrite-based materials.

In such a readout method, a plug structure as described in U.S. Pat. No. 5,965,875 may not be used. Thus, each photodiode with a large area can be formed, improving sensitivity, simplifying the process, and reducing the cost.

Figure 18:
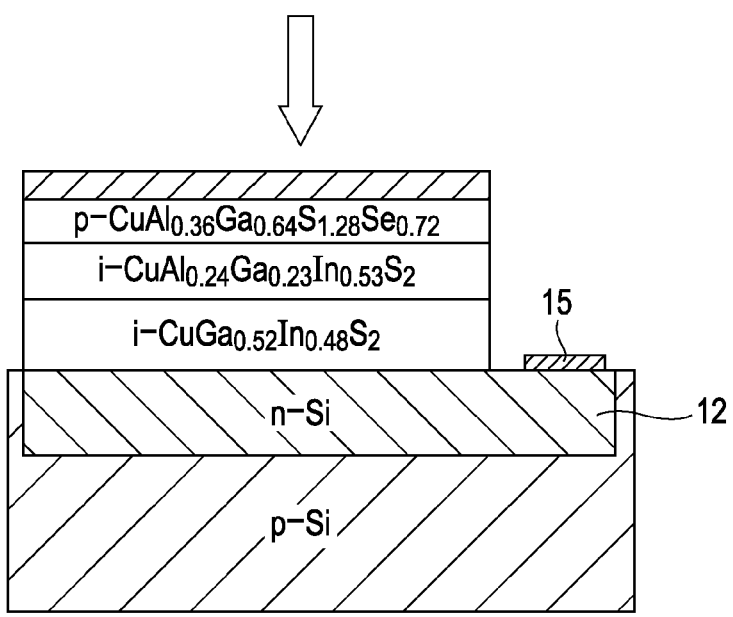
FIG. 18 is a schematic cross-sectional view of a modification of a solid-state image device including a readout electrode according to the second embodiment.

The method for read a signal using the gate MOS transistor has been described above. Alternatively, as shown in FIG. 18, the readout electrode 15 may be formed on the n-type silicon layer serving as the first electrode layer 12 to read a signal.

In the solid-state image device 2 described above, the control of the band gaps by changing the compositions results in the dispersion of light into RGB components in the depth direction, the accumulation of photoelectrons, the signal readout by three-step voltage application, and a reduction in voltage to cause avalanche multiplication.

3. Third Embodiment

Third Example of Structure of Solid-State Image Device

The structure that separates light in the depth direction and the structure that simultaneously causes the dispersion of light and avalanche multiplication have been described above. As a third embodiment of the present invention, a simple structure in which only avalanche multiplication occurs can be used. An exemplary structure will be described with reference to FIG. 19 which is a band diagram at zero bias and FIG. 20 which is a band diagram at a reverse bias.

Figure 19:
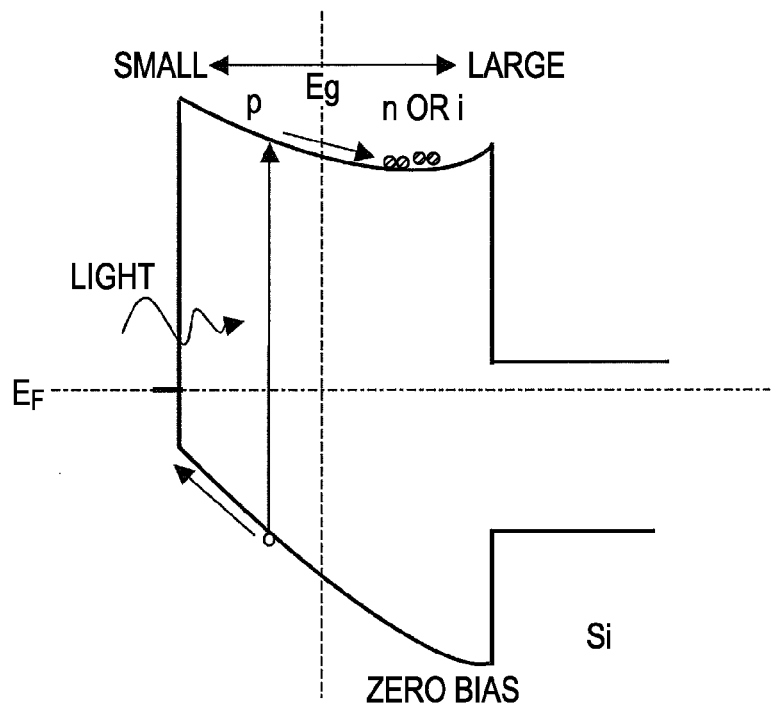
FIG. 19 is a band diagram of a solid-state image device at zero bias according to a third embodiment of the present invention.
Figure 20:
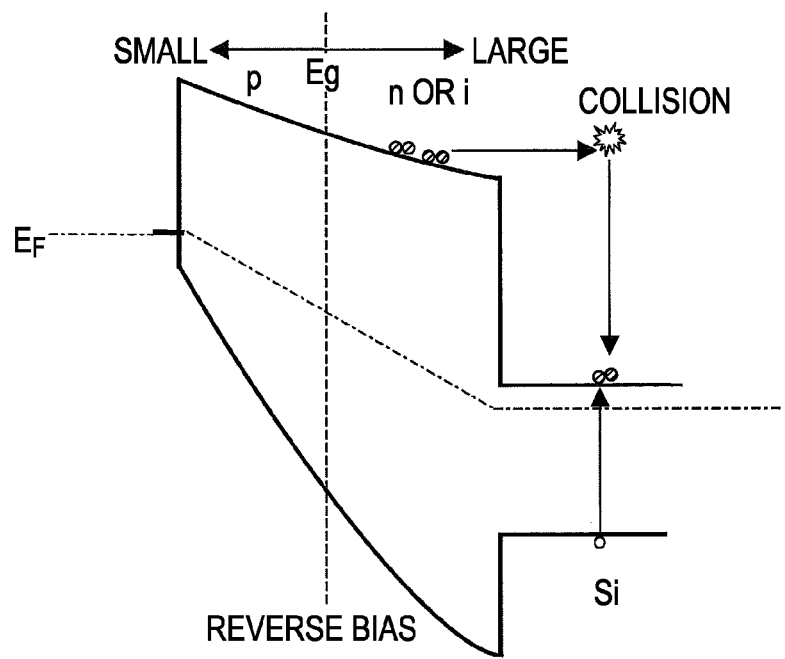
FIG. 20 is a band diagram of the solid-state image device at a reverse bias according to the third embodiment of the present invention.

As shown in FIGS. 19 and 20, a continuous or stepwise change in band gap results in a high degree of discontinuity. In this case, the degree of conduction-band discontinuity is higher than that of the case shown in FIGS. 14 to 17. It is thus possible to achieve a high avalanche multiplication gain at a low driving voltage. In this case, color separation may be performed with a color filter such as an on-chip color filter (OCCF) arranged adjacent to a surface of the device.

Furthermore, a method for reading a signal is not limited to the method in which a voltage is applied in the depth direction as described above. For example, a signal can be read by applying a voltage to a photoelectric conversion portion having a p-i-n structure or a pn structure. An example of this will be described with reference to FIGS. 21 and 22.

Figure 21:
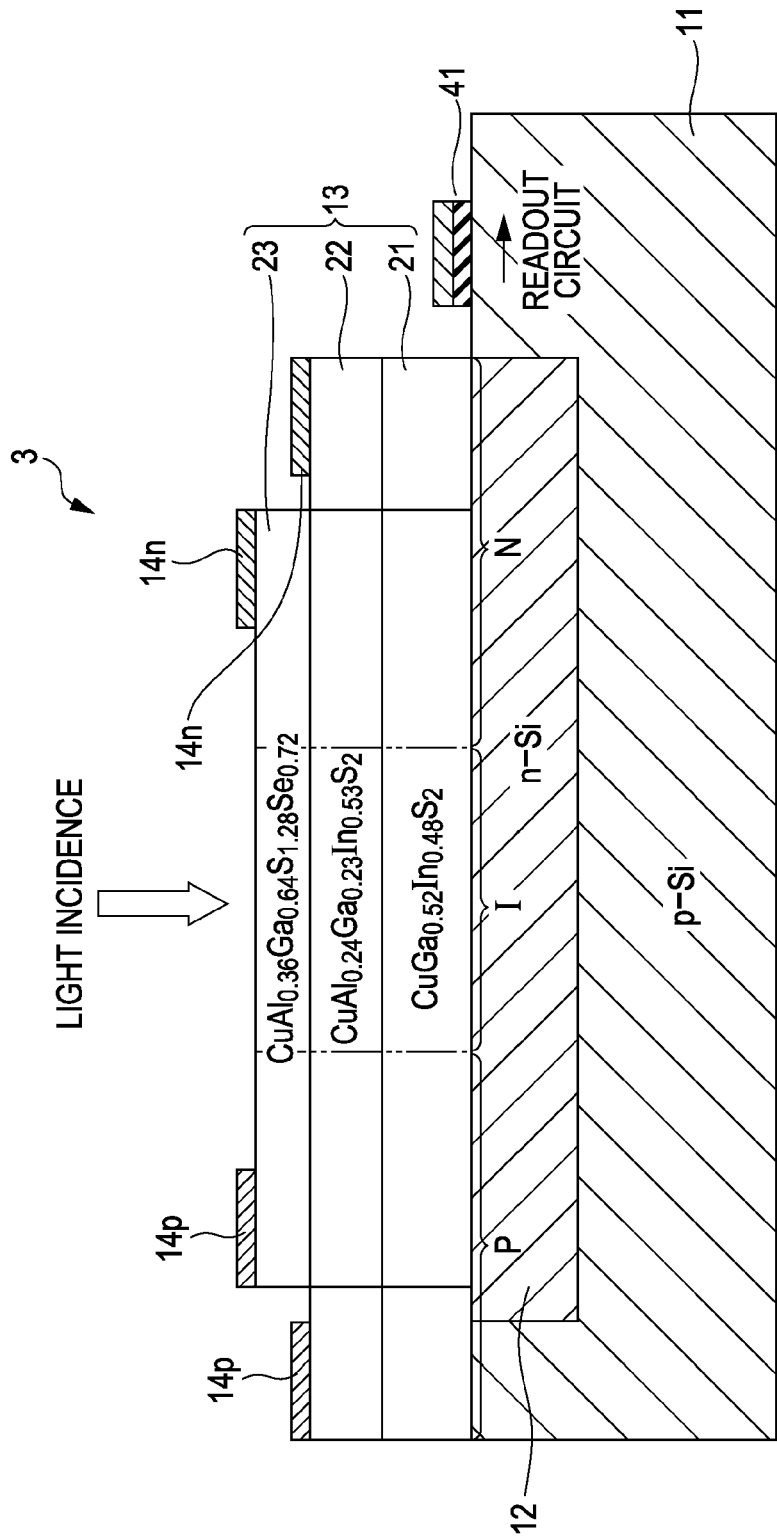
FIG. 21 is a schematic cross-sectional view of a third example of a solid-state image device according to the third embodiment of the present invention.

As shown in FIG. 21, the silicon substrate 11 is formed of a p-type silicon substrate. The first electrode layer 12 is formed in the silicon substrate 11. The first electrode layer 12 is made of, for example, an n-type silicon layer formed in the silicon substrate 11. The photoelectric conversion layer 13 composed of lattice-matched CuAlGaInSSe-based mixed crystals is arranged on the first electrode layer 12. The photoelectric conversion layer 13 includes the first photoelectric conversion layer 21 composed of $CuGa_{0.52}In_{0.48}S_2$, the second photoelectric conversion layer 22 composed of $CuAl_{0.24}Ga_{0.23}In_{0.53}S_2$, and the third photoelectric conversion layer 23 composed of $CuAl_{0.36}Ga_{0.64}S_{1.28}Se_{0.72}$ stacked, in that order, on the first electrode layer 12. Each of the first photoelectric conversion layer 21, the second photoelectric conversion layer 22, and the third photoelectric conversion layer 23 has a central portion of an i-conductivity type, one end portion of a p-conductivity type, and the other end portion of an n-conductivity type. Thus, each layer has a p-i-n structure.

Alternatively, not shown, each of the first photoelectric conversion layer 21, the second photoelectric conversion layer 22, and the third photoelectric conversion layer 23 has one end portion of a p-type semiconductor and the other end portion of an n-type semiconductor. Thus, each layer has a pn structure.

Furthermore, p-type electrodes 14p (second electrode layers) are arranged on the p-type end portion of the second photoelectric conversion layer 22 and the p-type end portion of the third photoelectric conversion layer 23 of the photoelectric conversion layer 13. Moreover, n-type electrodes 14n (second electrode layers) are arranged on the n-type end portion of the second photoelectric conversion layer 22 and the n-type end portion of the third photoelectric conversion layer 23 of the photoelectric conversion layer 13. The p-type electrodes 14p may not be arranged.

The readout circuit 51 configured to read a signal in the direction shown by an arrow with the gate MOS transistor 41 is formed in the silicon substrate 11.

Figure 22:
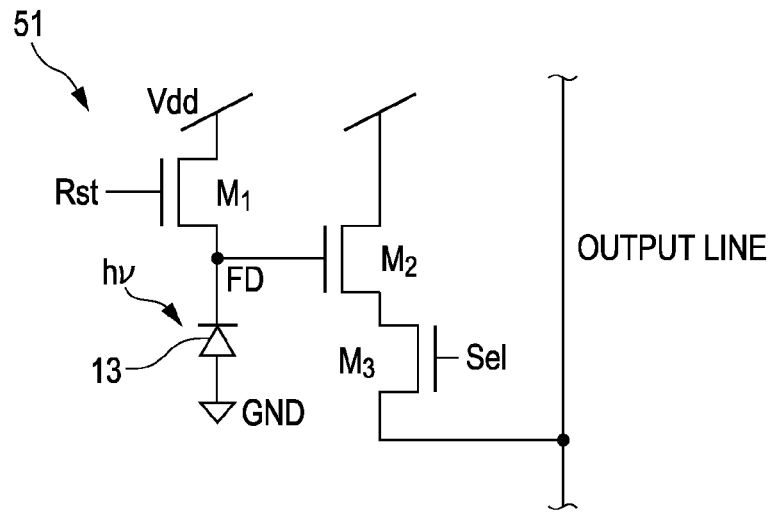
FIG. 22 is a schematic circuit diagram showing an example of a readout circuit.

As shown in FIG. 22, in the readout circuit 51, a diffusion layer of a reset transistor M1 and the gate electrode of an amplifying transistor M2 are connected to a floating diffusion node FD that is connected to the photoelectric conversion layer 13. The amplifying transistor M2 is connected to a select transistor M3, the diffusion layer of the amplifying transistor M2 being shared between the amplifying transistor M2 and the select transistor M3. A diffusion layer of the select transistor M3 is connected to an output line.

A solid-state image device 3 (image sensor) has the foregoing structure.

Also in the case where the photoelectric conversion layer 13 has the p-i-n structure or pn structure as described above, a reverse bias may not necessarily be applied in order to read a signal.

Figure 23:
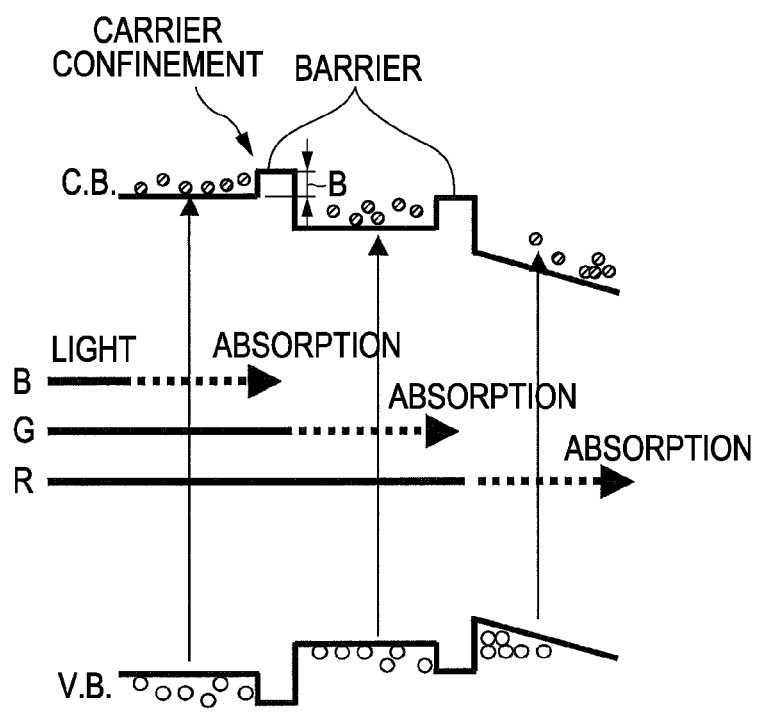
FIG. 23 is a band diagram of the solid-state image device according to the third embodiment of the present invention.

The band diagram of the solid-state image device 3 shown in FIG. 21 is shown in FIG. 23. That is, a barrier is formed on the wide-gap side of a portion near the interface between the second photoelectric conversion layer 22 and the third photoelectric conversion layer 23 by composition control, provided that B>kT (=26 meV). Thus, photoelectrons produced by a blue component can be confined and accumulated. Similarly, a barrier is formed on the wide-gap side of a portion near the interface between the first photoelectric conversion layer 21 and the second photoelectric conversion layer 22 by composition control, provided that B>kT (=26 meV). Thus, photoelectrons produced by a green component can be confined and accumulated. With respect to a red component, electrons are transferred to the n-type silicon layer serving as the first electrode layer 12 and then read by the gate MOS transistor 41.

4. Fourth Embodiment

Fourth Example of Structure of Solid-State Image Device

In addition, the solid-state image device 3 may have a structure described below. The structure will be described below as a fourth embodiment of the present invention.

Figure 24:
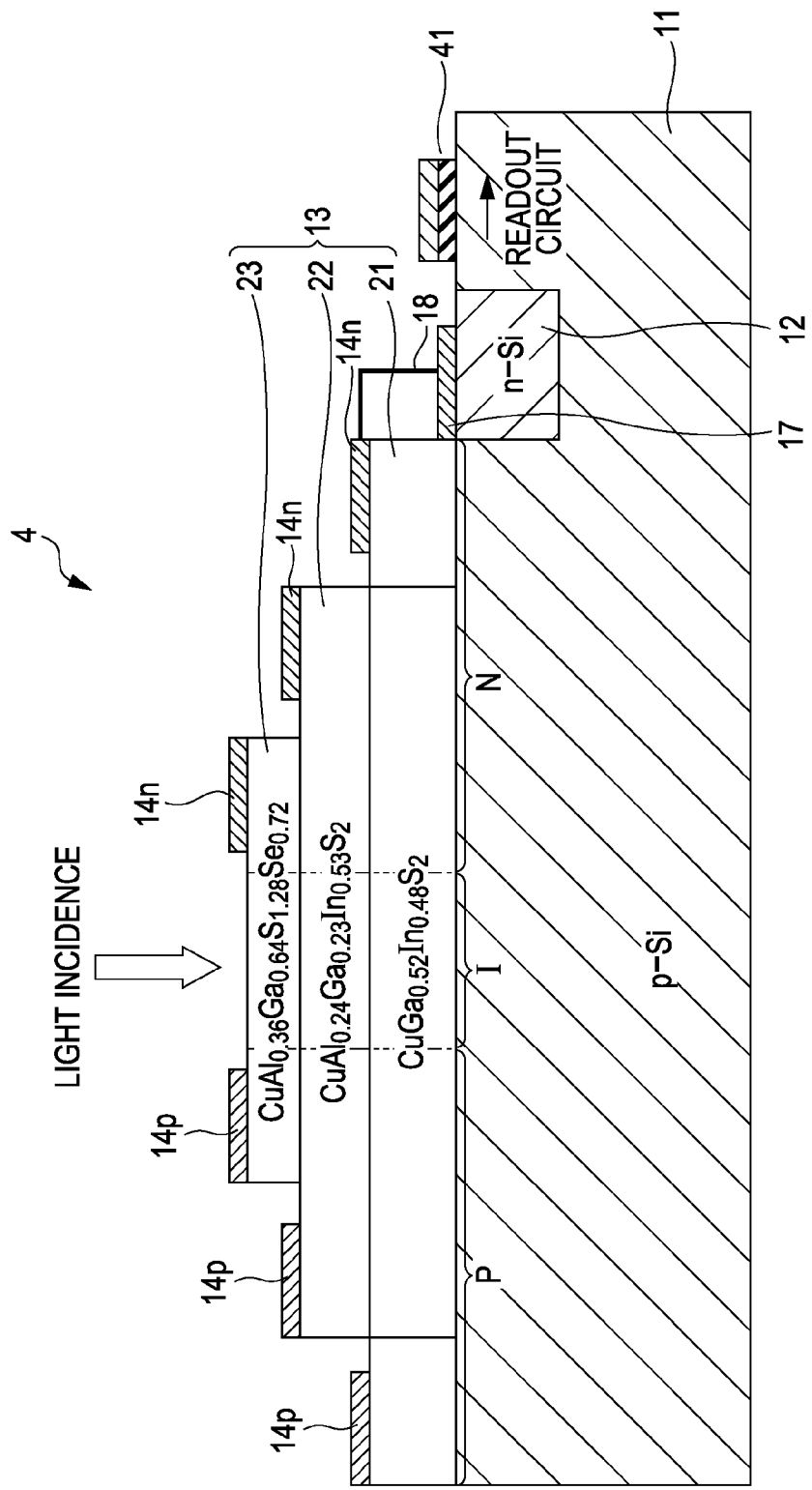
FIG. 24 is a schematic cross-sectional view of a fourth example of a solid-state image device according to a fourth embodiment of the present invention.

As shown in FIG. 24, the silicon substrate 11 is formed of a p-type silicon substrate. The photoelectric conversion layer 13 composed of lattice-matched CuAlGaInSSe-based mixed crystals is arranged on the silicon substrate 11. The photoelectric conversion layer 13 includes the first photoelectric conversion layer 21 composed of $CuGa_{0.52}In_{0.48}S_2$, the second photoelectric conversion layer 22 composed of $CuAl_{0.24}Ga_{0.23}In_{0.53}S_2$, and the third photoelectric conversion layer 23 composed of $CuAl_{0.36}Ga_{0.64}S_{1.28}Se_{0.72}$ stacked, in that order, on the silicon substrate 11. Each of the first photoelectric conversion layer 21, the second photoelectric conversion layer 22, and the third photoelectric conversion layer 23 has an intrinsic central portion, one end portion of a p-type semiconductor, and the other end portion of an n-type semiconductor. Thus, each layer has a p-i-n structure.

Alternatively, not shown, each of the first photoelectric conversion layer 21, the second photoelectric conversion layer 22, and the third photoelectric conversion layer 23 has one end portion of a p-type semiconductor and the other end portion of an n-type semiconductor. Thus, each layer has a pn structure.

Furthermore, the p-type electrodes 14p (second electrode layers) are arranged on the p-type end portion of the first photoelectric conversion layer 21, the p-type end portion of the second photoelectric conversion layer 22, and the p-type end portion of the third photoelectric conversion layer 23 of the photoelectric conversion layer 13. Moreover, the n-type electrodes 14n (second electrode layers) are arranged on the n-type end portion of the first photoelectric conversion layer 21, the n-type end portion of the second photoelectric conversion layer 22, and the n-type end portion of the third photoelectric conversion layer 23 of the photoelectric conversion layer 13. The p-type electrodes 14p may not be arranged.

The first electrode layer 12 is formed in the silicon substrate 11 and located, for example, on one side of the first photoelectric conversion layer 21. The first electrode layer 12 is made of, for example, an n-type silicon layer formed in the silicon substrate 11. The n-type electrode 14n on the first photoelectric conversion layer 21 is connected to an electrode 17 arranged on the first electrode layer 12 with a lead 18. The gate MOS transistor 41 is arranged on the silicon substrate 11 and adjacent to the first electrode layer 12. The silicon substrate 11 includes the same readout circuit as that described in the schematic circuit diagram of FIG. 22, the readout circuit being configured to read a signal with the gate MOS transistor 41.

A solid-state image device 4 (image sensor) has the foregoing structure.

Figure 25:
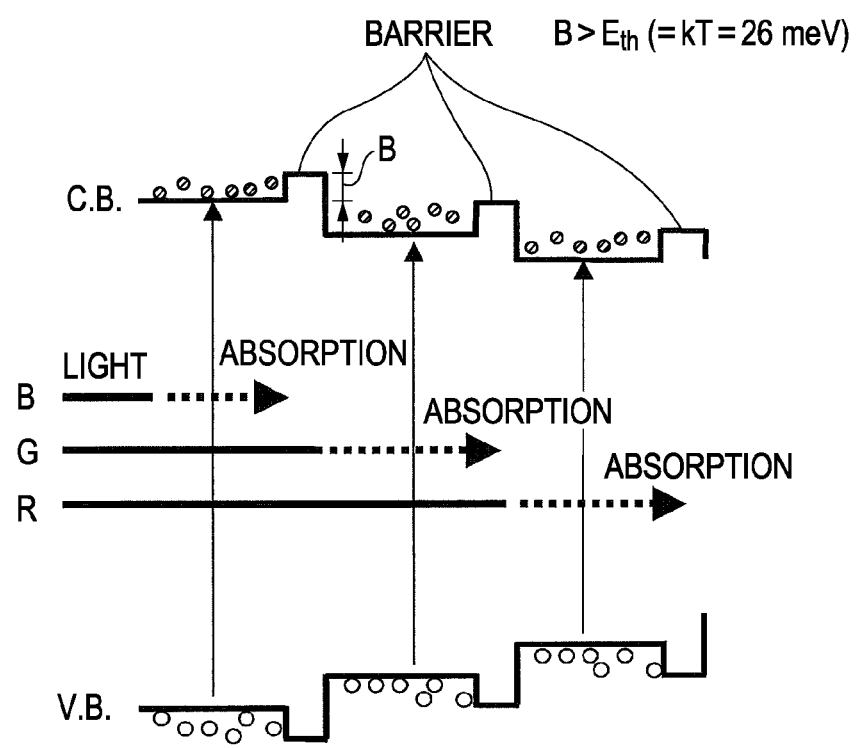
FIG. 25 is a band diagram of the solid-state image device according to the fourth embodiment of the present invention.

The band diagram of the solid-state image device 4 will be described below with reference to FIG. 25. As shown in FIG. 25, a barrier is formed on the wide-gap side of a portion near the interface between the second photoelectric conversion layer 22 and the third photoelectric conversion layer 23 by composition control, provided that B>kT (=26 meV). Thus, photoelectrons produced by a blue component can be confined and accumulated. Similarly, a barrier is formed on the wide-gap side of a portion near the interface between the first photoelectric conversion layer 21 and the second photoelectric conversion layer 22 by composition control, provided that B>kT (=26 meV). Thus, photoelectrons produced by a green component can be confined and accumulated. Similarly, a barrier is formed on the wide-gap side of a portion near the interface between the first photoelectric conversion layer 21 and the silicon substrate 11 by composition control, provided that B>kT (=26 meV). Since the n-type electrode 14n is arranged on the first photoelectric conversion layer 21, electrons accumulated in the first photoelectric conversion layer 21 may be directly read.

Alternatively, the photoelectrons for each of RGB components may be temporarily accumulated in the silicon substrate 11 and then read by the gate MOS transistor 41. Although the p-type electrodes 14p are configured to extract holes, charge-up can be eliminated by directly connecting the p-type electrodes 14p to a ground. Furthermore, the use of the silicon substrate 11 having a higher p-type dopant concentration allows holes to be transferred into the silicon substrate 11. In this case, the p-type electrodes 14p may not be used. In this structure, avalanche multiplication does not necessarily occur at a low-voltage driving because of no discontinuity in the conduction band, except for the readout of a red component. This structure, however, has the advantage that a signal can be read not sequentially as described above but simultaneously.

5. Fifth Embodiment

Fifth Example of Structure of Solid-State Image Device

In the foregoing description, the first to third photoelectric conversion layers are stacked in the depth direction. However, the layers are not necessarily stacked. A fifth example of a solid-state image device in which the first to third photoelectric conversion layers are not stacked according to a fifth embodiment of the present invention will be described below with reference to a schematic cross-sectional view of FIG. 26.

Figure 26:
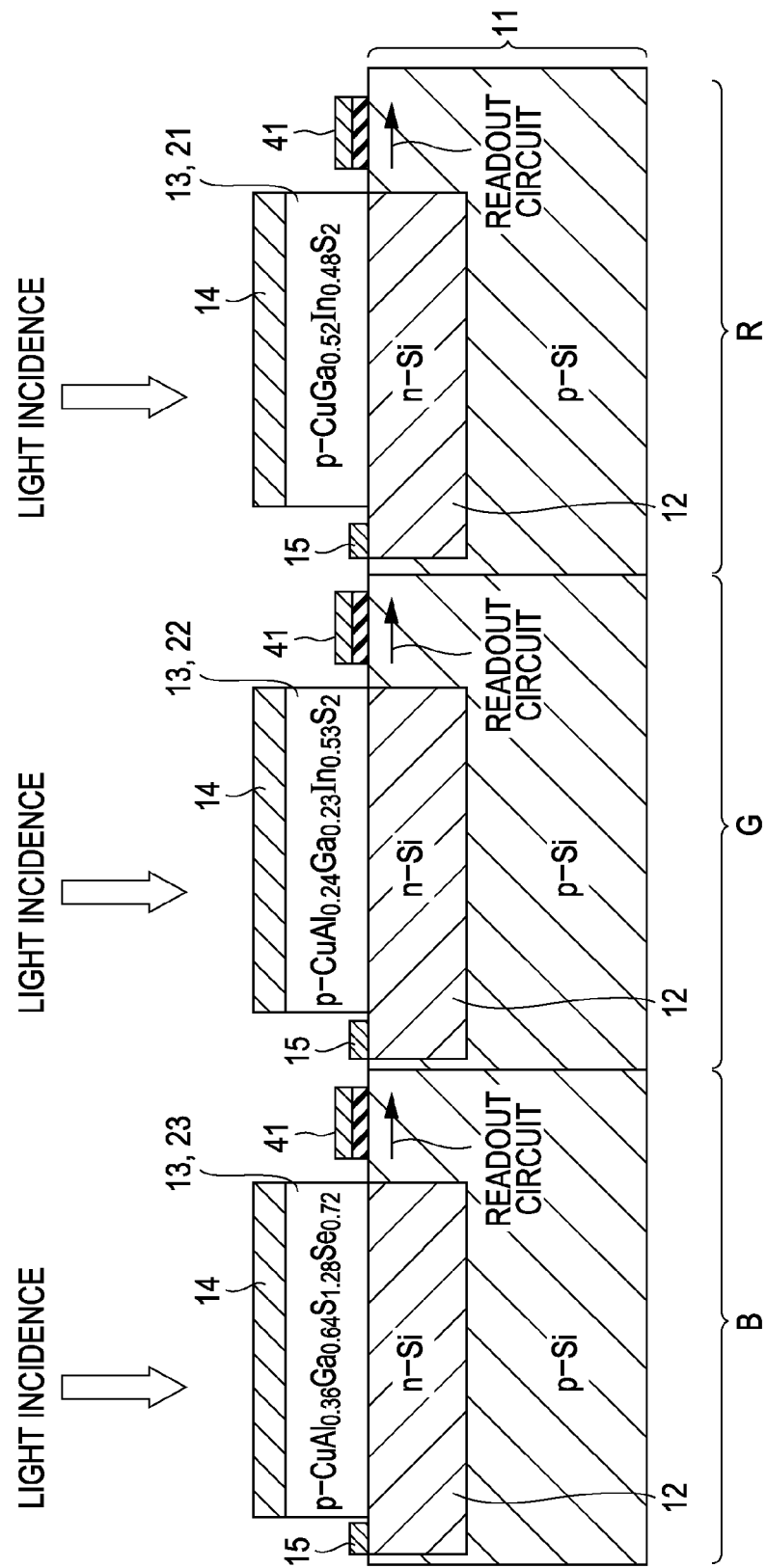
FIG. 26 is a schematic cross-sectional view of a fifth example of a solid-state image device according to a fifth embodiment of the present invention.

As shown in FIG. 26, the first photoelectric conversion layer 21 configured to separate a red component, the second photoelectric conversion layer 22 configured to separate a green component, and the third photoelectric conversion layer 23 configured to separate a blue component may be laterally arranged.

Specific mention will be made below. The silicon substrate 11 is formed of a p-type silicon substrate. The first electrode layers 12 are formed in the silicon substrate 11 and located at positions where the photoelectric conversion layers that separate light into RGB components are formed. Each of the first electrode layers 12 is made of, for example, an n-type silicon layer formed in the silicon substrate 11.

The first photoelectric conversion layer 21 composed of a lattice-matched CuAlGaInSSe-based mixed crystal is arranged on the first electrode layer 12 located at a portion where a red component is separated. The first photoelectric conversion layer 21 is composed of, for example, $CuGa_{0.52}In_{0.48}S_2$.

The second photoelectric conversion layer 22 composed of a lattice-matched CuAlGaInSSe-based mixed crystal is arranged on the first electrode layer 12 located at a portion where a green component is separated. The second photoelectric conversion layer 22 is composed of, for example, $CuAl_{0.24}Ga_{0.23}In_{0.53}S_2$.

The third photoelectric conversion layer 23 composed of a lattice-matched CuAlGaInSSe-based mixed crystal is arranged on the first electrode layer 12 located at a portion where a blue component is separated. The third photoelectric conversion layer 23 is composed of, for example, $CuAl_{0.36}Ga_{0.64}S_{1.28}Se_{0.72}$.

The first photoelectric conversion layer 21 has a thickness of, for example, 0.8 μm. The second photoelectric conversion layer 22 has a thickness of, for example, 0.7 μm.

The third photoelectric conversion layer 23 has a thickness of, for example, 0.7 μm.

The second electrode layer 14 is arranged on each of the first, second, and third photoelectric conversion layers 21, 22, and 23. Each second electrode layer 14 is formed of the same optically transparent electrode as that described in the first embodiment.

A first photoelectric conversion portion 24 including the first electrode layer 12, the first photoelectric conversion layer 21, and the second electrode layer 14 stacked on the silicon substrate 11 is formed. Similarly, a second photoelectric conversion portion 25 including the first electrode layer 12, the second photoelectric conversion layer 22, and the second electrode layer 14 stacked on the silicon substrate 11 is formed. A third photoelectric conversion portion 26 including the first electrode layer 12, the third photoelectric conversion layer 23, and the second electrode layer 14 stacked on the silicon substrate 11 is formed. That is, the first to third photoelectric conversion portions 24 to 26 are laterally arranged on the silicon substrate 11.

In a solid-state image device 5 having the structure described above, since the p-type chalcopyrite-based materials are used, photoelectrons are spontaneously transferred toward the silicon substrate 11 by an energy difference even when a reverse bias is not applied. The photoelectrons may be read with the gate MOS transistors 41 on the silicon substrate 11. Each of the gate MOS transistors 41 are arranged on the silicon substrate 11 and located adjacent to a corresponding one of the first electrode layers 12. In this structure, RGB signals can be simultaneously read.

Figure 27:
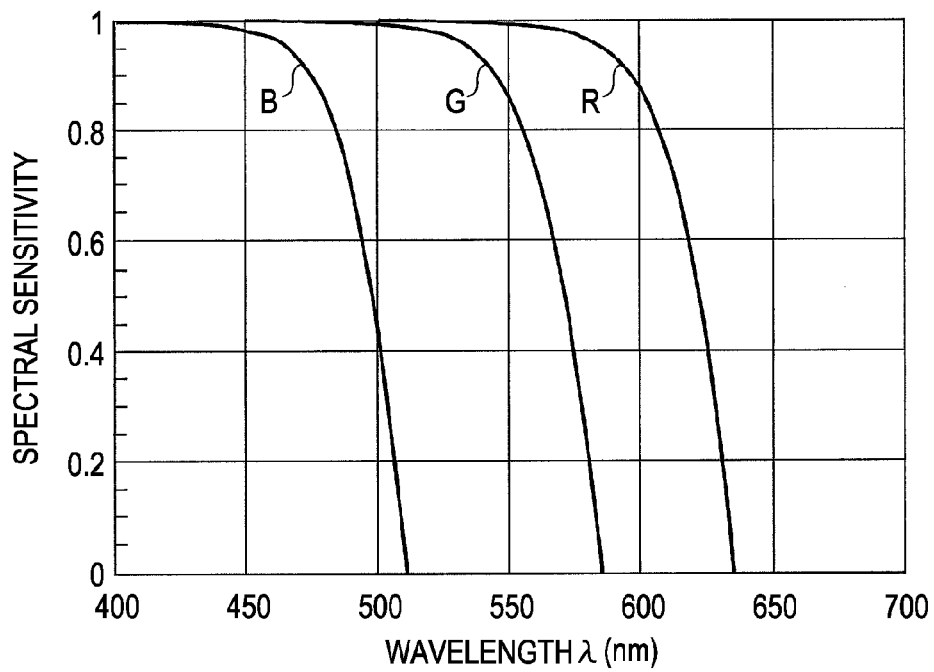
FIG. 27 is a graph showing spectral sensitivity characteristics of the solid-state image device according to the fifth embodiment.

Like the Bayer pattern, the number of green pixels may be increased to improve the resolution of a green component. FIG. 27 shows spectral sensitivity characteristics in this structure.

As shown in FIG. 27, shorter wavelengths are not cut. Thus, for example, color arithmetic processing described below may be made after demosaicing.

$$R=r-g,\ G=g-b,\ \text{and}\ B=b$$

where r, g, and b are raw data.

The chalcopyrite-based materials described above are CuAlGaInSSe-based mixed crystals.

6. Sixth Embodiment

Sixth Example of Structure of Solid-State Image Device

As a sixth example of a solid-state image device according to a sixth embodiment of the present invention, for example, a structure in which CuGaInZnSSe-based mixed crystals are used as the chalcopyrite-based materials will be described below. The used of the CuGaInZnSSe-based mixed crystals makes it possible to perform the same control of the band gap as that described above, thus providing the same effect as those of the solid-state image devices described above.

Figure 28:
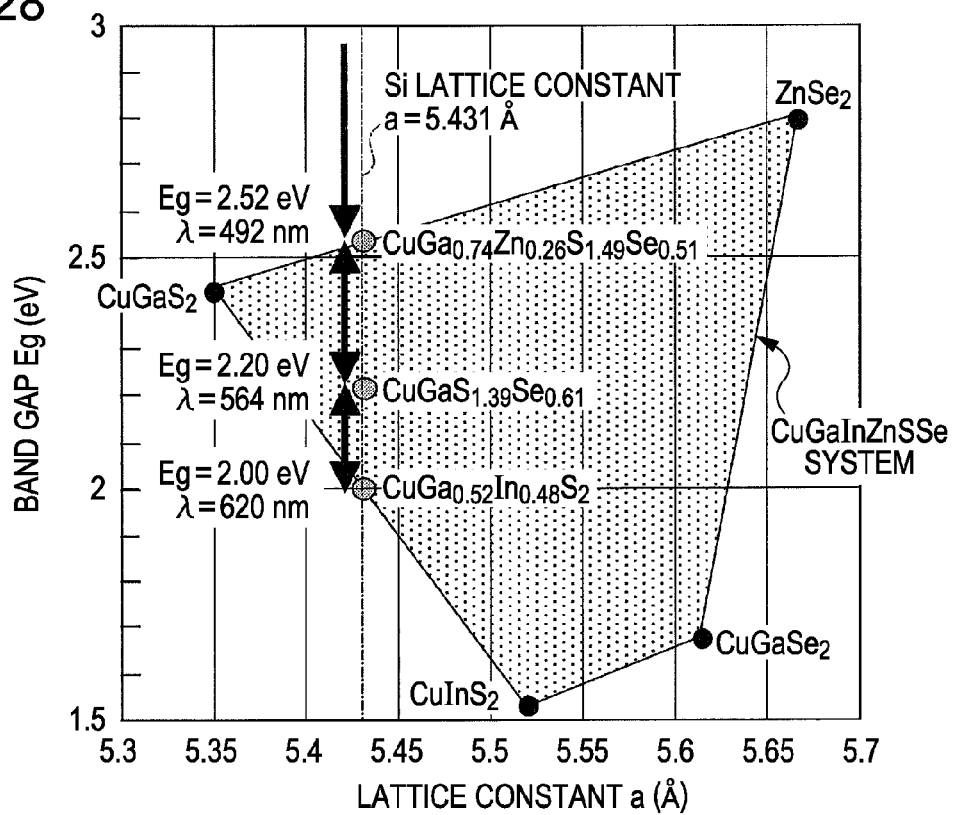
FIG. 28 is a graph showing the relationship between the band gap and the lattice constant of an example of a solid-state image device according to sixth embodiment of the present invention.

FIG. 28 shows the relationship between band gaps and lattice constants of the CuGaInZnSSe-based materials.

FIG. 28 demonstrates that the CuGaInZnSSe-based mixed crystals can be grown on the silicon (100) substrate 11 while maintaining lattice matching to the silicon substrate 11.

Figure 29:
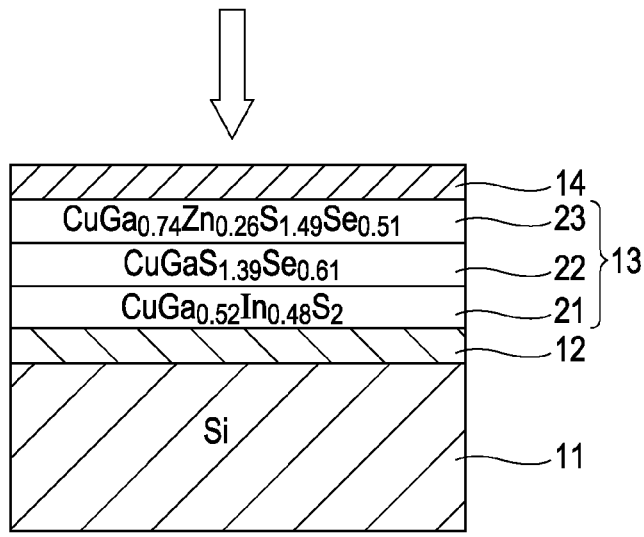
FIG. 29 is a schematic cross-sectional view of a sixth example of a solid-state image device according to a sixth embodiment of the present invention.

For example, the use of a cross-section structure shown in FIG. 29 enables light to be separated into RGB components.

As an example of the structure shown in FIG. 29, the first electrode layer 12 is formed in the silicon substrate 11. The first electrode layer 12 is made of, for example, an n-type silicon region formed in the silicon substrate 11. The photoelectric conversion layer 13 composed of chalcopyrite-based compound semiconductors of lattice-matched CuAlGaIn-ZnSSe-based mixed crystals is arranged on the first electrode layer 12. The optically transparent second electrode layer 14 is arranged on the photoelectric conversion layer 13. The second electrode layer 14 is composed of a transparent electrode material, for example, indium-tin oxide (ITO), zinc oxide, or indium-zinc oxide. A solid-state image device 6 (image sensor) has the basic structure described above.

The photoelectric conversion layer 13 composed of the chalcopyrite-based compound semiconductors is configured to separate light into red, green, and blue (RGB) components in the depth direction and is formed so as to be lattice-matched to the silicon substrate 11.

The chalcopyrite-based mixed crystals each having a high optical-absorption coefficient are epitaxially grown on a Si(100) substrate while maintaining lattice matching to the substrate, thus achieving satisfactory crystallinity and leading to the highly sensitive solid-state image device 6 (image sensor) with a low dark current.

The photoelectric conversion layer 13 includes the first photoelectric conversion layer 21 configured to separate a red component, the second photoelectric conversion layer 22 configured to separate a green component, and the third photoelectric conversion layer 23 configured to separate a blue component stacked in that order from the bottom.

For example, $CuGa_{0.52}In_{0.48}S_2$ is used as the photoelectric conversion material for separating a red component. $CuGaIn_{1.39}Se_{0.6}$ is used as the photoelectric conversion material for separating a green component. $CuGa_{0.74}Zn_{0.26}S_{1.49}Se_{0.51}$ is used as the photoelectric conversion material for separating a blue component. In this way, the stacking of the photoelectric conversion material for separating a red component, the photoelectric conversion material for separating a green component, and the photoelectric conversion material for separating a blue component, in that order, on the silicon substrate 11 allows light to be separated in the depth direction.

In consideration of the photon energy of red, green, and blue (RGB) components, band-gap regions that can separate light in the depth direction are described below. The first photoelectric conversion layer 21 may have a band gap of 2.00±0.1 eV (wavelength: 590 nm to 650 nm). The second photoelectric conversion layer 22 may have a band gap of 2.20±0.15 eV (wavelength: 530 nm to 605 nm). The third photoelectric conversion layer 23 may have a band gap of 2.51±0.2 eV (wavelength: 460 nm to 535 nm).

In this case, the composition of the first photoelectric conversion layer 21 is $CuGa_yIn_zS_uSe_v$, wherein $0.52 \leq y \leq 0.76$, $0.24 \leq z \leq 0.48$, $1.70 \leq u \leq 2.00$, $0 \leq u \leq 0.30$, and $y+z+u+v=3$ (alternatively, $y+z=1$ and $u+v=2$). The composition of the second photoelectric conversion layer 22 is $CuGa_yIn_zZnwS_uSe_v$, wherein $0.64 \leq y \leq 0.88$, $0 \leq z\ 0.36$, $0 \leq w \leq 0.12$, $0.15 \leq u \leq 1.44$, $0.56 \leq v \leq 1.85$, and $y+z+w+u+v=3$ (alternatively, $y+z+w=1$ and $u+v=2$).

The composition of the third photoelectric conversion layer 23 is $CuGa_yZn_wS_uSe_v$, wherein $0.74 \leq y \leq 0.91$, $0.09 \leq w \leq 0.26$, $1.42 \leq u \leq 1.49$, $0.51 \leq v \leq 0.58$, and $y+w+u+v=3$.

The foregoing CuAlGaInSSe-based compositions may be partially or completely substituted by these compositions. FIG. 29 shows exemplary compositions of these layers.

7. Seventh Embodiment
Seventh Example of Structure of Solid-State Image Device

Figure 30:
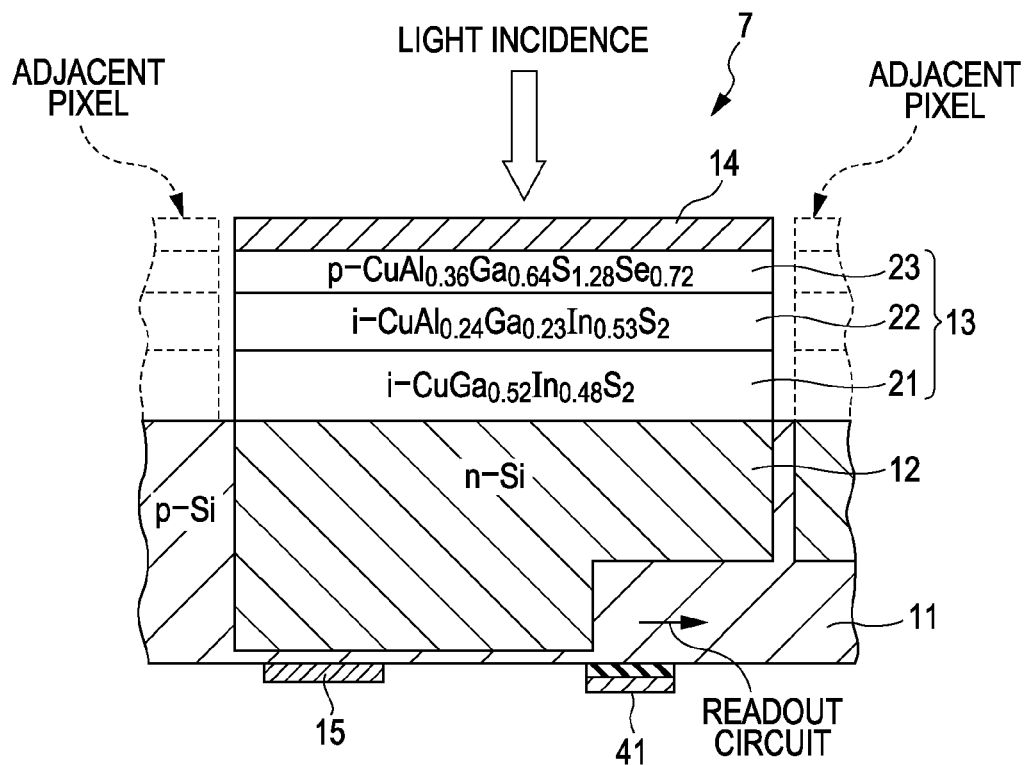
FIG. 30 is a schematic cross-sectional view of a seventh example of a solid-state image device according to a seventh embodiment of the present invention.

A seventh example of a solid-state image device according to a seventh embodiment of the present invention will be described with reference to a schematic cross-sectional view of FIG. 30 and a schematic circuit diagram of FIG. 31. FIG. 30 shows an exemplary back-illuminated sensor in which light is incident on the back side opposite the front side where transistors and wiring are formed. The back-illuminated sensor also has the same advantages as those of the front-illuminated sensor in which light is incident on the front side where transistors and wiring are formed.

As shown in FIG. 30, the silicon substrate 11 is formed of a p-type silicon substrate. The first electrode layer 12 is formed in the silicon substrate 11 and extends to the vicinity of the back side of the silicon substrate 11. The first electrode layer 12 is made of, for example, an n-type silicon layer formed in the silicon substrate 11. The photoelectric conversion layer 13 composed of lattice-matched CuAlGaInSSe-based mixed crystals is arranged on the first electrode layer 12. The photoelectric conversion layer 13 includes the first photoelectric conversion layer 21 composed of $i$-$CuGa_{0.52}In_{0.48}S_2$, the second photoelectric conversion layer 22 composed of $i$-$CuAl_{0.24}Ga_{0.23}In_{0.53}S_2$, and the third photoelectric conversion layer 23 composed of $p$-$CuAl_{036}Ga_{0.64}S_{1.28}Se_{0.72}$ stacked on the first electrode layer 12.

Thus, the photoelectric conversion layer 13 has a p-i-i structure as a whole.

The photoelectric conversion layer 13 may be composed of the materials within the composition ranges described above. Furthermore, the foregoing CuGaInZnSSe-based mixed crystals may be used.

The optically transparent second electrode layer 14 is arranged on the photoelectric conversion layer 13. The second electrode layer 14 is composed of an optically transparent electrode material, for example, indium-tin oxide (ITO), zinc oxide, or indium-zinc oxide.

Furthermore, the readout electrode 15 that reads a signal from the first electrode layer 12 is formed on the front side of the silicon substrate 11 (in the figure, the lower side of the silicon substrate 11). The readout circuit 51 that reads a signal with the gate MOS transistor 41 in the direction indicated by an arrow is formed on the front side of the silicon substrate 11.

Figure 31:
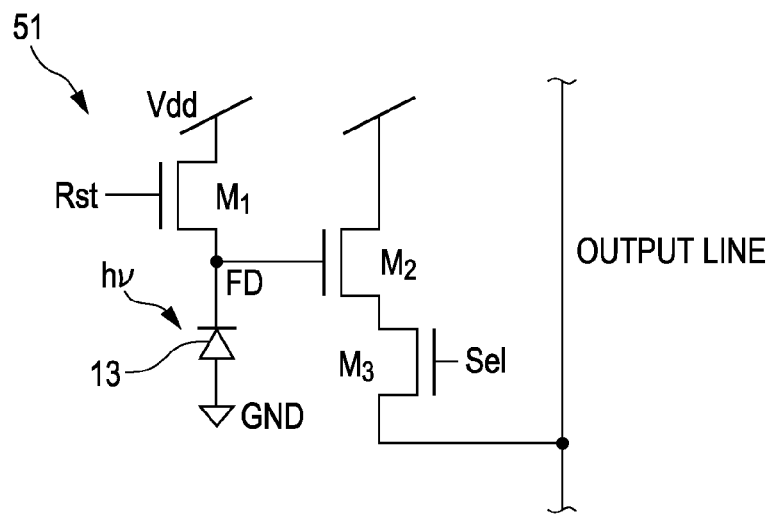
FIG. 31 is a schematic circuit diagram showing an example of a readout circuit.

Referring to FIG. 31, in the readout circuit 51, a diffusion layer of a reset transistor M1 and the gate electrode of an amplifying transistor M2 are connected to a floating diffusion node FD that is connected to the photoelectric conversion layer 13. The amplifying transistor M2 is connected to a select transistor M3, the diffusion layer of the amplifying transistor M2 being shared between the amplifying transistor M2 and the select transistor M3. A diffusion layer of the select transistor M3 is connected to an output line.

A solid-state image device 7 (image sensor) has the foregoing structure.

In the solid-state image device 7, it is possible to separate light into RGB components in the depth direction, accumulate photoelectrons, read a signal by three-step voltage application, and achieve a lower voltage to cause avalanche multiplication.

Electrodes such as the readout electrode 15, transistors such as the gate MOS transistor 41, wiring, and so forth are formed on the front side of the silicon substrate 11. The photoelectric conversion layer 13 is arranged on the back side of the silicon substrate 11 (in the figure, the upper side of the silicon substrate 11). Thus, the photoelectric conversion layers 13 can be arranged over the entire surface of the silicon substrate 11, except for spacing between adjacent photoelectric conversion layers 13. Hence, a high aperture results in an increase in the amount of incident light, thereby significantly improving the sensitivity.

First Modification of Seventh Example of Solid-State Image Device

Figure 32:
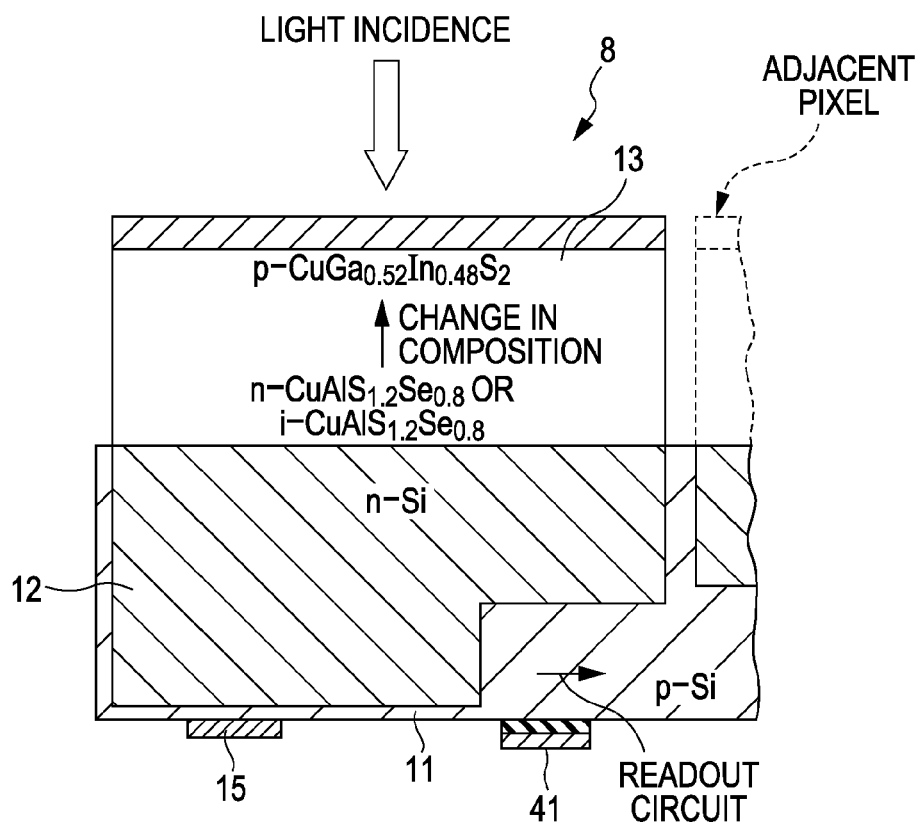
FIG. 32 is a schematic cross-sectional view of a first modification of the seventh example of the solid-state image device.

Referring to FIG. 32, in the solid-state image device 7 shown in FIG. 30, the photoelectric conversion layer 13 in which the composition is changed from $n$-$CuAlS_{1.2}Se_{0.8}$ or $i$-$CuAlS_{1.2}Se_{0.8}$ to $p$-$CuGa_{0.52}In_{0.48}S_2$ from the silicon substrate 11 side may be used. In this solid-state image device 8 (image sensor), a higher avalanche multiplication gain can be achieved at a low driving voltage.

Second Modification of Seventh Example of Solid-State Image Device

Figure 33:
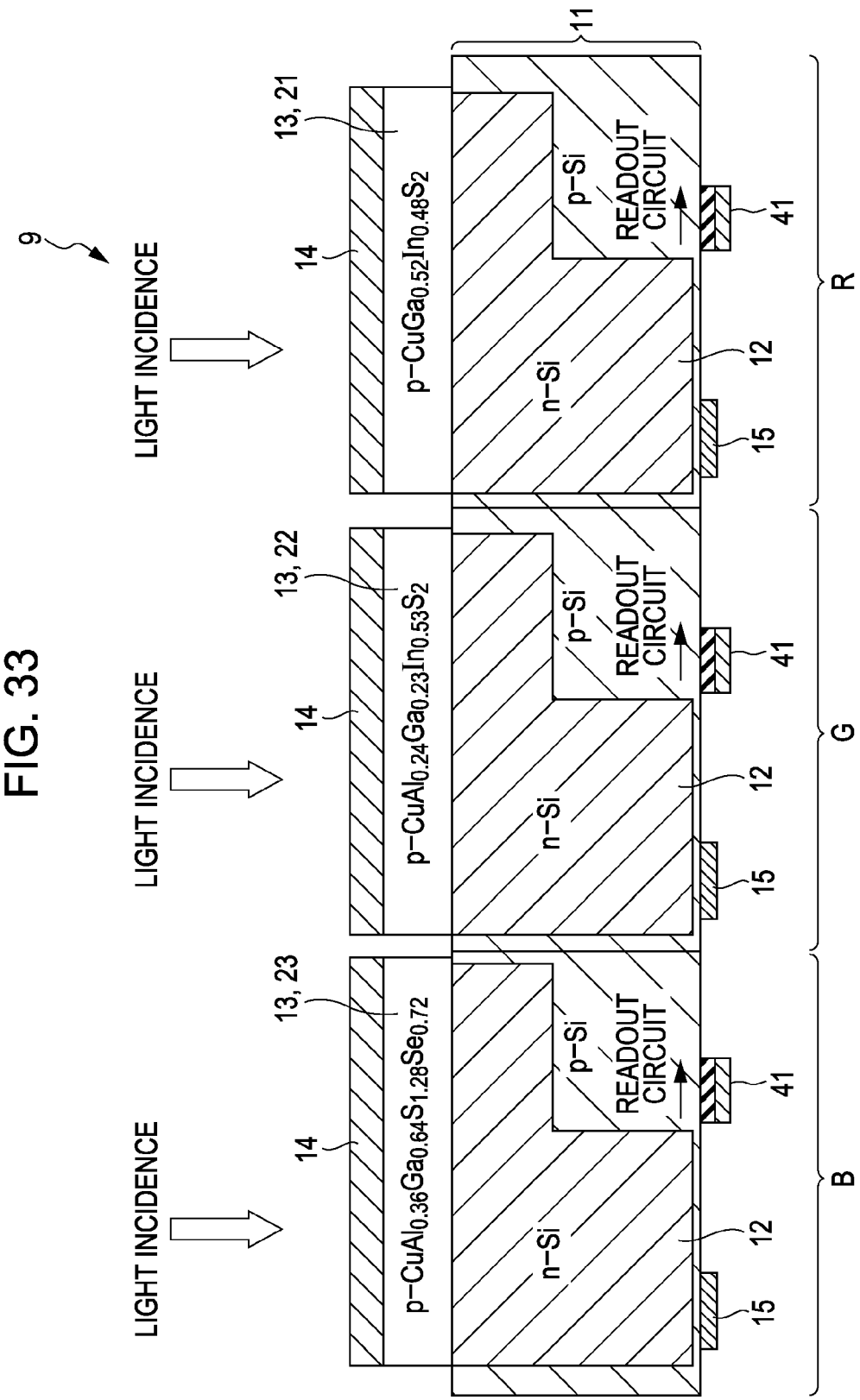
FIG. 33 is a schematic cross-sectional view of a second modification of the seventh example of a solid-state image device.

A solid-state image device (image sensor) will be described with reference to FIG. 33. Referring to FIG. 33, in the solid-state image device 5 shown in FIG. 26, electrodes such as the readout electrodes 15, transistors such as the gate MOS transistors 41, wiring, and so forth are formed on the front side of the silicon substrate 11 (in the figure, the lower side of the silicon substrate 11). That is, in the solid-state image device 7 shown in FIG. 30, each of the photoelectric conversion layers configured to separate RGB components from light is separately formed as the photoelectric conversion layer 13. In other words, the first photoelectric conversion layer 21 configured to separate a red component, the second photoelectric conversion layer 22 configured to separate a green component, and the third photoelectric conversion layer 23 configured to separate a blue component are not stacked but separately arranged on the back side of the silicon substrate 11 (in the figure, the upper side of the silicon substrate 11.

This solid-state image device 9 has the structure in which the photoelectric conversion layers configured to separate RGB components are laterally arranged. Furthermore, the readout circuits configured to read photoelectrons (not shown), the readout electrodes 15, the gate MOS transistors 41, wiring, and so forth (not shown) are arranged on the front side of the silicon substrate 11 (in the figure, the lower side of the silicon substrate 11).

In this structure, the photoelectric conversion layers 13 can be arranged over the entire surface of the silicon substrate 11, except for spacing between adjacent photoelectric conversion layers 13. Hence, a high aperture results in an increase in the amount of incident light, thereby significantly improving the sensitivity.

8. Eighth Embodiment

First Example of Method for Producing Solid-State Image Device

A first example of a method for producing a solid-state image device according to an eighth embodiment of the present invention will be described below.

Figure 34:
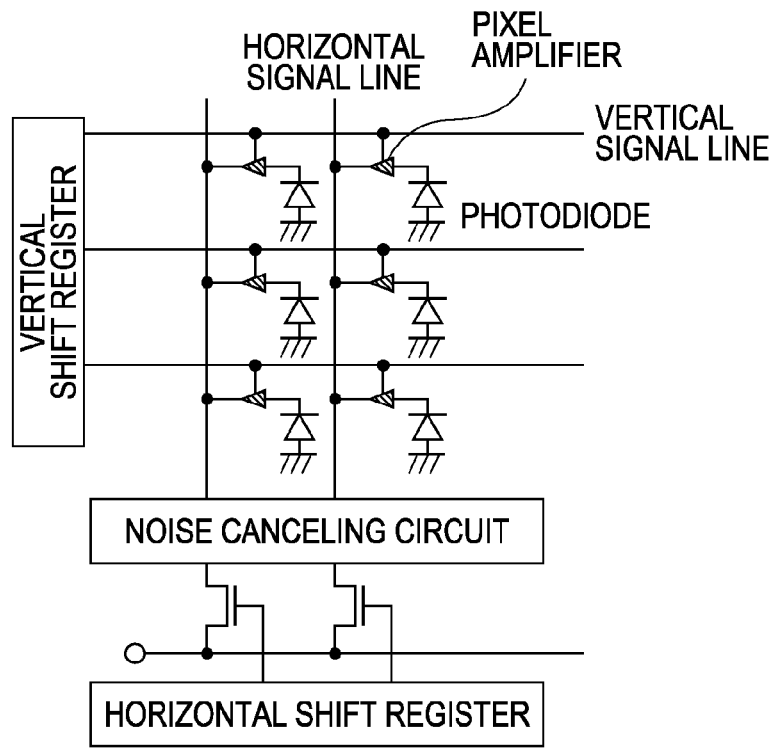
FIG. 34 is a circuit block diagram showing a CMOS image sensor to which a solid-state image device is applied.

For example, the solid-state image device 2 shown in FIG. 12 can be applied to photodiodes for use in a CMOS image sensor shown in FIG. 34. The band diagram of the solid-state image device 2 is shown in FIG. 14.

The solid-state image device 2 can be produced on the silicon substrate 11 by, for example, a common CMOS process. Details will be described below with reference to FIG. 12.

A silicon (100) substrate is used as the silicon substrate 11. First, a peripheral circuit (not shown) including transistors and electrodes is formed in the silicon substrate 11.

Next, the first electrode layer 12 is formed in the silicon substrate 11. The first electrode layer 12 is made of an n-type silicon layer formed by, for example, ion implantation. In the ion implantation, an ion-implanted region is defined by a resist mask. The resist mask is removed after the completion of the ion implantation.

The first photoelectric conversion layer 21 serving as a photoelectric conversion layer configured to separate a red component is formed on the first electrode layer 12 arranged in the silicon substrate 11. The first photoelectric conversion layer 21 composed of an i-CuGa$_{0.52}$In$_{0.48}$S$_2$ mixed crystal is formed by, for example, molecular beam epitaxy (MBE). Here, a barrier is formed at the interface between the first photoelectric conversion layer 21 and the silicon substrate 11, provided that $B_R$>kT=26 meV. For example, after the growth of i-CuAl$_{0.06}$Ga$_{0.45}$In$_{0.49}$S$_2$, the Ga content is gradually increased while the Al and In contents are gradually reduced in such a manner that i-CuGa$_{0.52}$In$_{0.48}$S$_2$ is obtained. Thereby, the spike barrier is stacked. The energy $B_R$ of the barrier is 50 meV or less, which is sufficiently higher than the thermal energy at room temperature. The barrier has a thickness of 100 nm. The photoelectric conversion layer configured to separate a red component has a thickness of 0.8 μm in total.

Next, the second photoelectric conversion layer 22 serving as a photoelectric conversion layer configured to separate a green component is formed on the first photoelectric conversion layer 21. The second photoelectric conversion layer 22 having a thickness of, for example, 0.7 μm is formed by, for example, MBE. The composition of the second photoelectric conversion layer 22 is i-CuAl$_{0.24}$Ga$_{0.23}$In$_{0.53}$S$_2$.

A barrier is stacked at the interface between the first photoelectric conversion layer 21 and the second photoelectric conversion layer 22. After the growth of i-CuAl$_{0.33}$Ga$_{0.11}$In$_{0.56}$S$_2$, the Ga content is gradually increased while the Al and In contents are gradually reduced in such a manner that i-CuAl$_{0.24}$Ga$_{0.23}$In$_{0.53}$S$_2$ is obtained. Thereby, the spike barrier is stacked. The energy $B_G$ of the barrier is 84 meV or less, which is sufficiently higher than the thermal energy at room temperature and higher than the energy $B_R$ described above.

The third photoelectric conversion layer 23 serving as a photoelectric conversion layer configured to separate a blue component is formed on the second photoelectric conversion layer 22. The third photoelectric conversion layer 23 having a thickness of, for example, 0.3 μm is formed by, for example, MBE. The composition of the third photoelectric conversion layer 23 is p-CuAl$_{0.36}$Ga$_{0.64}$S$_{1.28}$Se$_{0.72}$.

A barrier is stacked at the interface between the third photoelectric conversion layer 23 and the second photoelectric conversion layer 22. After the growth of p-CuAl$_{0.42}$Ga$_{0.58}$S$_{1.36}$Se$_{0.64}$, the Ga content is gradually increased while the Al and S contents are gradually reduced in such a manner that p-CuAl$_{0.36}$Ga$_{0.64}$S$_{1.28}$Se$_{0.72}$ is obtained. Thereby, the spike barrier is stacked. The energy $B_B$ of the barrier is 100 meV or less, which is sufficiently higher than the thermal energy at room temperature and higher than the energies $B_R$ and $B_G$. A ratio of Cu to the group 13 elements of one or less results in p-type conductivity. For example, the p-type conductivity can be achieved by growth at a ratio of 0.98 to 0.99.

With respect to the crystal growth described above, in some cases, it is difficult to grow the solid solution, depending on the conditions. In this case, a pseudo-mixed crystal with a superlattice may be grown. For example, with respect to the photoelectric conversion layer configured to separate a red component, i-CuInS$_2$ layers and i-CuGaS$_2$ layers are alternately stacked, each of the layers having a thickness equal to or smaller than the critical thickness in such a manner that the overall composition of the layers is i-CuGa$_{0.52}$In$_{0.48}$S$_2$.

For example, growth conditions such that the i-CuInS$_2$ layers and the i-CuGaS$_2$ layers are alternately stacked while maintaining lattice matching to Si(100) may be determined by X-ray diffraction or the like. Then stacking may be performed in such a manner that the overall composition is the same as a target composition.

In the crystal growth described above, portions where transistors, readout circuitry, wiring, and so forth are located are covered with a film composed of a material, e.g., silicon oxide (SiO$_2$) or silicon nitride (SiN), in advance. The photoelectric conversion layers are selectively grown on a portion where the silicon substrate 11 is partially exposed.

Then the photoelectric conversion layers are laterally grown on a surface of the film of the material, e.g., silicon oxide ($SiO_2$) or silicon nitride (SiN), so as to cover substantially the entire surface.

Furthermore, a layer composed of indium-tin oxide (ITO), which is an optically transparent material, is formed as the second electrode layer 14 by sputter deposition. Metal wiring is formed on the ITO layer and connected to the ground, thereby preventing charging due to hole accumulation. Pixels are desirably separated by, for example, processing using reactive ion etching (RIE) with a resist mask in such a manner that signals are electrically isolated. In this case, the photoelectric conversion layers are separated as well as the optically transparent electrode. To increase light collection efficiency, furthermore, an on-chip lens (OCL) may be formed for each pixel.

In the solid-state image device 2 (image sensor) produced by the foregoing process, the sequential application of voltages of $V_R$, $V_G$, and $V_B$ in a reverse bias mode results in avalanche multiplication and amplified RGB signals, provided that $V_R > V_G > V_B$. An image obtained by the method exhibits color reproducibility comparable to that of a common on-chip color filter device (OCCF device) and has high sensitivity.

9. Ninth Embodiment
Second Example of Method for Producing Solid-State Image Device A second example of a method for producing a solid-state image device according to a ninth embodiment of the present invention will be described below.

For example, the solid-state image device 3 shown in FIG. 21 can be applied to the photodiodes for use in the CMOS image sensor shown in FIG. 34. The band diagram of the solid-state image device 3 is shown in FIG. 23.

The solid-state image device 3 can be produced on the silicon substrate 11 by, for example, a common CMOS process. Details will be described below with reference to FIG. 21.

A silicon (100) substrate is used as the silicon substrate 11. First, a peripheral circuit including transistors and electrodes is formed in the silicon substrate 11.

Next, the first electrode layer 12 is formed in the silicon substrate 11. The first electrode layer 12 is made of an n-type silicon layer formed by, for example, ion implantation. In the ion implantation, an ion-implanted region is defined by a resist mask. The resist mask is removed after the completion of the ion implantation.

The first photoelectric conversion layer 21 serving as a photoelectric conversion layer configured to separate a red component is formed on the first electrode layer 12 arranged in the silicon substrate 11. The first photoelectric conversion layer 21 composed of an i-$CuGa_{0.52}In_{0.48}S_2$ mixed crystal is formed by, for example, MBE and has a thickness of, for example, 0.8 μm.

The second photoelectric conversion layer 22 serving as a photoelectric conversion layer configured to separate a green component is formed on the first photoelectric conversion layer 21. The second photoelectric conversion layer 22 having a thickness of, for example, 0.7 μm is formed by, for example, MBE. The composition of the second photoelectric conversion layer 22 is i-$CuAl_{0.24}Ga_{0.23}In_{0.53}S_2$.

A barrier is stacked at the interface between the first photoelectric conversion layer 21 and the second photoelectric conversion layer 22. After the growth of an i-$CuAl_{0.33}Ga_{0.11}In_{0.56}S_2$ layer having a thickness of 50 nm, i-$CuAl_{0.24}Ga_{0.23}In_{0.53}S_2$ is grown, thereby affording the barrier. The energy $B_G$ of the barrier is 84 meV or less, which is sufficiently higher than the thermal energy at room temperature and higher than the energy $B_R$ described above.

The third photoelectric conversion layer 23 serving as a photoelectric conversion layer configured to separate a blue component is formed on the second photoelectric conversion layer 22. The third photoelectric conversion layer 23 having a thickness of, for example, 0.3 μm is formed by, for example, MBE. The composition of the third photoelectric conversion layer 23 is p-$CuAl_{0.36}Ga_{0.64}S_{1.28}Se_{0.72}$.

A barrier is stacked at the interface between the third photoelectric conversion layer 23 and the second photoelectric conversion layer 22. After the growth of a p-$CuAl_{0.42}Ga_{0.58}S_{1.36}Se_{0.64}$ layer having a thickness of 50 nm, i-$CuAl_{0.36}Ga_{0.64}S_{1.28}Se_{0.72}$ is grown, thereby affording the barrier. The energy $B_B$ of the barrier is 100 meV or less, which is sufficiently higher than the thermal energy at room temperature and higher than the energies $B_R$ and $B_G$.

To change the type of conductivity of the first photoelectric conversion layer 21, the second photoelectric conversion layer 22, and the third photoelectric conversion layer 23 in the lateral direction, a mask is formed by a lithography technique, and then dopants are selectively ion-implanted. A p-type region can be formed by ion implantation of a group 13 element serving as a p-type dopant. For example, gallium (Ga) is ion-implanted. An n-type region can be formed using a group 12 element serving as an n-type dopant. For example, zinc (Zn) is ion-implanted. Annealing after ion implantation activates the dopants, thereby forming a p-i-n structure.

In the crystal growth described above, portions where transistors, readout circuitry, wiring, and so forth are located are covered with a film composed of a material, e.g., silicon oxide ($SiO_2$) or silicon nitride (SiN), in advance. The photoelectric conversion layers are selectively grown on a portion where the silicon substrate 11 is partially exposed.

Then the photoelectric conversion layers are laterally grown on a surface of the film of the material, e.g., silicon oxide ($SiO_2$) or silicon nitride (SiN) so as to cover substantially the entire surface.

Furthermore, a layer composed of indium-tin oxide (ITO), which is an optically transparent material, is formed as the second electrode layer 14 by sputter deposition. Metal wiring is formed on the ITO layer and connected to the ground, thereby preventing charging due to hole accumulation. Here, a high p-type dopant concentration results in the transfer of holes toward the silicon substrate 11. Thus, the second electrode layer 14 may not be arranged. Pixels are desirably separated by, for example, reactive ion etching (RIE) or the like with a resist mask in such a manner that signals are electrically isolated. In this case, the photoelectric conversion layers are separated as well as the optically transparent electrode. To increase light collection efficiency, furthermore, an on-chip lens (OCL) may be formed for each pixel.

In the solid-state image device 3 (image sensor) produced by the foregoing process, with respect to the first photoelectric conversion layer 21 configured to separate a red component, electrons are transferred to the n-type silicon layer serving as the first electrode layer 12 and then read by the gate MOS transistor 41. Like the second photoelectric conversion layer 22 configured to separate a green component and the third photoelectric conversion layer 23 configured to separate a blue component, electrons accumulated in the layer may be directly read by forming a barrier at the interface between the first photoelectric conversion layer 21 and the silicon substrate 11 and arranging an n-type electrode on the first photoelectric conversion layer 21. An image obtained by the method exhibits color reproducibility comparable to that of a common on-chip color filter device (OCCF device) and has high sensitivity.

10. Tenth Embodiment

Third Example of Method for Producing Solid-State Image Device

A third example of a method for producing a solid-state image device according to a tenth embodiment of the present invention will be described below.

Figure 35:
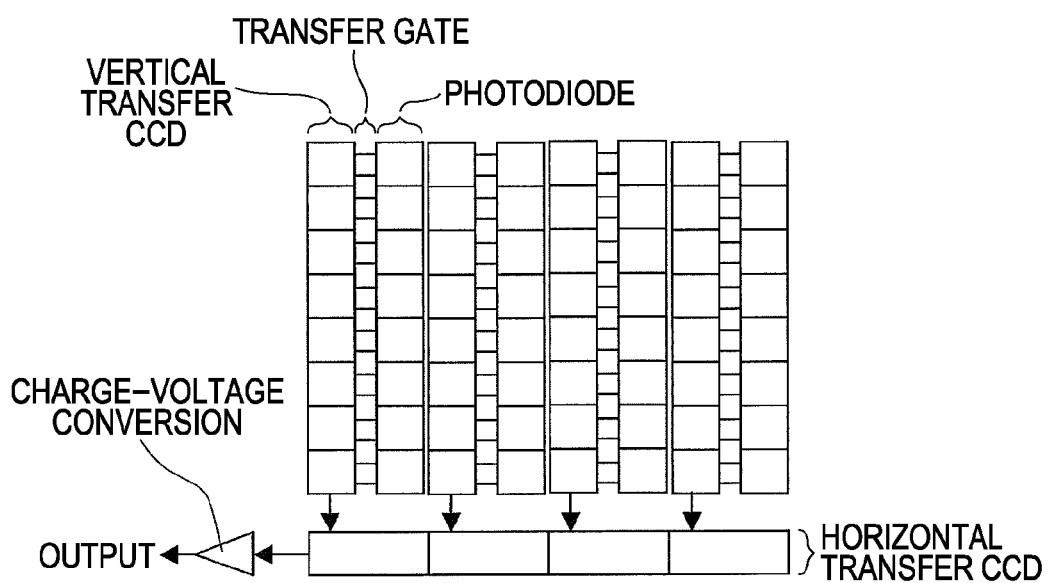
FIG. 35 is a block diagram showing a CCD to which a solid-state image device is applied.

For example, the solid-state image device 2 shown in FIG. 12 can be applied to photodiodes for use in a CCD shown in FIG. 35. The band diagram of the solid-state image device 2 is shown in FIG. 14.

The solid-state image device 2 can be produced on the silicon substrate 11 by, for example, a common CCD process. Details will be described below with reference to FIG. 12.

A silicon (100) substrate is used as the silicon substrate 11. First, peripheral circuits such as transfer gates and vertical resisters are formed in the silicon substrate 11.

Next, the first electrode layer 12 is formed in the silicon substrate 11. The first electrode layer 12 is made of an n-type silicon layer formed by, for example, ion implantation. In the ion implantation, an ion-implanted region is defined by a resist mask. The resist mask is removed after the completion of the ion implantation.

The first photoelectric conversion layer 21 serving as a photoelectric conversion layer configured to separate a red component is formed on the first electrode layer 12 arranged in the silicon substrate 11. The first photoelectric conversion layer 21 composed of an i-CuGa$_{0.52}$In$_{0.48}$S$_2$ mixed crystal is formed by, for example, molecular beam epitaxy (MBE). Here, a barrier is formed at the interface between the first photoelectric conversion layer 21 and the silicon substrate 11, provided that B$_R$>kT=26 meV. For example, after the growth of i-CuAl$_{0.06}$Ga$_{0.51}$In$_{0.49}$S$_2$, the Ga content is gradually increased while the Al and In contents are gradually reduced in such a manner that i-CuGa$_{0.52}$In$_{0.48}$S$_2$ is obtained. Thereby, the spike barrier is stacked. The energy B$_R$ of the barrier is 50 meV or less, which is sufficiently higher than the thermal energy at room temperature. The barrier has a thickness of 100 nm. The photoelectric conversion layer configured to separate a red component has a thickness of 0.8 μm in total.

Next, the second photoelectric conversion layer 22 serving as a photoelectric conversion layer configured to separate a green component is formed on the first photoelectric conversion layer 21. The second photoelectric conversion layer 22 having a thickness of, for example, 0.7 μm is formed by, for example, MBE. The composition of the second photoelectric conversion layer 22 is i-CuAl$_{0.24}$Ga$_{0.23}$In$_{0.53}$S$_2$.

A barrier is stacked at the interface between the first photoelectric conversion layer 21 and the second photoelectric conversion layer 22. After the growth of i-CuAl$_{0.33}$Ga$_{0.11}$In$_{0.56}$S$_2$, the Ga content is gradually increased while the Al and In contents are gradually reduced in such a manner that i-CuAl$_{0.24}$Ga$_{0.23}$In$_{0.53}$S$_2$ is obtained. Thereby, the spike barrier is stacked. The energy B$_G$ of the barrier is 84 meV or less, which is sufficiently higher than the thermal energy at room temperature and higher than the energy B$_R$ described above.

The third photoelectric conversion layer 23 serving as a photoelectric conversion layer configured to separate a blue component is formed on the second photoelectric conversion layer 22. The third photoelectric conversion layer 23 having a thickness of, for example, 0.3 μm is formed by, for example, MBE. The composition of the third photoelectric conversion layer 23 is p-CuAl$_{0.36}$Ga$_{0.64}$S$_{1.28}$Se$_{0.72}$.

A barrier is stacked at the interface between the third photoelectric conversion layer 23 and the second photoelectric conversion layer 22. After the growth of p-CuAl$_{0.42}$Ga$_{0.58}$S$_{1.36}$Se$_{0.64}$, the Ga content is gradually increased while the Al and S contents are gradually reduced in such a manner that p-CuAl$_{0.36}$Ga$_{0.64}$S$_{1.28}$Se$_{0.72}$ is obtained. Thereby, the spike barrier is stacked. The energy B$_B$ of the barrier is 100 meV or less, which is sufficiently higher than the thermal energy at room temperature and higher than the energies B$_R$ and B$_G$. A ratio of Cu to the group 13 elements of one or less results in p-type conductivity. For example, the p-type conductivity can be achieved by growth at a ratio of 0.98 to 0.99.

With respect to the crystal growth described above, in some cases, it is difficult to grow the solid solution, depending on the conditions. In this case, a pseudo-mixed crystal with a superlattice may be grown. For example, with respect to the photoelectric conversion layer configured to separate a red component, i-CuInS$_2$ layers and i-CuGaS$_2$ layers are alternately stacked, each of the layers having a thickness equal to or smaller than the critical thickness in such a manner that the overall composition of the layers is i-CuGa$_{0.52}$In$_{0.48}$S$_2$.

For example, growth conditions such that the i-CuInS$_2$ layers and the i-CuGaS$_2$ layers are alternately stacked while maintaining lattice matching to Si(100) may be determined by X-ray diffraction or the like. Then stacking may be performed in such a manner that the overall composition is the same as a target composition.

In the crystal growth described above, portions where transistors, readout circuitry, wiring, and so forth are located are covered with a film composed of a material, e.g., silicon oxide (SiO$_2$) or silicon nitride (SiN), in advance. The photoelectric conversion layers are selectively grown on a portion where the silicon substrate 11 is partially exposed.

Then the photoelectric conversion layers are laterally grown on a surface of the film of the material, e.g., silicon oxide (SiO$_2$) or silicon nitride (SiN) so as to cover substantially the entire surface.

Furthermore, a layer composed of indium-tin oxide (ITO), which is an optically transparent material, is formed as the second electrode layer 14 by sputter deposition. Metal wiring is formed on the ITO layer and connected to the ground, thereby preventing charging due to hole accumulation. Pixels are desirably separated by, for example, reactive ion etching (RIE) or the like with a resist mask in such a manner that signals are electrically isolated. In this case, the photoelectric conversion layers are separated as well as the optically transparent electrode. To increase light collection efficiency, furthermore, an on-chip lens (OCL) may be formed for each pixel.

In the solid-state image device 2 (image sensor) produced by the foregoing process, the sequential application of voltages of V$_R$, V$_G$, and V$_B$ in a reverse bias mode results in avalanche multiplication and amplified RGB signals, provided that V$_R$>V$_G$>V$_B$.

The resulting signals are transferred to the vertical CCDs with the transfer gates, transferred to horizontal CCDs, and output as in a common CCD. Thereby, the signals can be read. An image obtained by the method exhibits color reproducibility comparable to that of a common on-chip color filter device (OCCF device) and has high sensitivity.

11. Eleventh Embodiment

Fourth Example of Method for Producing Solid-State Image Device

A fourth example of a method for producing a solid-state image device according to an eleventh embodiment of the present invention will be described below.

For example, the solid-state image device 5 shown in FIG. 26 can be applied to the photodiodes for use in the CMOS image sensor shown in FIG. 34. The solid-state image device 5 has a structure in which the photoelectric conversion layers configured to separate RGB components are separately arranged.

The solid-state image device 5 can be produced on the silicon substrate 11 by, for example, a common CMOS process. Details will be described below with reference to FIG. 26.

A silicon (100) substrate is used as the silicon substrate 11. First, a peripheral circuit including transistors and electrodes is formed in the silicon substrate 11.

The first electrode layers 12 are formed in the silicon substrate 11 and located at positions where the photoelectric conversion layers that separate light into RGB components are formed. The first electrode layers 12 are made of an n-type silicon layer formed by, for example, ion implantation of an n-type dopant into the silicon substrate 11.

An oxide film (not shown) composed of silicon oxide ($SiO_2$) is formed on the silicon substrate 11 in such a manner that an area other than a surface of a region where a photoelectric conversion layer configured to separate a red component is formed is covered by a lithography technique and an RIE processing technique. The first photoelectric conversion layer 21 serving as the photoelectric conversion layer configured to separate a red component is formed on the silicon substrate 11 by, for example, MBE. The first photoelectric conversion layer 21 is formed by, for example, the growth of a p-$CuGa_{0.52}In_{0.48}S_2$ mixed crystal. In this case, to selectively growing the crystal only on a surface of a photodiode sensitive to a red component, the crystal is grown in a migration enhanced mode so as to have a thickness of about 0.8 μm. A ratio of Cu to the group 13 elements of one or less results in p-type conductivity. For example, the p-type conductivity can be achieved by growth at a ratio of 0.98.

Then the oxide film is removed.

An oxide film (not shown) composed of silicon oxide ($SiO_2$) is formed on the silicon substrate 11 in such a manner that an area other than a surface of a region where a photoelectric conversion layer configured to separate a green component is formed is covered by a lithography technique and an RIE processing technique. The second photoelectric conversion layer 22 serving as the photoelectric conversion layer configured to separate a green component is formed on the silicon substrate 11 by, for example, MBE. The second photoelectric conversion layer 22 is formed by, for example, the growth of a p-$CuAl_{0.24}Ga_{0.23}In_{0.53}S_2$ mixed crystal. In this case, to selectively growing the crystal only on a surface of a photodiode sensitive to a green component, the crystal is grown in a migration enhanced mode so as to have a thickness of about 0.7 μl. A ratio of Cu to the group 13 elements of one or less results in p-type conductivity. For example, the p-type conductivity can be achieved by growth at a ratio of 0.98.

Then the oxide film is removed.

An oxide film (not shown) composed of silicon oxide ($SiO_2$) is formed on the silicon substrate 11 in such a manner that an area other than a surface of a region where a photoelectric conversion layer configured to separate a blue component is formed is covered by a lithography technique and an RIE processing technique. The third photoelectric conversion layer 23 serving as the photoelectric conversion layer configured to separate a blue component is formed on the silicon substrate 11 by, for example, MBE. The third photoelectric conversion layer 23 is formed by, for example, the growth of a p-$CuAl_{0.36}Ga_{0.64}S_{1.28}Se_{0.72}$ mixed crystal. In this case, to selectively growing the crystal only on a surface of a photodiode sensitive to a blue component, the crystal is grown in a migration enhanced mode so as to have a thickness of about 0.7 μl. A ratio of Cu to the group 13 elements of one or less results in p-type conductivity. For example, the p-type conductivity can be achieved by growth at a ratio of 0.98 to 0.99.

Then the oxide film is removed.

With respect to the crystal growth described above, in some cases, it is difficult to grow the solid solution, depending on the conditions. In this case, a pseudo-mixed crystal with a superlattice may be grown.

For example, with respect to the photoelectric conversion layer configured to separate a red component, p-$CuInS_2$ layers and p-$CuGaS_2$ layers are alternately stacked, each of the layers having a thickness equal to or smaller than the critical thickness in such a manner that the overall composition of the layers is p-$CuGa_{0.52}In_{0.48}S_2$. For example, growth conditions such that the p-$CuInS_2$ layers and the p-$CuGaS_2$ layers are alternately stacked while maintaining lattice matching to Si(100) may be determined by X-ray diffraction or the like. Then stacking may be performed in such a manner that the overall composition is the same as a target composition.

The second electrode layer 14 is arranged on each of the first, second, and third photoelectric conversion layers 21, 22, and 23. Each second electrode layer 14 is formed of an optically transparent electrode as described above. Metal wiring is formed on each second electrode layer 14 and connected to the ground, thereby preventing charging due to hole accumulation.

Pixels are desirably separated by, for example, processing using RIE in such a manner that signals are electrically isolated. In this case, the photoelectric conversion layers are separated as well as the second electrode layers 14. To increase light collection efficiency, furthermore, an on-chip lens (OCL) may be formed for each pixel.

In the image sensor produced by the foregoing process, the application of a reverse bias results in RGB signals r, g, and b (raw data). Then color arithmetic processing described below may be made after demosaicing.

$$R=r-g, G=g-b, \text{ and } B=b$$

where r, g, and b are raw data.

An image obtained by the method exhibits color reproducibility comparable to that of a common on-chip color filter device (OCCF device) and has high sensitivity.

12. Twelfth Embodiment
Fifth Example of Method for Producing Solid-State Image Device A fifth example of a method for producing a solid-state image device according to a twelfth embodiment of the present invention will be described below.

Figure 36:
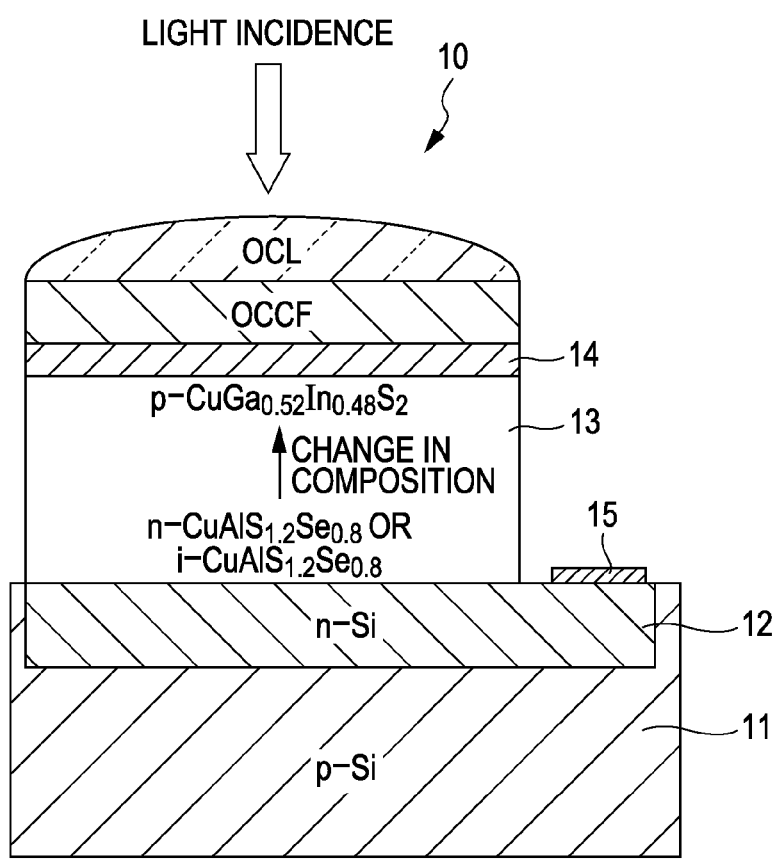
FIG. 36 is a schematic cross-sectional view illustrating a fifth example of a method for producing a solid-state image device according to a twelfth embodiment of the present invention.
Figure 37:
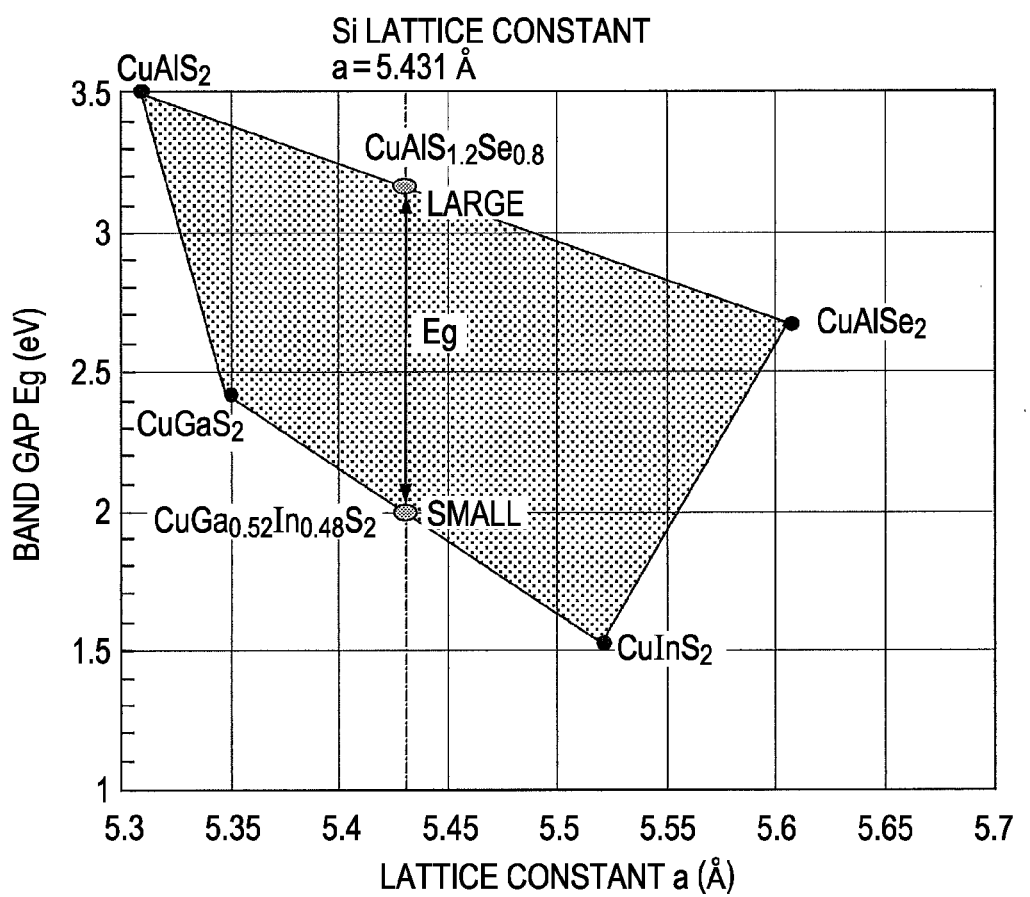
FIG. 37 is a graph showing the relationship between the band gap and the lattice constant of the twelfth embodiment of the present invention.

For example, a solid-state image device 10 shown in FIG. 36 can be applied to the photodiodes for use in the CMOS image sensor shown in FIG. 34. As shown in FIG. 37, in the solid-state image device 10, the composition is changed in the lattice-matched system to the extent that a maximum change in band gap is achieved. This structure results in the maximum avalanche multiplication gain at a low driving voltage, thereby significantly increasing the sensitivity.

A silicon (100) substrate is used as the silicon substrate 11. First, a peripheral circuit including transistors and electrodes is formed in the silicon substrate 11.

The first electrode layer 12 is formed in the silicon substrate 11 and located at a position where the photoelectric conversion layers that separate light into RGB components are formed. The first electrode layer 12 is made of an n-type silicon layer formed by, for example, ion implantation of an n-type dopant into the silicon substrate 11.

The photoelectric conversion layer 13 is formed on the silicon substrate 11. For example, first, an n-$CuAlS_{1.2}Se_{0.8}$ crystal or an i-$CuAlS_{1.2}Se_{0.8}$ crystal is grown by MBE. Next, the Ga and In contents are gradually increased while the Al and Se contents are gradually reduced to achieve p-$CuGa_{0.52}In_{0.48}S_2$. The overall thickness of the layer may be about 2 μm.

Note that the type of conductivity of the layer is changed from n- or i-type conductivity to p-type conductivity during the growth. To achieve the n-type conductivity, the layer may be doped with a group 12 element. For example, a trace amount of zinc (Zn) may be added during the crystal growth.

In the case of i-type conductivity, the layer is not doped.

A ratio of Cu to the group 13 elements of one or less results in p-type conductivity. For example, the p-type conductivity can be achieved by growth at a ratio of 0.98 to 0.99.

In the growth described above, portions where transistors, readout circuitry, wiring, and so forth are located are covered with a material, e.g., silicon oxide ($SiO_2$) or silicon nitride (SiN), in advance. The photoelectric conversion layer is selectively grown on a portion where the Si substrate is partially exposed. Then the photoelectric conversion layer is laterally grown on a surface of the material, e.g., silicon oxide ($SiO_2$) or silicon nitride (SiN) so as to cover substantially the entire surface.

Furthermore, a layer composed of indium-tin oxide (ITO), which is an optically transparent material, is formed as the second electrode layer 14 by sputter deposition. Metal wiring is formed on the ITO layer and connected to the ground, thereby preventing charging due to hole accumulation. An on-chip color filter (OCCF) may be attached to each pixel for color separation. To improve light collection efficiency, an on-chip lens may be provided.

As shown in FIGS. 19 and 20, such a large change in band gap as described above results in a high degree of energy discontinuity on applying a low reverse bias voltage, thereby providing a high avalanche multiplication gain to achieve high sensitivity.

13. Thirteenth Embodiment

Sixth Example of Method for Producing Solid-State Image Device

A sixth example of a method for producing a solid-state image device according to a thirteenth embodiment of the present invention will be described below.

For example, the solid-state image device 7 shown in FIG. 30 can be applied to the photodiodes for use in the CMOS image sensor shown in FIG. 34.

The solid-state image device 7 can be produced on the silicon substrate 11 by, for example, a common CMOS process. Details will be described below with reference to FIG. 30.

A peripheral circuit including transistors and electrodes is formed in a silicon layer (corresponding to the silicon substrate 11 shown in FIG. 30) of an SOI substrate by a CMOS process. Furthermore, a silicon oxide film (not shown) is formed to cover the peripheral circuit including transistors and electrodes.

Next, the silicon layer of the SOI substrate is bonded to a glass substrate. In this case, the circuit side of the substrate is bonded to the glass substrate, and the back side of a silicon (100) layer is exposed to the outside.

The first electrode layer 12 is formed in the silicon layer. The first electrode layer 12 is made of an n-type silicon layer formed by, for example, ion implantation. In the ion implantation, an ion-implanted region is defined by a resist mask. The resist mask is removed after the completion of the ion implantation.

The first photoelectric conversion layer 21 serving as a photoelectric conversion layer configured to separate a red component is formed on the first electrode layer 12 arranged in the silicon layer. The first photoelectric conversion layer 21 composed of an i-$CuGa_{0.52}In_{0.48}S_2$ mixed crystal is formed by, for example, molecular beam epitaxy (MBE).

Here, a barrier is formed at the interface between the first photoelectric conversion layer 21 and the silicon substrate 11, provided that $B_R$>kT=26 meV. For example, after the growth of i-$CuAl_{0.06}Ga_{0.45}In_{0.49}S_2$, the Ga content is gradually increased while the Al and In contents are gradually reduced in such a manner that i-$CuGa_{0.52}In_{0.48}S_2$ is obtained. Thereby, the spike barrier is stacked. The energy $B_R$ of the barrier is 50 meV or less, which is sufficiently higher than the thermal energy at room temperature. The barrier has a thickness of 100 nm. The photoelectric conversion layer configured to separate a red component has a thickness of 0.8 μm in total.

Next, the second photoelectric conversion layer 22 serving as a photoelectric conversion layer configured to separate a green component is formed on the first photoelectric conversion layer 21. The second photoelectric conversion layer 22 having a thickness of, for example, 0.7 μm is formed by, for example, MBE. The composition of the second photoelectric conversion layer 22 is i-$CuAl_{0.24}Ga_{0.23}In_{0.53}S_2$.

A barrier is stacked at the interface between the first photoelectric conversion layer 21 and the second photoelectric conversion layer 22. After the growth of i-$CuAl_{0.33}Ga_{0.11}In_{0.56}S_2$, the Ga content is gradually increased while the Al and In contents are gradually reduced in such a manner that i-$CuAl_{0.24}Ga_{0.23}In_{0.53}S_2$ is obtained. Thereby, the spike barrier is stacked. The energy $B_G$ of the barrier is 84 meV or less, which is sufficiently higher than the thermal energy at room temperature and higher than the energy $B_R$ described above.

The third photoelectric conversion layer 23 serving as a photoelectric conversion layer configured to separate a blue component is formed on the second photoelectric conversion layer 22. The third photoelectric conversion layer 23 having a thickness of, for example, 0.3 μm is formed by, for example, MBE. The composition of the third photoelectric conversion layer 23 is p-$CuAl_{0.36}Ga_{0.64}S_{1.28}Se_{0.72}$.

A barrier is stacked at the interface between the third photoelectric conversion layer 23 and the second photoelectric conversion layer 22. After the growth of p-$CuAl_{0.42}Ga_{0.58}S_{1.36}Se_{0.64}$, the Ga content is gradually increased while the Al and S contents are gradually reduced in such a manner that p-$CuAl_{0.36}Ga_{0.64}S_{1.28}Se_{0.72}$ is obtained. Thereby, the spike barrier is stacked. The energy $B_B$ of the barrier is 100 meV or less, which is sufficiently higher than the thermal energy at room temperature and higher than the energies $B_R$ and $B_G$. A ratio of Cu to the group 13 elements of one or less results in p-type conductivity. For example, the p-type conductivity can be achieved by growth at a ratio of 0.98 to 0.99.

With respect to the crystal growth described above, in some cases, it is difficult to grow the solid solution, depending on the conditions. In this case, a pseudo-mixed crystal with a superlattice may be grown.

For example, with respect to the photoelectric conversion layer configured to separate a red component, i-$CuInS_2$ layers and i-$CuGaS_2$ layers are alternately stacked, each of the layers having a thickness equal to or smaller than the critical thickness in such a manner that the overall composition of the layers is i-$CuGa_{0.52}In_{0.48}S_2$.

For example, growth conditions such that the i-$CuInS_2$ layers and the i-$CuGaS_2$ layers are alternately stacked while maintaining lattice matching to Si(100) may be determined by X-ray diffraction or the like. Then stacking may be performed in such a manner that the overall composition is the same as a target composition.

In the crystal growth described above, portions where transistors, readout circuitry, wiring, and so forth are located are covered with a film composed of a material, e.g., silicon oxide ($SiO_2$) or silicon nitride (SiN), in advance. The photoelectric conversion layers are selectively grown on a portion where the silicon substrate 11 is partially exposed.

Then the photoelectric conversion layers are laterally grown on a surface of the film of the material, e.g., silicon oxide ($SiO_2$) or silicon nitride (SiN), so as to cover substantially the entire surface.

Furthermore, a layer composed of indium-tin oxide (ITO), which is an optically transparent material, is formed as the second electrode layer 14 by sputter deposition. Metal wiring is formed on the ITO layer and connected to the ground, thereby preventing charging due to hole accumulation. Pixels are desirably separated by, for example, processing using reactive ion etching (RIE) with a resist mask in such a manner that signals are electrically isolated. In this case, the photoelectric conversion layers are separated as well as the optically transparent electrode. To increase light collection efficiency, furthermore, an on-chip lens (OCL) may be formed for each pixel.

In the solid-state image device 7 (image sensor) produced by the foregoing process, the sequential application of voltages of $V_R$, $V_G$, and $V_B$ in a reverse bias mode results in avalanche multiplication and amplified RGB signals, provided that $V_R > V_G > V_B$. An image obtained by the method exhibits color reproducibility comparable to that of a common on-chip color filter device (OCCF device) and has high sensitivity.

14. Fourteenth Embodiment
Tenth Example of Structure of Solid-State Image Device As has been described above, all of the foregoing solid-state image devices have the structures in which electrons are read as signals.

In fact, a structure in which holes are read as signals may be used. An example of the structure will be described below.

A structure of a solid-state image device, corresponding to the solid-state image device shown in FIG. 12, configured to read holes will be described below with reference to a schematic cross-sectional view of FIG. 38.

Figure 38:
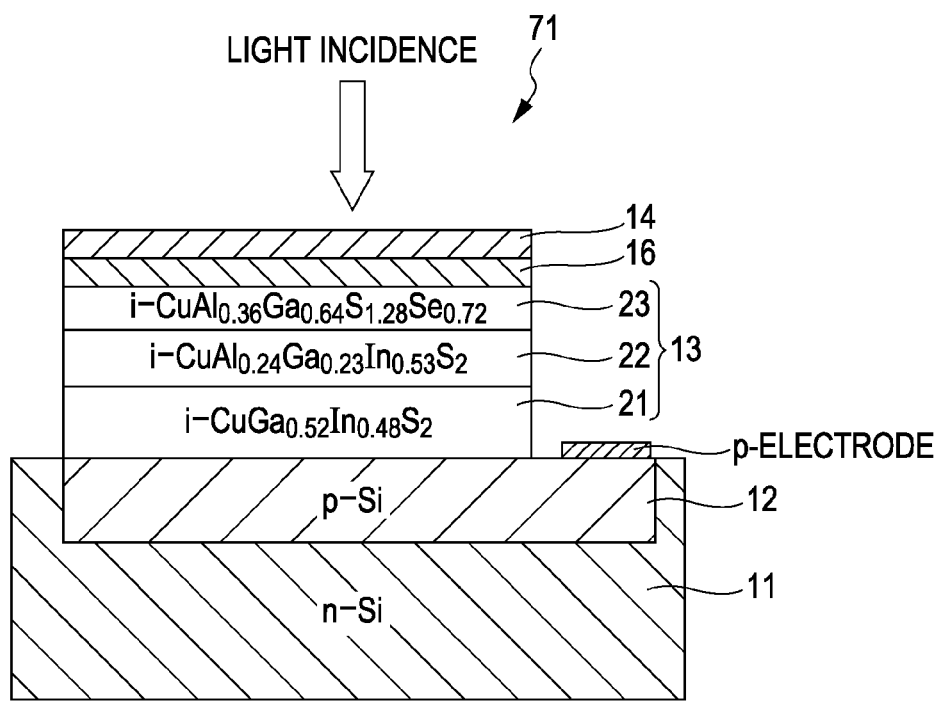
FIG. 38 is a schematic cross-sectional view of an example of a solid-state image device configured to read holes.

As shown in FIG. 38, the silicon substrate 11 is an n-type silicon substrate. The first electrode layer 12 is formed in the silicon substrate 11. The first electrode layer 12 is made of, for example, a p-type silicon layer formed in the silicon substrate 11. The photoelectric conversion layer 13 composed of lattice-matched CuAlGaInSSe-based mixed crystals is arranged on the first electrode layer 12. The photoelectric conversion layer 13 includes the first photoelectric conversion layer 21 composed of i-$CuGa_{0.52}In_{0.48}S_2$, the second photoelectric conversion layer 22 composed of i-$CuAl_{0.24}Ga_{0.23}In_{0.53}S_2$, and the third photoelectric conversion layer 23 composed of i-$CuAl_{0.36}Ga_{0.64}S_{1.28}Se_{0.72}$ stacked, in that order, on the first electrode layer 12. The optically transparent second electrode layer 14 is stacked on the photoelectric conversion layer 13 with an intermediate layer 16 composed of cadmium sulfide (CdS) provided therebetween. The second electrode layer 14 is composed of an n-type optically transparent electrode material such as zinc oxide. The reason for the arrangement of the intermediate layer 16 composed of cadmium sulfide is that a reduction in potential barrier to the transfer of electrons toward the optically transparent electrode reduces the driving voltage.

The chalcopyrite layers of the photoelectric conversion layer have i-type conductivity. Alternatively, lightly-doped p-type layers may be used.

In this solid-state image device 71, spike barriers are formed on the wide-gap side of portions near interfaces among the first, second, and third photoelectric conversion layers 21, 22, and 23 by continuous composition control, provided that $B_B$ $B_G$ $B_R$>kT (=26 meV) in a valence band. Thereby, holes can be confined and accumulated for each of RGB, wherein k represents the Boltzmann constant, and kT corresponds to the thermal energy at room temperature. In this case, the polarity of applied voltage is reversed compared with the structure in which electrons are read. That is, sequential application of negative voltages of $V_R$, $V_G$, and $V_B$, in that order, results in the readout of an R signal, a G signal, and a B signal, provided that $V_B < V_G < V_R \le -kT$).

A structure of a solid-state image device, corresponding to the solid-state image device shown in FIG. 21, configured to read holes will be described below with reference to a schematic cross-sectional view of FIG. 39.

Figure 39:
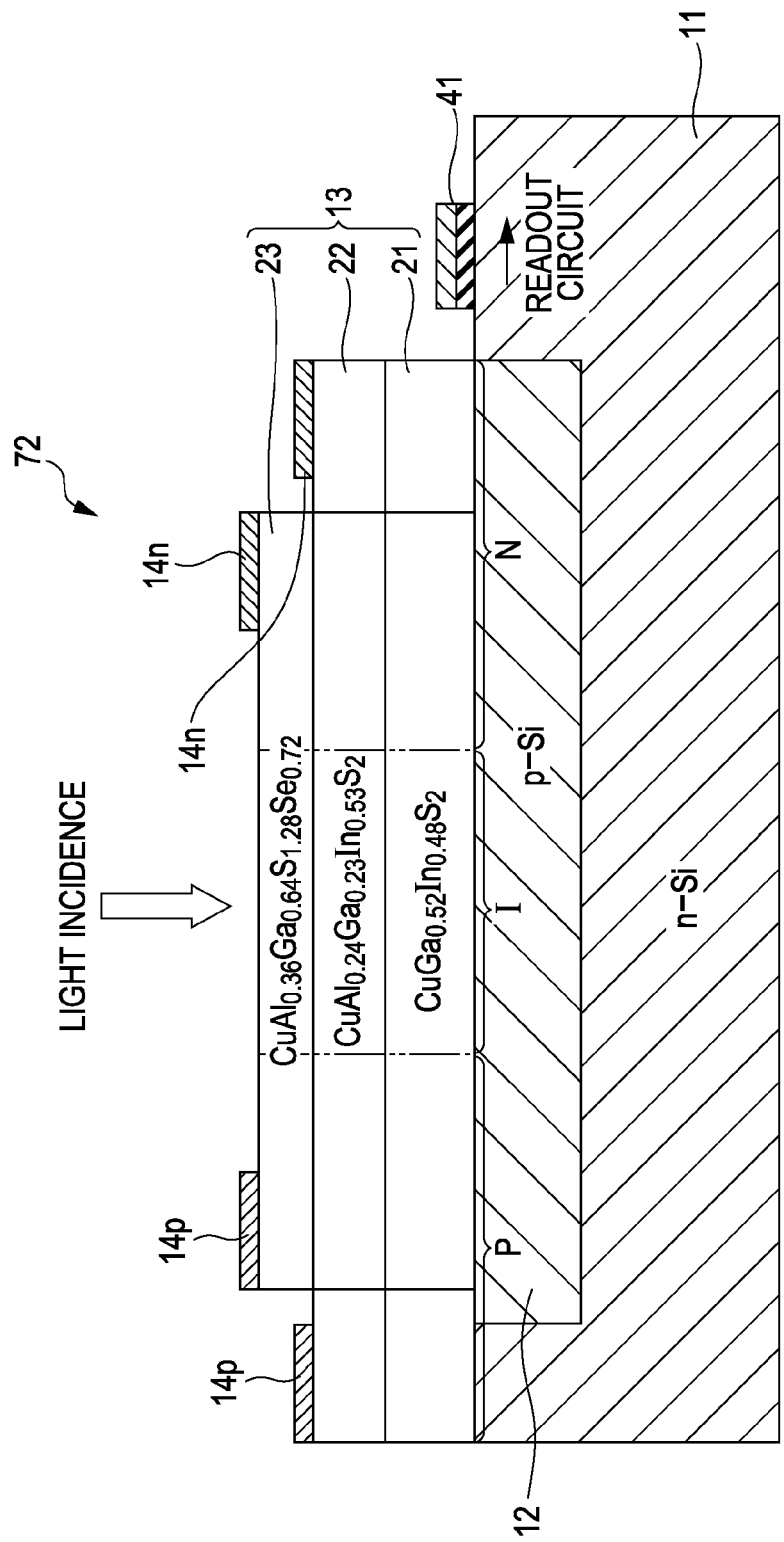
FIG. 39 is a schematic cross-sectional view of an example of a solid-state image device configured to read holes.

As shown in FIG. 39, the silicon substrate 11 is an n-type silicon substrate. The first electrode layer 12 is formed in the silicon substrate 11. The first electrode layer 12 is made of, for example, a p-type silicon layer formed in the silicon substrate 11. The photoelectric conversion layer 13 composed of lattice-matched CuAlGaInSSe-based mixed crystals is arranged on the first electrode layer 12. The photoelectric conversion layer 13 includes the first photoelectric conversion layer 21 composed of $CuGa_{0.52}In_{0.48}S_2$, the second photoelectric conversion layer 22 composed of $CuAl_{0.24}Ga_{0.23}In_{0.53}S_2$, and the third photoelectric conversion layer 23 composed of $CuAl_{0.36}Ga_{0.64}S_{1.28}Se_{0.72}$ stacked, in that order, on the first electrode layer 12. Each of the first photoelectric conversion layer 21, the second photoelectric conversion layer 22, and the third photoelectric conversion layer 23 has a central portion of an i-conductivity type, one end portion of a p-conductivity type, and the other end portion of an n-conductivity type. Thus, each layer has a p-i-n structure.

Furthermore, the p-type electrodes 14*p* (second electrode layers) are arranged on the p-type end portion of the second photoelectric conversion layer 22 and the p-type end portion of the third photoelectric conversion layer 23 of the photoelectric conversion layer 13. Moreover, the n-type electrodes 14*n* (second electrode layers) are arranged on the n-type end portion of the second photoelectric conversion layer 22 and the n-type end portion of the third photoelectric conversion layer 23 of the photoelectric conversion layer 13. The p-type electrodes 14*p* may not be arranged.

The readout circuit (not shown) configured to read a signal with the gate MOS transistor 41 is formed in the silicon substrate 11.

A solid-state image device 72 has the structure described above.

A structure of a solid-state image device, corresponding to the solid-state image device shown in FIG. 26, configured to read holes will be described below with reference to a schematic cross-sectional view of FIG. 40.

Figure 40:
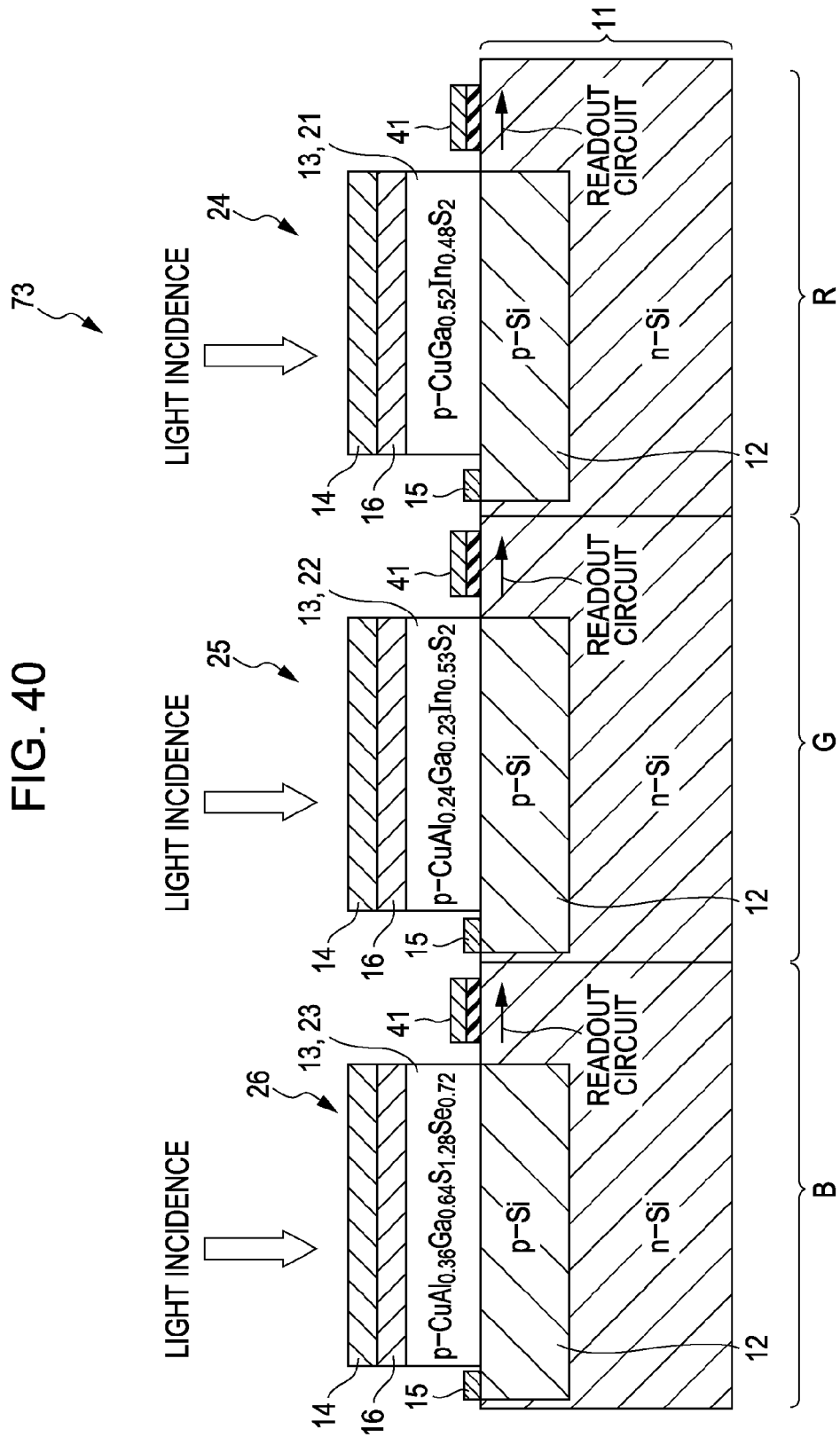
FIG. 40 is a schematic cross-sectional view of an example of a solid-state image device configured to read holes.

As shown in FIG. 40, the silicon substrate 11 is an n-type silicon substrate. The first electrode layers 12 are formed in the silicon substrate 11 and located at positions where the photoelectric conversion layers that separate light into RGB components are formed. Each of the first electrode layers 12 is made of, for example, a p-type silicon layer formed in the silicon substrate 11.

The first photoelectric conversion layer 21 composed of a lattice-matched CuAlGaInSSe-based mixed crystal is arranged on the first electrode layer 12 located at a portion where a red component is separated. The first photoelectric conversion layer 21 is composed of, for example, p-CuGa$_{0.52}$In$_{0.48}$S$_2$.

The second photoelectric conversion layer 22 composed of a lattice-matched CuAlGaInSSe-based mixed crystal is arranged on the first electrode layer 12 located at a portion where a green component is separated. The second photoelectric conversion layer 22 is composed of, for example, p-type CuAl$_{0.24}$Ga$_{0.23}$In$_{0.53}$S$_2$.

The third photoelectric conversion layer 23 composed of a lattice-matched CuAlGaInSSe-based mixed crystal is arranged on the first electrode layer 12 located at a portion where a blue component is separated. The third photoelectric conversion layer 23 is composed of, for example, p-CuAl$_{0.36}$Ga$_{0.64}$S$_{1.28}$Se$_{0.72}$.

The first photoelectric conversion layer 21 has a thickness of 0.8 μm. The second photoelectric conversion layer 22 has a thickness of 0.7 μm. The third photoelectric conversion layer 23 has a thickness of 0.7 μm.

The optically transparent second electrode layers 14 are stacked on the first, second, and third photoelectric conversion layers 21, 22, and 23 with the intermediate layers 16 composed of cadmium sulfide (CdS). Each second electrode layer 14 is composed of an n-type optically transparent electrode material such as zinc oxide.

A first photoelectric conversion portion 24 including the first electrode layer 12, the first photoelectric conversion layer 21, and the second electrode layer 14 stacked on the silicon substrate 11 is formed. Similarly, a second photoelectric conversion portion 25 including the first electrode layer 12, the second photoelectric conversion layer 22, and the second electrode layer 14 stacked on the silicon substrate 11 is formed. A third photoelectric conversion portion 26 including the first electrode layer 12, the third photoelectric conversion layer 23, and the second electrode layer 14 stacked on the silicon substrate 11 is formed. That is, the first to third photoelectric conversion portions 24 to 26 are laterally arranged on the silicon substrate 11.

A solid-state image device 73 has the structure described above.

A structure of a solid-state image device, corresponding to the solid-state image device shown in FIG. 30, configured to read holes will be described below with reference to a schematic cross-sectional view of FIG. 41.

Figure 41:
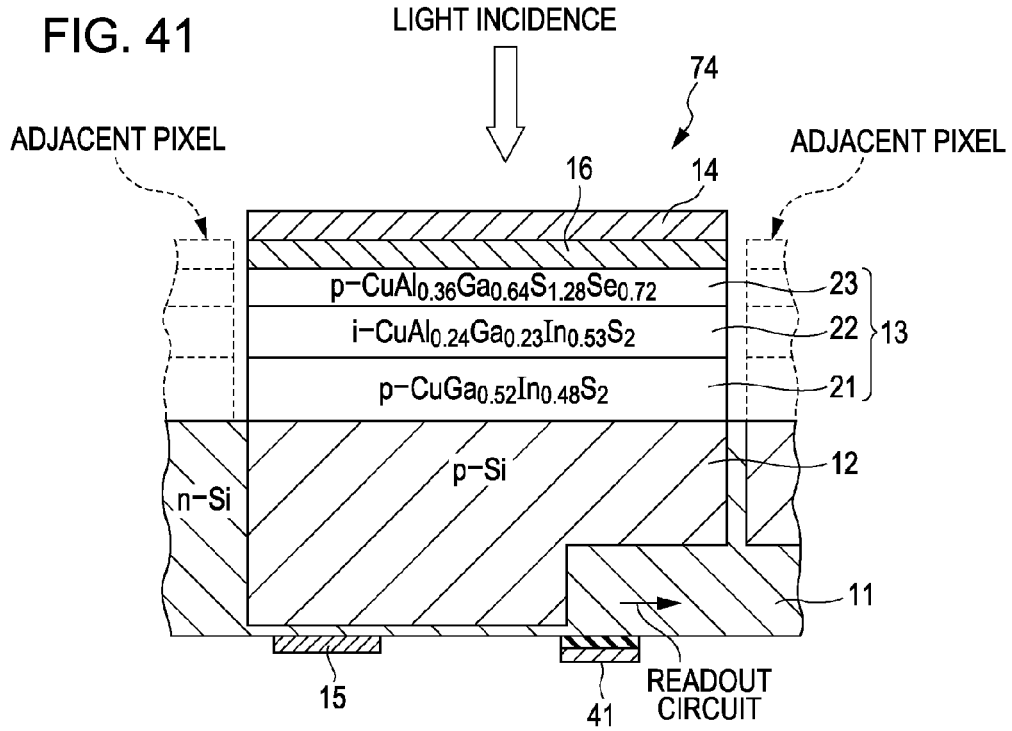
FIG. 41 is a schematic cross-sectional view of an example of a solid-state image device configured to read holes.

As shown in FIG. 41, the silicon substrate 11 is an n-type silicon substrate. The first electrode layer 12 is formed in the silicon substrate 11 and extends to the vicinity of the back side of the silicon substrate 11. The first electrode layer 12 is made of, for example, a p-type silicon layer formed in the silicon substrate 11. The photoelectric conversion layer 13 composed of lattice-matched CuAlGaInSSe-based mixed crystals is arranged on the first electrode layer 12. The photoelectric conversion layer 13 includes the first photoelectric conversion layer 21 composed of p-CuGa$_{0.52}$In$_{0.48}$S$_2$, the second photoelectric conversion layer 22 composed of i-CuAl$_{0.24}$Ga$_{0.23}$In$_{0.53}$S$_2$, and the third photoelectric conversion layer 23 composed of p-CuAl$_{0.36}$Ga$_{0.64}$S$_{1.28}$Se$_{0.72}$ stacked on the first electrode layer 12.

Thus, the photoelectric conversion layer 13 has a p-i-p structure as a whole.

The photoelectric conversion layer 13 may be composed of the materials within the composition ranges described above. Furthermore, the foregoing CuGaInZnSSe-based mixed crystals may be used.

The optically transparent second electrode layer 14 is stacked on the photoelectric conversion layer 13 with the intermediate layer 16 composed of cadmium sulfide (CdS) provided therebetween. The second electrode layer 14 is composed of an n-type optically transparent electrode material such as zinc oxide.

Furthermore, the readout electrode 15 that reads a signal from the first electrode layer 12 is formed on the front side of the silicon substrate 11 (in the figure, the lower side of the silicon substrate 11). The readout circuit (not shown) that reads a signal with the gate MOS transistor 41 is formed on the front side of the silicon substrate 11.

A solid-state image device 74 has the structure described above.

A structure of a solid-state image device, corresponding to the solid-state image device shown in FIG. 32, configured to read holes will be described below with reference to a schematic cross-sectional view of FIG. 42.

Figure 42:
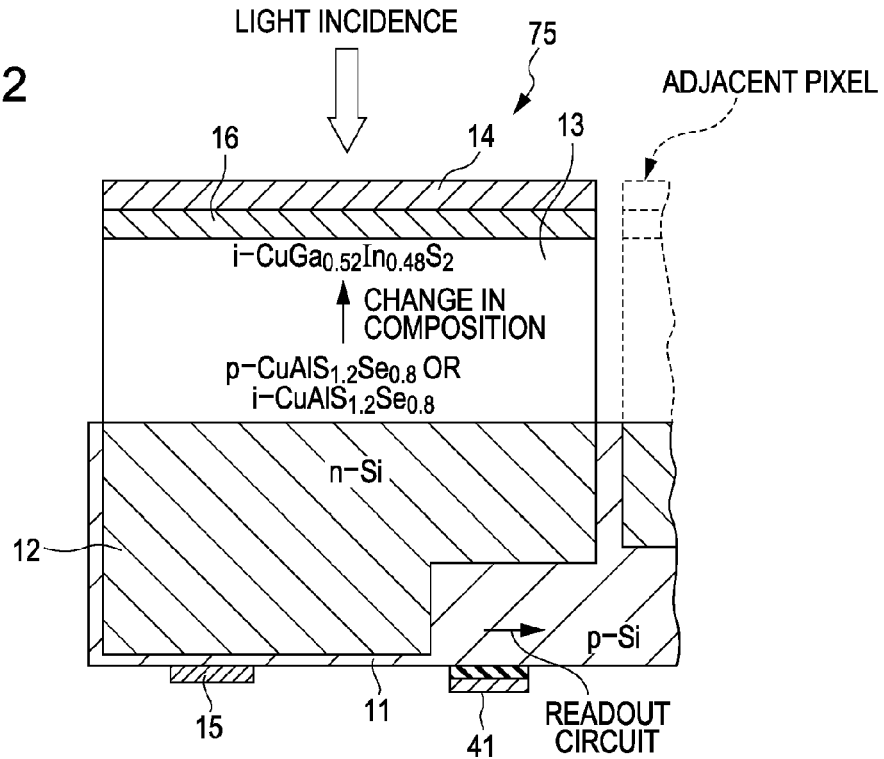
FIG. 42 is a schematic cross-sectional view of an example of a solid-state image device configured to read holes.

Referring to FIG. 42, in the solid-state image device 8 shown in FIG. 32, the photoelectric conversion layer 13 in which the composition is changed from p-CuAlS$_{1.2}$Se$_{0.8}$ or i-CuAlS$_{1.2}$Se$_{0.8}$ to i-CuGa$_{0.52}$In$_{0.48}$S$_2$ from the silicon substrate 11 side may be used. In the solid-state image device 75, a higher avalanche multiplication gain can be achieved at a low driving voltage.

In the solid-state image devices configured to read holes, the polarity of all applied voltages for reading signals is reversed with respect to the polarity in the solid-state image devices configured to read electrons.

A specific production method and raw materials of the photoelectric conversion layer 13 will be described below.

Figure 43:
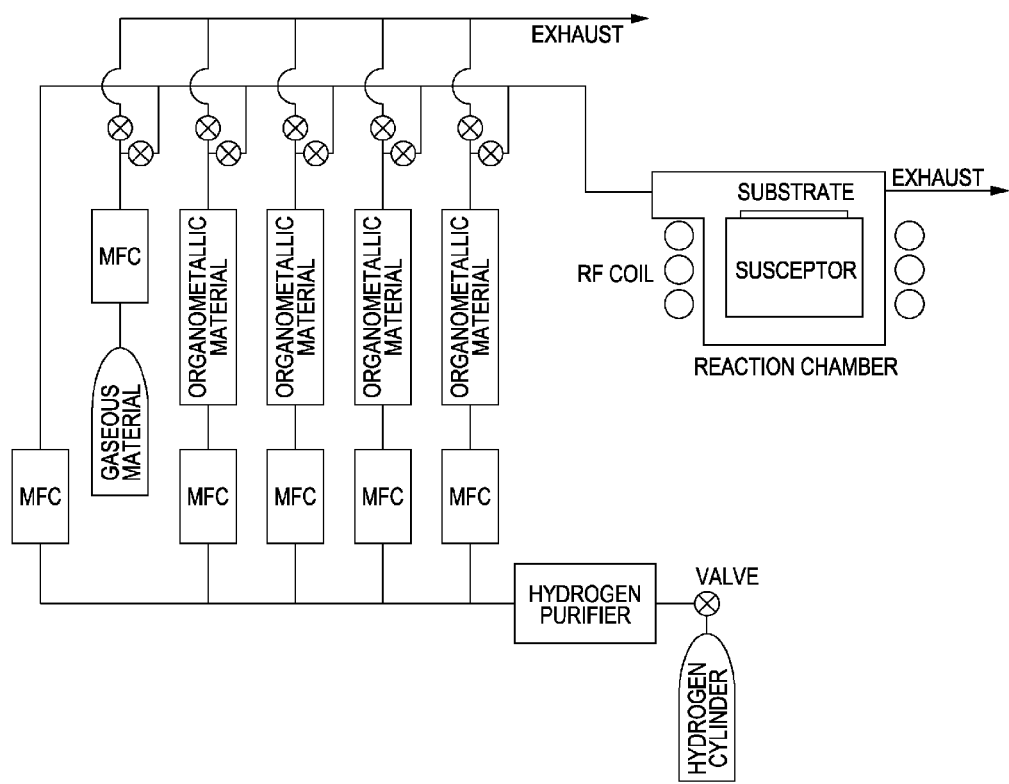
FIG. 43 is a block diagram showing an example of an MOCVD apparatus.

In a method for producing a crystal by metal organic chemical vapor deposition (MOCVD), crystal growth is performed with, for example, an MOCVD apparatus as shown in FIG. 43.

Organometallic materials described below are used as source materials. An example of an organometallic material of copper is copper acetylacetonate (Cu(C$_5$H$_7$O$_2$)$_2$). An example of an organometallic material of gallium (Ga) is trimethylgallium (Ga(CH$_2$)$_2$). An example of an organometallic material of aluminum (Al) is trimethylaluminum (Al(CH$_3$)$_3$). An example of an organometallic material of indium (In) is trimethylindium (In(CH$_2$)$_2$). An example of an organometallic material of selenium (Se) is dimethyl selenide (Se(CH$_3$)$_2$). An example of an organometallic material of sulfur (S) is dimethyl sulfide (S(CH$_3$)$_2$). An example of an organometallic material of zinc (Zn) is dimethylzinc (Zn(CH$_3$)$_2$).

The source materials are not limited to the organometallic materials. Any organometallic material can be used as a source material used for crystal growth by MOCVD.

Examples of the source material that can be used include triethylgallium (Ga(C$_2$H$_5$)$_3$), trimethylaluminum (Al(C$_2$H$_5$)$_3$), triethylindium (In(C$_2$H$_5$)$_3$), diethyl selenide (Se(C$_2$H$_5$), diethyl sulfide (S(C$_2$H$_5$)$_2$), and diethylzinc (Zn(C$_2$H$_5$)$_2$).

Furthermore, gaseous materials may be used as well as the organometallic materials. For example, hydrogen selenide (H$_2$Se) as a Se source and hydrogen sulfide (H$_2$S) as a S source may be used.

In the MOCVD apparatus as shown in FIG. 43, each of the organometallic materials is subjected to bubbling with hydrogen, so that hydrogen is saturated with the corresponding organometallic material vapor. Thus, molecules of each material are transported to a reaction chamber. The hydrogen flow rates for materials are controlled by mass flow controllers (MFCs) to determine the molar amounts of the materials fed per unit time. Crystal growth is performed by thermally decomposing the organometallic materials on a silicon substrate to form a crystal. At that time, it is possible to control the composition of the crystal using the correlation between the molar ratio of the materials transported and the crystal composition.

The silicon substrate is located on a carbon susceptor. The susceptor is heated a high-frequency heater (RF coil) and provided with a thermocouple and a temperature-control system in order to control the temperature of the substrate. A typical substrate temperature is in the range of 400° C. to 1000° C., at which the materials can be thermally decomposed. To reduce the substrate temperature, for example, the thermal decomposition of the materials may be promoted by irradiating a surface of the substrate with light emitted from a mercury lamp or the like.

For example, copper acetylacetonate ($Cu(C_5H_7O_2)_2$) and trimethylindium ($In(CH_3)_3$) are solid materials at room temperature. Such a material may be heated into a liquid phase. Alternatively, such a material may be heated to increase the vapor pressure while remaining solid and then used.

Next, a method for producing a crystal by molecular beam epitaxy (MBE) will be described.

Figure 44:
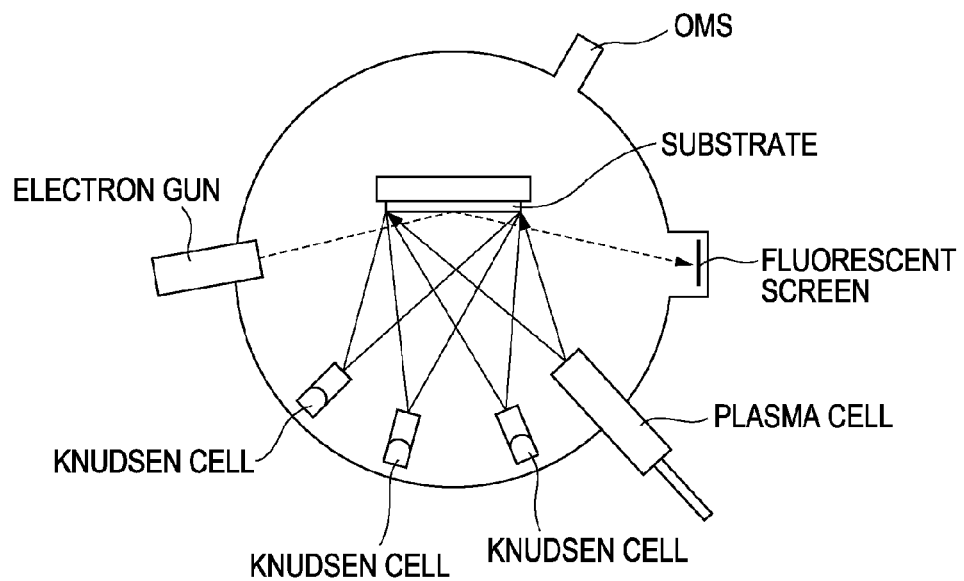
FIG. 44 is a schematic diagram showing an example of an MBE apparatus.

In MBE growth, crystal growth is performed with, for example, an MBE apparatus as shown in FIG. 44.

Elemental copper, gallium (Ga), aluminum (Al), indium (In), selenium (Se), and sulfur (S) are placed in individual Knudsen cells. These are heated to appropriate temperatures to irradiate a substrate with beams of molecules, growing a crystal. In the case of using a substance such as sulfur (S) having a particularly high vapor pressure, the molecular flux of the substance can be unstable. In this case, the molecular flux may be stabilized with a valved cracker cell. Like gas-source MBE, some of the source materials may be gaseous sources. That is, hydrogen selenide ($H_2Se$) as a Se source and hydrogen sulfide ($H_2S$) as a S source may be used.

15. Fifteenth Embodiment

Example of Structure of Image Pickup Apparatus

An image pickup apparatus according to an embodiment of the present invention will be described below with reference to a block diagram of FIG. 45. The image pickup apparatus includes the solid-state image device according to an embodiment of the present invention.

Figure 45:
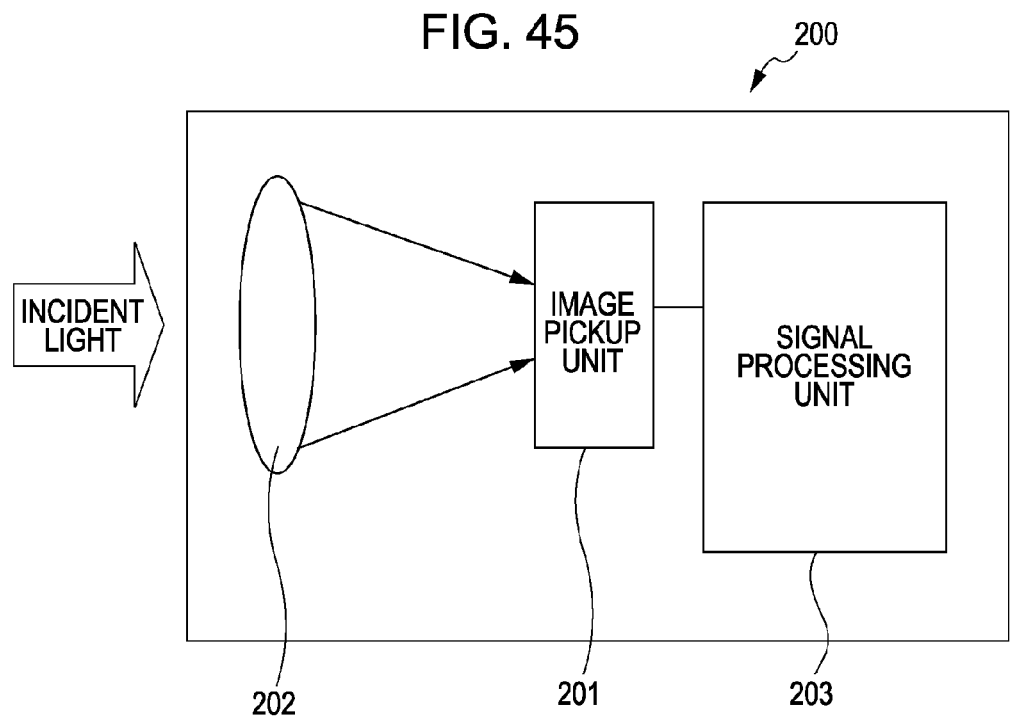
FIG. 45 is a block diagram showing a image pickup apparatus according to an embodiment of the present invention.
Figure 46:
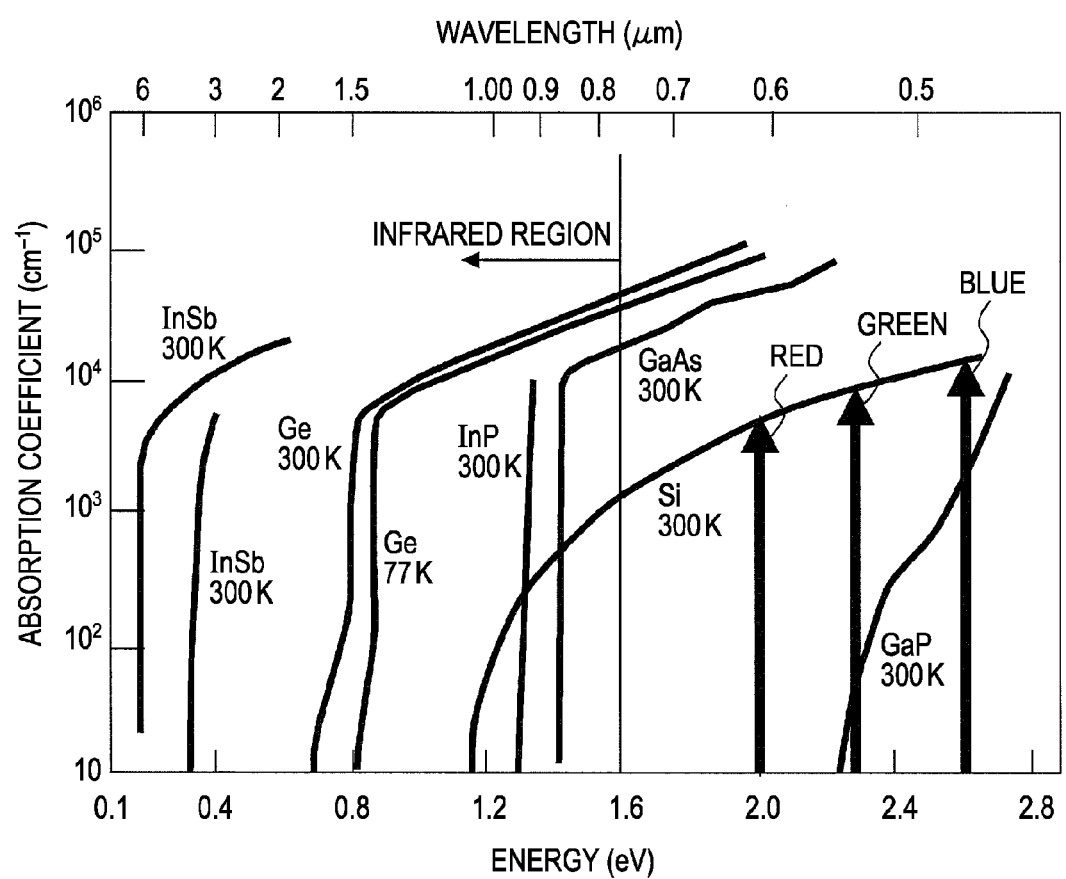
FIG. 46 shows optical absorption spectra of semiconductor materials.

As shown in FIG. 45, an image pickup apparatus 200 includes an image pickup unit 201 provided with a solid-state image device (not shown). A light-condensing optical system 202 configured to form an image is disposed on the incident light side of the image pickup unit 201. The image pickup unit 201 is connected to a signal processing unit 203 including a driving circuit configured to drive the image pickup unit 201 and a signal processing circuit in which a signal obtained by subjecting light to photoelectric conversion by the solid-state image device is processed to form an image. An image signal processed by the signal processing unit 203 can be stored in an image storage unit (not shown). Any one of the solid-state image devices 1 to 10 and 71 to 75 described in the foregoing embodiments can be used as the solid-state image device of the image pickup apparatus 200.

The image pickup apparatus 200 according to an embodiment of the present invention includes any one of the solid-state image devices 1 to 10 and 71 to 75 according to the embodiments of the present invention. Thereby, the occurrence of dark current is suppressed, thus preventing a reduction in image quality due to bright defects. Furthermore, the solid-state image device has high sensitivity and captures an image with high sensitivity. Hence, capturing an image with high sensitivity and suppressing the reduction in image quality advantageously make it possible to capture an image with high quality even in a dark environment, e.g., in the nighttime.

The image pickup apparatus 200 according to an embodiment of the present invention is not limited to the configuration described above but can be applied to any configuration of an image pickup apparatus including a solid-state image device.

Each of the solid-state image devices 1 to 10 and 71 to 75 may be formed as one chip or may be in the form of a module which has the function of capturing an image and in which an image pickup unit and a signal processing unit or an optical system are packaged.

The image pickup apparatus 200 refers to, for example, a camera or a portable device having the function of capturing an image. The term "image pickup" includes not only normal image capture with a camera but also fingerprint detection, in a broad sense.

The present application contains subject matter related to that disclosed in Japanese Priority Patent Application JP 2009-010787 filed in the Japan Patent Office on Jan. 21, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image device comprising:
   a silicon substrate; and
   a photoelectric conversion layer directly on the silicon substrate and lattice-matched to the silicon substrate,
   wherein,
      the photoelectric conversion layer comprises a first photoelectric conversion layer, a second photoelectric conversion layer, and a third photo electric conversion layer,
      the first photoelectric conversion layer comprises $CuAl_xGa_yIn_zS_2$, wherein $0 \leq x \leq 0.12$, $0.38 \leq y \leq 0.52$, $0.48 \leq z \leq 0.50$ and $x+y+z=1$,
      the second photoelectric conversion layer comprises $CuAl_xGa_yIn_zS_2$, wherein $0.06 \leq x \leq 0.41$, $0.01 \leq y \leq 0.45$, $0.49 \leq z \leq 0.58$ and $x+y+z=1$, and
      the third photoelectric conversion layer comprises $CuAl_xGa_yS_uSe_v$, wherein $0.31 \leq x \leq 0.52$, $0.48 \leq y \leq 0.69$, $1.33 \leq u \leq 1.38$, $0.62 \leq v \leq 0.67$, and either $x+y+u+v=3$ or $x+y=1$ and $u+v=2$.

2. The solid-state image device according to claim 1, wherein the photoelectric conversion layer is a superlattice with layers each having a thickness equal to or smaller than a critical thickness.

3. The solid-state image device according to claim 1, wherein:
   the first photoelectric conversion layer is configured to separate red light and having a band gap of $2.00\ eV \pm 0.1\ eV$;
   the second photoelectric conversion layer is configured to separate green light and having a band gap of $2.20\ eV \pm 0.15\ eV$; and
   the third photoelectric conversion layer is configured to separate blue light and having a band gap of $2.51\ eV \pm 0.2\ eV$.

4. The solid-state image device according to claim 3, wherein the first photoelectric conversion layer, the second photoelectric conversion layer, and the third photoelectric conversion layer are stacked in that order from the silicon substrate side.

5. The solid-state image device according to claim 4, wherein barriers to carriers are formed on the wide-gap side of interfaces between the first photoelectric conversion layer and the second photoelectric conversion layer and between the second photoelectric conversion layer and the third photoelectric conversion layer, or a barrier to carriers is formed on the wide-gap side of the interface between the silicon substrate and the first photoelectric conversion layer.

6. The solid-state image device according to claim 1 wherein the photoelectric conversion layer has a stepwise changing band gap and an energy discontinuity, and an avalanche multiplication is caused by applying a reverse-bias voltage.

7. The solid-state image device according to claim 5, wherein:
reverse-bias voltages of $V_R$, $V_G$, and $V_B$ are sequentially applied, in that order, to the photoelectric conversion layer to sequentially read an R signal, a G signal, and a B signal,
$V_R$ represents a reverse-bias voltage for reading an R signal corresponding to red light,
$V_G$ represents a reverse-bias voltage for reading a G signal corresponding to green light, and
$V_B$ represents a reverse-bias voltage for reading a B signal corresponding to blue light, provided that $V_B > V_G > V_R$.

8. The solid-state image device according to claim 7, wherein:
the photoelectric conversion layer has a potential discontinuity,
the first photoelectric conversion layer, the second photoelectric conversion layer, and the third photoelectric conversion layer separate light into red, green, and blue components in the depth direction,
photoelectrons are accumulated by the barriers to carriers,
the reverse-bias voltages of $V_R$, $V_G$, and $V_B$ are applied, in that order, in three steps to read the R signal, the G signal, and the B signal, and
avalanche multiplication is caused by the potential discontinuity.

9. The solid-state image device according to any one of claims 1 to 8, further comprising:
a support substrate;
a wiring portion on the support substrate;
a pixel on the wiring portion, the pixel including a photoelectric conversion portion configured to photoelectrically convert incident light into an electrical signal; and
a silicon layer including a peripheral circuit arranged around the pixel,
wherein,
the photoelectric conversion portion is on the uppermost surface on the incident light side of the silicon layer,
the silicon substrate includes a first electrode layer therein, and
a second electrode layer is on the photoelectric conversion layer.

10. The solid-state image device according to claim 3 or 4, further comprising:
a PIN structure or a PN structure extending in the horizontal direction of the silicon substrate; and
a barrier formed on the wide-gap side of a portion near the interface between the second photoelectric conversion layer and the third photoelectric conversion layer, between the first photoelectric conversion layer and the second photoelectric conversion layer, or between the first photoelectric conversion layer and the silicon substrate, the barrier having an energy exceeding 26 meV.

11. The solid-state image device according to any one of claims 1 to 3, further comprising:
a first photoelectric conversion portion including a photoelectric conversion layer;
a second photoelectric conversion portion including a photoelectric conversion layer; and
a third photoelectric conversion portion including a photoelectric conversion layer,
the first to third photoelectric conversion portions being arranged in the planar direction of the silicon substrate,
wherein,
the photoelectric conversion layer in the first photoelectric conversion portion is a first photoelectric conversion layer configured to separate red light,
the photoelectric conversion layer in the second photoelectric conversion portion is a second photoelectric conversion layer configured to separate green light, and
the photoelectric conversion layer in the third photoelectric conversion portion is a third photoelectric conversion layer configured to separate blue light.

12. The solid-state image device according to claim 1, wherein (a) the first photoelectric conversion layer comprises $CuGa_{0.52}In_{0.48}S_2$, (b) the second photoelectric conversion layer comprises $CuAl_{0.24}Ga_{0.23}In_{0.53}S_2$, and (c) the third photoelectric conversion layer comprises $CuAl_{0.36}Ga_{0.64}S_{1.28}Se_{0.72}$.

13. The solid-state image device according to any one of claims 3 to 5, 7, 8, and 11 wherein:
(a) the first photoelectric conversion layer comprises $CuGa_yIn_zS_uSe_v$, where $0.52 \leq y \leq 0.76$, $0.24 \leq z \leq 0.48$, $1.70 \leq u \leq 2.00$, $0 \leq v \leq 0.30$, and either $y+z+u+v=3$ or $y+z=1$ and $u+v=2$;
(b) the second photoelectric conversion layer comprises $CuGa_yIn_zZn_wS_uSe_v$, where $0.64 \leq y \leq 0.88$, $0 \leq z \leq 0.36$, $0 \leq w \leq 0.12$, $0.15 \leq u \leq 1.44$, $0.56 \leq v \leq 1.85$, and $y+z+w+u+v=2$; and
(c) the third photoelectric conversion layer comprises $CuGa_yZn_wS_uSe_v$, where $0.74 \leq y \leq 0.91$, $0.09 \leq w \leq 0.26$, $1.42 \leq u \leq 1.49$, $0.51 \leq v \leq 0.58$, and $y+w+u+v=3$.

14. A method for producing a solid-state image device, comprising the steps of:
providing a silicon substrate; and
forming a photoelectric conversion layer directly on the silicon substrate while maintaining lattice matching to the silicon substrate,
wherein,
the photoelectric conversion layer comprises a first photoelectric conversion layer, a second photoelectric conversion layer, and a third photo electric conversion layer,
the first photoelectric conversion layer comprises $CuAl_xGa_yIn_zS_2$, wherein $0 \leq x \leq 0.12$, $0.38 \leq y \leq 0.52$, $0.48 \leq z \leq 0.50$ and $x+y+u+v=1$,
the second photoelectric conversion layer comprises $CuAl_{xGay}In_zS_2$, wherein $0.06 \leq x \leq 0.41$, $0.01 \leq y \leq 0.45$, $0.49 \leq z \leq 0.58$ and $x+y+z=1$, and
the third photoelectric conversion layer comprises $CuAl_xGa_yS_uSe_v$, wherein $0.31 \leq x \leq 0.52$, $0.48 \leq y \leq 0.69$, $1.33 \leq u \leq 1.38$, $0.62 \leq v \leq 0.67$, and either $x+y+u+v=3$ or $x+y=1$ and $u+v=2$.

15. The method according to claim 14, further comprising the steps of:
forming a first photoelectric conversion portion including the photoelectric conversion layer, a second photoelectric conversion portion including the photoelectric conversion layer, and a third photoelectric conversion portion including the photoelectric conversion layer in such a manner that the first to third photoelectric conversion portions are arranged in the planar direction of the silicon substrate, wherein, the photoelectric conversion layer in the first photoelectric conversion portion is a first photoelectric conversion layer configured to separate red light, the photoelectric conversion layer in the second photoelectric conversion portion is a second photoelectric conversion layer configured to separate green light, and the photoelectric conversion layer in the third photoelectric conversion portion is a third photoelectric conversion layer configured to separate blue light.

16. An image pickup apparatus comprising:

a light-condensing optical system configured to condense incident light, a solid-state image device configured to receive light condensed by the light-condensing optical system and perform photoelectric conversion, and a signal processing unit configured to process a signal obtained by photoelectric conversion, wherein, the solid-state image device includes a photoelectric conversion layer on a silicon substrate and lattice-matched to the silicon substrate, the photoelectric conversion layer being composed of a first photoelectric conversion layer, a second photoelectric conversion layer, and a third photo electric conversion layer, the first photoelectric conversion layer comprises $CuAl_xGa_yIn_zS_2$, wherein $0 \leq x \leq 0.12$, $0.38 \leq y \leq 0.52$, $0.48 \leq z \leq 0.50$ and $x+y+z=1$, the second shotoelectric conversion la er comprises $CuAl_xGa_yIn_zS_2$, wherein $0.06 \leq x \leq 0.41$, $0.01 \leq y \leq 0.45$, $0.49 \leq z \leq 0.58$ and $x+y+z=1$, and the third photoelectric conversion layer comprises $CuAl_xGa_yS_uSe_v$, wherein $0.31 \leq x \leq 0.52$, $0.48 \leq y \leq 0.69$, $1.33 \leq u \leq 1.38$, $0.62 \leq v \leq 0.67$, and either $x+y+u+v=3$ or $x+y=1$ and $u+v=2$.

17. The solid-state image device according to claim 2, wherein the photoelectric conversion layer includes (a) the first photoelectric conversion layer configured to separate red light and having a band gap of 2.00 eV±0.1 eV, (b) the second photoelectric conversion layer configured to separate green light and having a band gap of 2.20 eV±0.15 eV, and (c) the third photoelectric conversion layer configured to separate blue light and having a band gap of 2.51 eV±0.2 eV.

18. The solid-state image device according to claim 2, wherein the photoelectric conversion layer has a stepwise changing band gap and an energy discontinuity, and an avalanche multiplication is caused by applying a reverse-bias voltage.

* * * * *